(12) United States Patent
Stern

(10) Patent No.: US 12,287,201 B2
(45) Date of Patent: Apr. 29, 2025

(54) MAGNETOMETER AND METHOD FOR FINDING A MAGNITUDE OF AN AMBIENT MAGNETIC FIELD OR OF ONE OR MORE COMPONENTS THEREOF

(71) Applicant: Michael Stern, Givat Shmuel (IL)

(72) Inventor: Michael Stern, Givat Shmuel (IL)

( * ) Notice: Subject to any disclaimer, the term of this patent is extended or adjusted under 35 U.S.C. 154(b) by 85 days.

(21) Appl. No.: 17/759,599

(22) PCT Filed: Jan. 19, 2021

(86) PCT No.: PCT/IB2021/050379
§ 371 (c)(1),
(2) Date: Jul. 27, 2022

(87) PCT Pub. No.: WO2021/152421
PCT Pub. Date: Aug. 5, 2021

(65) Prior Publication Data
US 2023/0090257 A1    Mar. 23, 2023

Related U.S. Application Data

(60) Provisional application No. 62/966,082, filed on Jan. 27, 2020.

(51) Int. Cl.
*G01C 17/32* (2006.01)
*G01R 33/26* (2006.01)

(52) U.S. Cl.
CPC .............. *G01C 17/32* (2013.01); *G01R 33/26* (2013.01)

(58) Field of Classification Search
CPC ...... G01C 17/32; G01R 33/26; G01R 33/032; G01N 24/10
See application file for complete search history.

(56) References Cited

U.S. PATENT DOCUMENTS 8,798,924 B2  8/2014  Haverinen
9,080,874 B2  7/2015  Haverinen
(Continued)

FOREIGN PATENT DOCUMENTS

EP      3 617 201 A1    4/2020
JP      2021-519765 A   8/2021
(Continued)

OTHER PUBLICATIONS

Hansch, et al., A Survey of Hammett Substituent Constants and Resonance and Field Parameters, Chem. Rev., 91 (2):165-195 (1991).
(Continued)

*Primary Examiner* — Alvaro E Fortich
(74) *Attorney, Agent, or Firm* — FISHERBROYLES, LLP; Roger L. Browdy; James E. Mrose

(57) ABSTRACT

A magnetometer that finds a magnitude of an ambient magnetic field, comprising: a) a diamond cubic structure crystal, with an ensemble of paramagnetic defects oriented along each of the crystal's four tetrahedral axes; b) a microwave source that produces a microwave field at the crystal, of controllable frequency over a range that includes microwave resonance frequencies of paramagnetic defects oriented along all four axes; c) a light source that illuminates the paramagnetic defects with light that causes fluorescent emission from the paramagnetic defects; d) a light detector that measures the fluorescent emission; and e) a controller configured to: 1) measure the fluorescent emission at different microwave frequencies within the range, to obtain a spectrum of the paramagnetic defect ensemble; 2) calculate a variance property of the spectrum; and 3) calculate the magnitude of the ambient magnetic field from the variance property.

20 Claims, 8 Drawing Sheets

(56) References Cited

U.S. PATENT DOCUMENTS

| | | | |
|---|---|---|---|
| 9,151,621 B2 | 10/2015 | Haverinen | |
| 9,316,501 B2 | 4/2016 | Haverinen | |
| 9,476,717 B2 | 10/2016 | Haverinen | |
| 9,521,522 B2 | 12/2016 | Haverinen | |
| 9,632,045 B2* | 4/2017 | Englund | G01N 21/6402 |
| 9,674,672 B1 | 6/2017 | Haverinen | |
| 9,933,508 B2 | 4/2018 | Haverinen | |
| 2014/0357305 A1 | 12/2014 | Haverinen | |
| 2014/0365119 A1 | 12/2014 | Haverinen | |
| 2015/0090033 A1 | 4/2015 | Budker | |
| 2015/0106373 A1 | 4/2015 | Haverinen | |
| 2015/0106403 A1 | 4/2015 | Haverinen | |
| 2015/0260543 A1 | 9/2015 | Rantalankila | |
| 2016/0350811 A1 | 12/2016 | Perttunen | |
| 2017/0061371 A1 | 3/2017 | Haverinen | |
| 2018/0196111 A1 | 7/2018 | Boesch | |
| 2018/0275212 A1* | 9/2018 | Hahn | G01R 33/032 |
| 2018/0348393 A1 | 12/2018 | Hansen | |
| 2019/0277842 A1* | 9/2019 | Cleveland | G01N 33/487 |
| 2020/0049776 A1* | 2/2020 | Wood | G01R 33/307 |
| 2020/0300945 A1* | 9/2020 | Roy-Guay | G01R 33/0206 |

FOREIGN PATENT DOCUMENTS

| | | |
|---|---|---|
| WO | 2009/021068 A1 | 2/2009 |
| WO | 2009/073736 A1 | 6/2009 |
| WO | 2015/022974 A1 | 2/2015 |
| WO | 2017/173548 A1 | 10/2017 |
| WO | 2019/190223 A1 | 10/2019 |
| WO | 2019/191665 A1 | 10/2019 |
| WO | 2020/085842 A1 | 4/2020 |
| WO | 2021/046523 A1 | 3/2021 |
| WO | 2021/157642 A1 | 8/2021 |
| WO | 2023/090154 A1 | 5/2023 |

OTHER PUBLICATIONS

International Search Report dated Dec. 13, 2022, for corresponding International Application No. PCT/JP2022/040962.
International Search Report dated Dec. 13, 2022, for corresponding International Application No. PCT/JP2022/042231.
International Preliminary Report on Patentability dated May 2, 2024, for corresponding International Application No. PCT/JP2022/040962.
International Preliminary Report on Patentability dated May 2, 2024, for corresponding International Application No. PCT/JP2022/042231.
A. Canciani, J. Raquet, "Absolute Positioning Using the Earth's Magnetic Anomaly Field", Journal of The Institute of Navigation, vol. 63, No. 2, pp. 111-126, 2016).
A. Dreau et al., "Avoiding power broadening in optically detected magnetic resonance of single NV defects for enhanced dc magnetic field sensitivity," Phys. Rev. B 84, 195204 (2011).
A. Gruber et al., "Scanning confocal optical microscopy and magnetic resonance on single defect centers", Science, 276, 2012, 1997.
Aaron Canciani and John Raquet, "Airborne Magnetic Anomaly Navigation," IEEE Trans. Aerospace and Electronic Systems 53, 67-80 (2017).
B. J. Maertz et al., "Vector magnetic field microscopy using nitrogen vacancy centers in diamond," Appl. Phys. Lett. 96, 092504 (2010).
Carson Teale, "Magnetometry with Ensembles of Nitrogen Vacancy Centers in Bulk Diamond," MSC thesis, MIT (Sep. 2015), on pp. 30-33.
Chen Zhang et al., "Vector magnetometer based on synchronous manipulation of nitrogen-vacancy centers in all crystal directions," J. Phys. D: Appl. Phys. 51, 155102 (2018).
Cécile Grèzes, "Towards a spin ensemble quantum memory for superconducting cubits," PhD thesis, l'Université Pierre et Marie Curie (2015).
D. B. Bucher et al., "Hyperpolarization-enhanced NMR spectroscopy with femtomole sensitivity using quantum defects in diamond," arXiv: 1810.02408v1 [physics.app-ph] Oct. 4, 2018.
E. Bauch et al., Ultralong dephasing times in solid-state spin ensembles via quantum control, arXiv: 1801.0379v3 [quant-ph] Jul. 19, 2018.
E. de Barros Camara and S. N. Pereira Guimaraes, Magnetic Airborne survey—geophysical flight, GeoSci. Instrm. Method Data Syst., 5, 181-192 (2016).
E.C. Reynhardt et al., "Temperature dependence of spin-spin and spin-lattice relaxation time of paramagnetic nitrogen defects in diamond," J. Chem. Phys., 109, 84718477 (1998).
F. Goldenberg, (Goodrich Corporation Advanced Sensors Technical Center). "Geomagnetic navigation beyond the magnetic compass". Record—IEEE Plans, Position Location and Navigation Symposium, IEEE/ION Position, Location, and Navigation Symposium, 2006:684-694, 2006).
Y. Ma et al., "Excited States of the negatively charged nitrogen vacancy center in diamond", Phys. Rev. B, 81, 041204 (R), 2010).
Hannah Clevenson et al., "Robust high-dynamic-range vector magnetometry with nitrogen-vacancy centers in diamond," Applied Phys. Lett., 112, 252406 (2018).
Honeywell, Smart Digital Magnetometer HMR2300.
Howard M. Wiseman and Gerard J. Milburn, Quantum Measurement and Control, Chapter 3, Cambridge University Press, 2009.
J. A. Shockley, PhD Thesis, Air Force Institute of Technology (Sep. 2012).
J. Cain, and R. Blakely, "The Magnetic Field of the Earth's Lithosphere: The Satellite Perspective," EOS, Transactions American Geophysical Union, vol. 80.14, No. 156, 1999).
J. Haverinen and A. Kemppainen. "A Geomagnetic Field Based Positioning Technique for Underground Mines". Robotic and Sensors Environments (ROSE), 2011 IEEE International Symposium, 2011).
J. Haverinen and A. Kemppainen. "A Global Self-Localization Technique Utilizing Local Anomalies of the Ambient Magnetic Field". Robotics and Automation, ICRA '09. IEEE International Conference on, 3142-3147, 1050-4729, 2009.
J. M. Taylor et al., "High sensitivity diamond magnetometer with nanoscale resolution," Nature Physics 4, 810-816 (2008).
J. Wilson and R. Kline-Schoder, "Passive Navigation using Local Magnetic Field Variations," Proceedings of the 2006 National Technical Meeting of The Institute of Navigation, Monterey, CA, 2006.
John F. Barry et al., "Sensitivity Optimization for NV-Diamond Magnetometry," arXiv:1903.08176v1 arXiv:1903.08176v1 [quant-ph], submitted Mar. 19, 2019.
John F. Raquet et al., "Determining Absolute Position Using 3-Axis Magnetometers and the Need for Self-Building World Models," NATO publication STO-EN-SET-197-04.
K. Jensen et al., "Light narrowing of magnetic resonances in ensembles of nitrogen-vacancy centers in diamond," Phys. Rev. B 87, 014115 (2013).
Khadijeh Bayat et al., "Efficient, Uniform, and Large Area Microwave Magnetic Coupling to NV Centers in Diamond Using Double Split-Ring Resonators," Nano Lett. 14, 1208-1214 (2014).
Linh My Pham, "Magnetic Field Sensing with Nitrogen Vacancy Color Centers in Diamond," PhD thesis, Harvard University (May 2013).
P, E. Jupp et al., "Precision in Estimating the Frequency Separation Between Spectral Lines," J. Magnetic Resonance 135, 23-29 (1998).
P.J. Kemppi et al., "Use of Artificial Magnetic Anomalies in Indoor Pedestrian Navigation". Vehicular Technology Conference Fall (VTC 2010 Fall), 2010 IEEE 72nd ISSN 1090-3038, 2010).
Pengfei Wang et al., "High-resolution vector microwave magnetometry based on solid-state spins in diamond," Nature Communications 6:6631, DOI: 10.1038/ncomms7631 | www(dot)nature(dot)com/naturecommunications (2015).
R. Hanson et al., "Polarization and Readout of Coupled Single Spins in Diamond", Phys. Rev. Lett., 97, 087601, 2006.
R. S. Popovic, "Hall Magnetic Sensor Devices," talk given at IMMW20: International Magnetic Measurement Workshop, Diamond Light Source, Didcot, UK, Jun. 4-9, 2017.
S. A. Zargaleh et al., "Nitrogen vacancy center in cubic silicon carbide: A promising cubit in the 1.5 um spectral range for photonic quantum networks," Phys. Rev. B 98, 165203 (2018).

(56) References Cited

OTHER PUBLICATIONS

Sabaka, O. N., et al., "A Comprehensive Model of the Quiet-Time, Near-Earth Magnetic Field: Phase 3," Geophysical Journal International, vol. 151, No. 1, 2002, pp. 32-68).
Texas Instruments data sheet for DRV5032 Hall sensor, SLVSDC7D, Apr. 2017, revised Nov. 2017.
Vishal Shah et al., "Subpicotesla atomic magnetometry with a microfabricated vapor cell," Nature Photonics 1, 649-652 (2007).
W. Storms, W., and J. Shockley, "Magnetic Field Navigation in an Indoor Environment," Ubiquitous Positioning Indoor Navigation and Location Based Service (Upinlbs), IEEE, pp. 1-10, 2010.
W.F Storms, Master Thesis, "Magnetic Field Aided Indoor Navigation", Air Force Institute of Technology, 2009.
Thebault, et al., The Magnetic Field of the Earth's Lithosphere, Space Sci. Rev., 155:95-127 (2010).
Popovic, R. S., High Resolution Hall Magnetic Sensors, Proc. 29th International Conference on Microelectronics, Belgrade, Serbia, pp. 69-74, May 12-14, 2014.

\* cited by examiner

MAGNETOMETER AND METHOD FOR FINDING A MAGNITUDE OF AN AMBIENT MAGNETIC FIELD OR OF ONE OR MORE COMPONENTS THEREOF

FIELD AND BACKGROUND OF THE INVENTION

The present invention, in some embodiments thereof, relates to a magnetometer using an ensemble of paramagnetic defects in solids, and, more particularly, but not exclusively, to a magnetometer using nitrogen vacancy (NV) centers in diamond, suitable for magnetic navigation systems in mobile and/or portable devices.

Magnetic Navigation

The measured magnetic field at any point on Earth is the result of several magnetic sources:

1. The Earth's core magnetic field is what makes a compass point to the north. Its amplitude is typically of around 50 uT. It is caused by the motion of conductive fluids deep within the Earth (G. Hulot, "Terrestrial Magnetism," Space Science Series of ISSI, Springer, 2011). The spatial wavelengths associated with the core field are long, greater than 4000 km, and well-known.

2. The crustal field is caused by the permanent or induced magnetization of rocks in the Earth's crust and amounts typically to several hundreds of nT. An important aspect of the crustal field is that it is almost static in time but includes high spatial frequency information (J. Cain, and R. Blakely, "The Magnetic Field of the Earth's Lithosphere: The Satellite Perspective," *EOS, Transactions American Geophysical Union*, Vol. 80.14, No. 156, 1999).

3. The ionospheric field is due to electrical currents flowing in the ionosphere. It reaches typically 50-100 nT (Sabaka, O. N., et al., "A Comprehensive Model of the Quiet-Time, Near-Earth Magnetic Field: Phase 3," *Geophysical Journal International*, Vol. 151, No. 1, 2002, pp. 32-68). Solar radiation creates an electrically conducting plasma in the atmosphere and creates currents primarily driven by solar heating. The ionospheric field is therefore characterized by diurnal variations.

4. The magnetosphere field is created by charged particles coming from solar winds and interacting with the Earth's core magnetic field. The effect of these charged particles is approximately 20-30 nT during quiet days but can reach hundreds of nT during geomagnetic storms (Sabaka et al).

5. Finally, manmade fields are mainly due to large buildings, cars, electric lines and other magnetic objects. They may sometimes be responsible for large local and temporal variations of Earth magnetic field (A. Canciani, J. Raquet, "Absolute Positioning Using the Earth's Magnetic Anomaly Field", Journal of The Institute of Navigation, Vol. 63, No. 2, pp 111-126, 2016).

The idea of using the Earth's magnetic field as a tool for navigation is not new. In the last two decades, several groups have tried to measure in more detail the crustal field and to use the established geological magnetic maps as a resource for aircraft and ground vehicles navigation.

In 2006, Wilson et al. (J. Wilson and R. Kline-Schoder, "Passive Navigation using Local Magnetic Field Variations," Proceedings of the 2006 National Technical Meeting of The Institute of Navigation, Monterey, CA, 2006) used magnetic field information to improve "an aircraft dead-reckoning navigation system" but with a typical error of 2.5 km. The same year, the World Digital Magnetic Anomaly Maps project (F. Goldenberg, (Goodrich Corporation Advanced Sensors Technical Center). "Geomagnetic navigation beyond the magnetic compass". Record—IEEE PLANS, Position Location and Navigation Symposium, IEEE/ION Position, Location, and Navigation Symposium, 2006:684-694, 2006) created a global map of magnetic field anomalies which reached in 2011 a global 3-arc minute resolution grid of magnetic intensities at an altitude of 5 km above the sea level (E. de Barros Camara and S. N. Pereira Guimaraes, 'Magnetic Airborne survey—geophysical flight", GeoSci. Instrm. Method Data Syst., 5, 181-192 (2016)).

In 2009, Storms has shown in his Master thesis for US Air Force (W. F Storms, Master Thesis, "Magnetic Field Aided Indoor Navigation", Air Force Institute of Technology, 2009; and W. Storms, W., and J. Shockley, "Magnetic Field Navigation in an Indoor Environment," Ubiquitous Positioning Indoor Navigation and Location Based Service (UPINLBS), IEEE, pp. 1-10, 2010) that it is possible to use the measurement of an indoor magnetic field to aid an inertial navigation system to achieve positioning with sub-meter resolution. Storms used for the first time a three-axis magnetic field measurement and used it to generate an equally spaced grid, which was then interpolated to generate a map. The map was then used during navigation, together with the inertial navigation system, to provide a position estimate.

In 2010, Kemppi et al. investigated the use of pre-positioned magnetic field emitters in doorways of a building to determine position for pedestrian navigation. Overall the method provided sub-meter positioning (P. J. Kemppi et al., "Use of Artificial Magnetic Anomalies in Indoor Pedestrian Navigation". Vehicular Technology Conference Fall (VTC 2010 Fall), 2010 IEEE $72^{nd}$ ISSN 1090-3038, 2010).

A Finnish company called Indoor Atlas recently advertised an indoor localization system using a smart phone with a built-in magnetometer and published several articles concerning indoor and underground field navigation with a precision of a few meters (J. Haverinen and A. Kemppainen. "A Global Self-Localization Technique Utilizing Local Anomalies of the Ambient Magnetic Field". Robotics and Automation, ICRA '09. IEEE International Conference on, 3142-3147, 1050-4729, 2009; and J. Haverinen and A. Kemppainen. "A Geomagnetic Field Based Positioning Technique for Underground Mines". Robotic and Sensors Environments (ROSE), 2011 IEEE International Symposium, 2011).

In 2012, J. Schockley published a PhD thesis of the US Air Force Institute of Technology (J. A. Shockley, PhD Thesis, Air Force Institute of Technology (September 2012)). In his thesis, he focuses on the exploitation of three axis magnetometer measurements for navigation of ground vehicles.

As noted by Shockley, the magnetometers used in most of these previous studies are based on the so-called magnetoresistance effects, an effect in which a magnetic field induces a slight change in the resistance of a thin metallic film.

The magnetoresistance sensor is a scalar magnetometer because it senses the magnetic field in a single direction only. In order to establish a full three dimensional measurement of the magnetic field, one needs to use a so-called triad-sensor, a set of three scalar magnetometers positioned in orthogonal directions. A triad sensor will have errors caused by fabrication and misalignments that must be resolved by an adequate calibration procedure.

The precision obtained by a magnetoresistance sensor depends directly on the current which flows in the resistance. For example, the Honeywell HMR2300 can reach a sensitivity of 7 nT (rms) with a 20 Hz bandwidth (see Shockley, cited above, and Honeywell, Smart Digital Magnetometer HMR2300) and the typical power consumption of such a device is 0.5 W.

Nitrogen Vacancy Centers in Diamond

Nitrogen Vacancy (NV) centers are an example of paramagnetic defects in diamond where a substitutional nitrogen atom is located one lattice site away from a carbon vacancy. The electronic ground state of NV-centers consists of a spin triplet which exhibits a 2.87 GHz zero-field splitting resonance frequency. Application of a small magnetic field causes Zeeman splitting of the resonance frequencies that correspond to transitions between the magnetic $m_s=\pm 1$ sublevels and the $m_s=0$ ground state.

1. Possible Directions of NV Center Axis

The crystalline axis along which an NV center is aligned defines the z-axis of the electron spin. The NV centers in a diamond lattice may have four possible tetrahedral directions. FIG. 1A schematically shows the four possible directions along which NV centers can be oriented, in a diamond crystal with x, y, and z axes as shown. In view 100, the NV center is oriented in the (1, 1, 1) direction, where the three coordinates are the x, y, and z coordinates respectively. In view 102, the NV center is oriented in the (1, −1, −1) direction, in view 104 the NV center is oriented in the (−1, 1, −1) direction, and in view 106 the NV center is oriented in the (−1, −1, 1) direction. FIG. 1B schematically shows a diamond crystal 108 with an ensemble of NV centers, randomly oriented in the four possible directions.

2. Long Coherence Times at Room Temperature

Ensemble experiments in the late 1990s indicated that spins of impurity centers in diamond can have very long coherence times, even at room temperature (E.C. Reynhardt et al., "Temperature dependence of spin-spin and spin-lattice relaxation time of paramagnetic nitrogen defects in diamond," J. Chem. Phys., 109, 84718477 (1998)). This long coherence time is usually attributed to the fact that the diamond is made of constituents that have zero nuclear spin in their most common natural isotope form. Because of this long coherence time, NV centers may have extremely narrow Zeeman split resonance frequencies and therefore a high sensitivity to a magnetic field applied at room temperature. An improved sensitivity can be achieved by using an isotopically purified diamond with a reduced fraction of carbon-13, which improves further the coherence time.

3. Optical Cooling and Readout and Microwave Manipulations

The NV center electronic level structure allows both optical cooling and readout of the electron spins. Indeed, the NV center spin shows a finite polarization under optical illumination. As a matter of fact, optical excitation may cause the ground state to become occupied with more than 80% probability (A. Gruber et al., "Scanning confocal optical microscopy and magnetic resonance on single defect centers", Science, 276, 2012, 1997). The precise mechanism for optically induced spin polarization is complex and involves a singlet electronic state whose energy level lies between the ground and excited state triplets. Transitions into this singlet state occur primarily from the $m_s=\pm 1$ states, whereas decay from the singlet leads primarily to the ground state (Y. Ma et al., "Excited States of the negatively charged nitrogen vacancy center in diamond", Phys. Rev. B, 81, 041204 (R), 2010). Experimentally, an NV center prepared in the ground state fluoresces more strongly than an NV center prepared in one of the $m_s=\pm 1$ states (R. Hanson et al., "Polarization and Readout of Coupled Single Spins in Diamond", Phys. Rev. Lett., 97, 087601, 2006). Hence, the spin state of the NV center can be read out and initialized via spin-dependent optical fluorescence.

J. M. Taylor et al, "High sensitivity diamond magnetometer with nanoscale resolution," Nature Physics 4, 810-816 (2008), describes a sensitive magnetometer that detects fluorescent emission from a single NV center at a time, oriented along a known axis.

Linh My Pham, "Magnetic Field Sensing with Nitrogen Vacancy Color Centers in Diamond," PhD thesis, Harvard University (May 2013), provides a review of NV centers in diamond, and of how a diamond crystal with an ensemble of NV centers, some of them oriented along each of the four tetrahedral crystal axes of the diamond, can be used to determine the three spatial components of an ambient magnetic field. This may be done by measuring the Zeeman splitting of resonance frequencies for NV centers oriented along each crystal axis, which depends on the component of the ambient magnetic field along that axis.

Carson Teale, "Magnetometry with Ensembles of Nitrogen Vacancy Centers in Bulk Diamond," MSc thesis, MIT (September 2015), on pages 30-33, provides a procedure to find the rotation matrix between the diamond coordinates and the lab frame by applying known magnetic fields and recording the positions of the resonant frequencies in an ESR spectrum.

Hannah Clevenson et al., "Robust high-dynamic-range vector magnetometry with nitrogen-vacancy centers in diamond," *Applied Phys. Lett.*, 112, 252406 (2018), have described a robust, scale-factor-free vector magnetometer, which uses a closed-loop frequency-locking scheme to simultaneously track Zeeman-split resonance pairs of nitrogen-vacancy (NV) centers in diamond. By directly detecting the resonance frequencies of NV centers oriented along each of the diamond's four tetrahedral crystallographic axes, they perform a full vector reconstruction of an applied magnetic field.

Chen Zhang et al, "Vector magnetometer based on synchronous manipulation of nitrogen-vacancy centers in all crystal directions," *J. Phys. D: Appl. Phys.* 51, 155102 (2018) describes a method for determining the three spatial components of an external magnetic field using a magnetometer based on NV centers in diamond, in which the contributions from NV centers oriented along different crystal axes are distinguished by rotating the diamond in a known way around two axes using a two-axis servo-platform, or by magnetic field compensation using a known additional magnetic field.

S. A. Zargaleh et al., "Nitrogen vacancy center in cubic silicon carbide: A promising cubit in the 1.5 μm spectral range for photonic quantum networks," *Phys. Rev. B* 98, 165203 (2018), describes an investigation of the optical properties of the nitrogen vacancy (NV)⁻ center in 3C—SiC, and presents the spin Hamiltonian parameters for (NV)⁻ centers in diamond and in 3C—SiC, and for $VV^0$ centers in 3C—SiC.

John F. Barry et al., "Sensitivity Optimization for NV-Diamond Magnetometry," arXiv:1903.08176v1 [quant-ph], submitted Mar. 19, 2019, analyzes present and proposed approaches to enhance the sensitivity of broadband ensemble-NV-diamond magnetometers. Improvements to the spin dephasing time, the readout fidelity, and the host diamond material properties are identified as the most promising avenues and are investigated extensively.

A. Dreau et al., "Avoiding power broadening in optically detected magnetic resonance of single NV defects for enhanced dc magnetic field sensitivity," *Phys. Rev. B* 84, 195204 (2011), presents a study of the magnetic field sensitivity of a magnetic sensor consisting of a single nitrogen-vacancy (NV) defect in diamond, by using continuous optically detected electron spin resonance (ESR) spectroscopy. The behavior of the ESR contrast and linewidth is given as a function of the microwave and optical pumping power.

K. Jensen et al, "Light narrowing of magnetic resonances in ensembles of nitrogen-vacancy centers in diamond," *Phys. Rev. B* 87, 014115 (2013), investigates optically detected magnetic resonance signals from an ensemble of nitrogen-vacancy centers in diamond. The signals are measured for different light powers and microwave powers, and the contrast and linewidth of the magnetic-resonance signals are extracted. For a wide range of experimental settings of the microwave and light powers, the linewidth decreases with increasing light power, and more than a factor of 2 "light narrowing" is observed. Spin-spin interactions between nitrogen-vacancy centers and substitutional nitrogen atoms in the diamond lead to changes in the line shape and the linewidth of the optically detected magnetic resonance signals. The importance of the light-narrowing effect for optimizing the sensitivity of magnetic-field measurements is discussed.

U.S. Pat. No. 8,798,924 to Haverinen describes methods of magnetic navigation, using a sensitive magnetometer to measure small variations in the magnetic field, either in the three spatial components of the magnetic field, or in the magnitude of the magnetic field. Haverinen considers both indoor magnetic navigation using relatively large artificially produced magnetic field variations, and outdoor magnetic navigation using small variations in the natural terrestrial magnetic field.

Additional background art includes P, E. Jupp et al, "Precision in Estimating the Frequency Separation Between Spectral Lines," *J. Magnetic Resonance* 135, 23-29 (1998); Vishal Shah et al, "Subpicotesla atomic magnetometry with a microfabricated vapor cell," *Nature Photonics* 1, 649-652 (2007); Khadijeh Bayat et al, "Efficient, Uniform, and Large Area Microwave Magnetic Coupling to NV Centers in Diamond Using Double Split-Ring Resonators," *Nano Lett.* 14, 1208-1214 (2014); U.S. Patent Application Publication No. 2015/0090033 A1 to Budker et al; John F. Raquet et al, "Determining Absolute Position Using 3-Axis Magnetometers and the Need for Self-Building World Models," NATO publication STO-EN-SET-197-04; International Patent Application Publication No. WO2009/021068 to Bandyopadhyay et al; U.S. Patent Application Publication Nos. 2014/0357305, 2014/0365119, 2015/0106373 and 2015/0106403, all to Haverinen et al; U.S. Patent Application Publication No. 2015/0260543 to Rantalankila et al; U.S. Patent Application Publication No. 2016/0350811 to Perttunen et al; U.S. Patent Application Publication No. 2017/0061371 to Haverinen; U.S. Patent Nos. 9,080,874, 9,151,621, 9,316,501, and 9,521,522, all to Haverinen; U.S. Pat. Nos. 9,476,717, 9,674,672, and 9,933,508 all to Haverinen et al; Aaron Canciani and John Raquet, "Airborne Magnetic Anomaly Navigation," *IEEE Trans. Aerospace and Electronic Systems* 53, 67-80 (2017); B. J. Maertz et al, "Vector magnetic field microscopy using nitrogen vacancy centers in diamond," *Appl. Phys. Lett.* 96, 092504 (2010); Pengfei Wang et al, "High-resolution vector microwave magnetometry based on solid-state spins in diamond," *Nature Communications* 6:6631, DOI: 10.1038/ncomms7631|www(dot)nature(dot)com/naturecommunications (2015); Texas Instruments data sheet for DRV5032 Hall sensor, SLVSDC7D, April 2017, revised November 2017; R. S. Popovic, "Hall Magnetic Sensor Devices," talk given at IMMW20: International Magnetic Measurement Workshop, Diamond Light Source, Didcot, UK, Jun. 4-9, 2017; Howard M. Wiseman and Gerard J. Milburn, *Quantum Measurement and Control*, Chapter 3, Cambridge University Press, 2009; E. Bauch et al, Ultralong dephasing times in solid-state spin ensembles via quantum control," arXiv: 1801.0379v3 [quant-ph] 19 Jul. 2018; and D. B. Bucher et al, "Hyperpolarization-enhanced NMR spectroscopy with femtomole sensitivity using quantum defects in diamond," arXiv: 1810.02408v1 [physics.app-ph] 4 Oct. 2018; Cécile Grèzes, "Towards a spin ensemble quantum memory for superconducting cubits," PhD thesis, l'Université Pierre et Marie Curie (2015).

SUMMARY OF THE INVENTION

An aspect of some embodiments of the invention concerns a magnetometer that determines a magnitude of the magnetic field by measuring an absorption spectrum of an ensemble of paramagnetic defects, such as nitrogen vacancy centers in diamond, and calculating a variance property of the absorption spectrum.

There is thus provided, in accordance with an exemplary embodiment of the invention, a magnetometer that finds a magnitude of an ambient magnetic field, comprising:
  a) a crystal having a diamond cubic structure, with four tetrahedral axes, with an ensemble of paramagnetic defects, some of the defects oriented along each of the crystal's four tetrahedral axes;
  b) a microwave source that produces a microwave field at the crystal, of controllable frequency over a range that includes microwave resonance frequencies, in the presence of the ambient magnetic field, for paramagnetic defects oriented along all four axes;
  c) a light source that illuminates the paramagnetic defects with light of a wavelength to cause fluorescent emission;
  d) a light detector that measures a total detected fluorescent emission power of the paramagnetic defects; and
  e) a controller configured to:
  1) measure the detected fluorescent emission power at each of a plurality of different selected microwave frequencies within the range, over a spectrum acquisition time, to obtain a spectrum of the paramagnetic defect ensemble;
  2) calculate a variance property of the spectrum; and
  3) calculate the magnitude of the ambient magnetic field from the variance property.

Optionally, the light source comprises a light emitting diode.

There is further provided, in accordance with an exemplary embodiment of the invention, a magnetic navigation device comprising:
  a) a magnetometer according to an exemplary embodiment of the invention;
  b) a data storage medium containing magnetic map data about the magnitude of the ambient magnetic field as a function of position; and
  c) a navigation controller, the same as or different from the controller of the magnetometer, configured to use the magnitude of the ambient magnetic field found by the magnetometer at one or more locations, together at least with the magnetic map data, to find a location of the navigation device.

Optionally, the navigation device also comprises an accelerometer, wherein the navigation controller is configured to obtain the magnitude of the ambient magnetic field at more than one location, and to use the accelerometer to obtain information about a relative spatial configuration of the locations, and finding the location of the navigation device comprises using the magnitude of the ambient magnetic field at the locations and information about the relative spatial configuration of the locations.

Optionally, the crystal comprises β-silicon carbide, and the parametric defects comprise nitrogen vacancy (NV) centers.

Optionally, the silicon has a reduced fraction of silicon-29 from naturally occurring levels.

Additionally or alternatively, the crystal comprises diamond or β-silicon carbide with a reduced level of carbon-13 from naturally occurring levels, and parametric defects comprise NV centers.

Optionally the crystal comprises a diamond crystal, and the paramagnetic defects comprise NV centers.

Optionally, the light detector has a noise level, and, in a uniform constant magnetic field of 0.5 gauss oriented in any direction, a product of:
  a) the inverse of a power consumed by the light source in watts; and
  b) the inverse of the positive square root of the spectrum acquisition time in seconds; and
  c) the inverse of an expected random error in the average of the calculated values of the magnitude of the magnetic field in nanotesla, that corresponds to random errors in the spectrum at each selected frequency due to the noise level of the light detector, when the variance property is calculated from the spectrum, and the variance property is used to calculate the magnitude of the magnetic field;
  is greater than 1.

Optionally, the light detector has a noise level, a level of consumed power of the light source less than 250 milliwatts, the spectrum acquisition time is less than 200 milliseconds, and in a uniform constant magnetic field of 0.5 gauss oriented in any direction, the magnetometer has an expected random error of the magnitude of the magnetic field due to the noise level of the light detector that is less than 50 nanotesla.

There if further provided, in accordance with an exemplary embodiment of the invention, a magnetometer that finds a magnitude of an ambient magnetic field or of one or more components of the magnetic field or both, comprising:
  a) a crystal having a diamond cubic structure with four tetrahedral axes, with an ensemble of paramagnetic defects, some of the defects oriented along each of the crystal's four tetrahedral axes;
  b) a microwave source that produces a microwave field at the crystal of controllable frequency over a range that includes microwave resonance frequencies, in the presence of the ambient magnetic field, for paramagnetic defects oriented along all four axes;
  c) a light source with a light emitting surface that illuminates the paramagnetic defects with light of a wavelength to cause fluorescent emission;
  d) a light detector with a light detecting surface, that measures a total detected power of fluorescent emission light of the paramagnetic defects; and
  e) a controller configured to:
    1) measure the detected fluorescent emission power at each of a plurality of different selected microwave frequencies within the range, over a spectrum acquisition time, to obtain a spectrum of the paramagnetic defect ensemble; and
    2) calculate the magnitude of the magnetic field or the one or more components of the magnetic field or both, from the spectrum;
  wherein all of the crystal is closer to the light emitting surface than a largest transverse dimension of the light emitting surface, and closer to the light detecting surface than a largest transverse dimension of the light detecting surface.

Optionally, the light source comprises a light emitting diode.

Optionally, the controller is configured to calculate the magnitude of the magnetic field by obtaining a variance property of the spectrum, and to calculate the magnitude of the magnetic field from the variance property.

Optionally, the light emitting surface and the light detecting surface are substantially planar and substantially parallel to each other, and are situated on opposite sides of the crystal.

Optionally, the magnetometer also comprises a filter situated between the crystal and the light detecting surface that substantially filters out the illuminating light from the light emitting surface and substantially passes the fluorescent emission light to the light detecting surface.

Additionally or alternatively, the magnetometer comprises a filter situated between the light emitting surface and the crystal that substantially filters out any light emitted from the light emitting surface in a range of wavelengths corresponding to predominant wavelengths of the fluorescent emission light, and substantially passes light emitted from the light emitting surface at wavelengths that excite the fluorescent emission.

Optionally, the light source, the crystal and the light detector fit within a distance less than 10 mm in a direction normal to the plane of the light emitting surface.

Optionally, the microwave source comprises a microwave antenna that produces the microwave field at the crystal, and the light source, the crystal, the microwave antenna and the light detector fit within a 20 mm by 20 mm cross-section in directions parallel to the plane of the light emitting surface.

Optionally, the crystal comprises diamond, and the paramagnetic defects comprise NV centers.

Optionally, the light detector has a noise level, and, for a magnetic field of 0.5 gauss, for any orientation of the magnetic field relative to the crystal's four axes, for all of the components or magnitude of the magnetic field that the controller is configured to calculate, using the selected microwave frequencies and spectrum acquisition time that the controller is configured to use, the product of:
  a) the inverse of a power consumed by the light source in watts; and
  b) the inverse of the positive square root of the spectrum acquisition time in seconds; and
  c) the inverse of an expected random error in the calculated value of the magnitude or component of the magnetic field in nanotesla, that corresponds to random errors in the spectrum at each selected frequency due to the noise level of the light detector;
  is greater than 1.

Optionally, the light detector has a noise level, and the light source consumes less than 250 milliwatts of power, the spectrum acquisition time that the controller is configured to use is less than 200 milliseconds, and for a magnetic field of 0.5 gauss, for any orientation of the magnetic field relative to the crystal's four tetrahedral axes, for all of the components or magnitude of the magnetic field that the controller is configured to calculate, using the selected microwave frequencies that the controller is configured to use, there is an expected random error in the calculated value of the magnitude or component of the magnetic field of less than 50 nanotesla, due to random errors in the spectrum at each selected frequency due to the noise level of the light detector.

Alternatively, the crystal comprises β-silicon carbide, and the paramagnetic defects comprise NV centers.

Optionally, the total detected power of the fluorescent emission light is at least 3 percent of a power of light emitted by the light source.

There is further provided, in accordance with an exemplary embodiment of the invention, a method of determining a magnitude of an ambient magnetic field, using an ensemble of paramagnetic defects in a crystal having a diamond cubic structure with four tetrahedral axes, some of the defects oriented along each of the crystal's four tetrahedral axes, the defects having a zero-field splitting resonant frequency $D_0$, the method comprising:
  a) exposing the paramagnetic defect ensemble to microwave radiation at a selected frequency;
  b) illuminating the paramagnetic defects with light, from a light source, of a wavelength to cause fluorescent emission;
  c) measuring a total detected fluorescent emission power from the paramagnetic defect ensemble with a light detector;
  d) repeating (a), (b) and (c), using different selected frequencies of the microwave radiation to obtain a microwave absorption spectrum of the paramagnetic defect ensemble over frequencies that include Zeeman splitting of the zero-field splitting resonant frequency $D_0$, due to the ambient magnetic field, for paramagnetic defects oriented along all four tetrahedral axes;
  e) calculating a variance property of the microwave absorption spectrum; and
  f) calculating a magnitude of the ambient magnetic field from the variance property.

Optionally, the crystal comprises a diamond crystal, and the paramagnetic defects comprise nitrogen vacancy (NV) centers.

Optionally, the diamond crystal is isotopically purified to reduce an amount of carbon-13 from naturally occurring levels.

Optionally, the light detector has an output voltage that includes a noise level, and (d), (e) and (f) are done one or more times, averaging the values of the magnitude of the magnetic field calculated each of the times, and measuring the total fluorescent emission power at each selected frequency each time comprises measuring an emission power, for a measurement time, so that a product of:
  a) the inverse of a power consumed by the light source in watts; and
  b) the inverse of the square root of a total of all the measurement times in seconds; and
  c) the inverse of an expected random error in the average of the calculated values of the magnitude of the magnetic field in nanotesla, that corresponds to random errors in the spectrum at each selected frequency each of the times due to the noise level of the light detector, when the variance property is calculated from the spectrum each of the times, and the variance property is used to calculate the magnitude of the magnetic field each of the times;
is greater than 1.

Optionally, the light detector has an output voltage that includes a noise level, and illuminating with light from a light source comprises illuminating with light from a light source that consumes less than 250 milliwatts of power, and measuring the total fluorescent emission power at each selected frequency comprises measuring an emission power, for a measurement time, so that a total of all the measurement times is less than 200 milliseconds, and there is an expected random error in the calculated value of the magnitude of the magnetic field of less than 50 nanotesla (nT), that corresponds to random errors in the spectrum at each selected frequency due to the noise level of the output voltage of the light detector, when the variance property is calculated from the spectrum, and the variance property is used to calculate the magnitude of the magnetic field.

Alternatively, the crystal comprises a β-silicon carbide crystal, and the parametric defects comprise nitrogen vacancy (NV) centers.

Optionally, the β-silicon carbide crystal is isotopically purified to reduce an amount of carbon-13, an amount of silicon-29, or both, from naturally occurring levels.

Optionally, the method comprises repeating (d), (e) and (f) a plurality of times, and calculating a higher precision magnitude of the ambient magnetic field by combining the values of the magnitude of the ambient magnetic field calculated each time (f) is done, without taking into account any differences in orientation of the axes of the crystal in space during each of the times (d) is done.

Optionally, (d) is done quickly enough each time so that the orientations of the axes of the crystal each change by less than 0.03 radians.

Optionally, the microwaves have bandwidth less than 100 kHz.

Optionally, measuring the total detected fluorescent emission power at each frequency is done for at least 100 microseconds.

Optionally, the variance property is a variance of resonance frequencies resulting from Zeeman and hyperfine splitting of the zero-field splitting resonance frequency, and obtaining the variance property of the microwave absorption spectrum comprises using curve-fitting to obtain the resonance frequencies from the spectrum, and calculating the variance of the resonance frequencies.

Optionally, using curve-fitting comprises fitting the spectrum at least to a magnitude of each combination of Zeeman splitting and hyperfine splitting for defects oriented along each of the four tetrahedral axes.

Optionally, using curve-fitting comprises finding a value for the zero-field splitting resonance frequency $D_0$ around which the spectrum is substantially mirror symmetric.

Optionally, the method also comprises using the value for $D_0$ to determine temperature of the crystal.

Optionally, obtaining the variance property of the microwave absorption spectrum comprises obtaining a variance of the spectrum, and calculating the magnitude of the ambient magnetic field from the variance property comprises calculating the magnitude of the ambient magnetic field from the variance of the spectrum.

Optionally, the method also comprises calculating a mean of the spectrum as a value of the zero-field splitting resonance frequency $D_0$, and using the value of $D_0$ to determine temperature of the crystal.

Optionally, calculating the magnitude of the ambient magnetic field comprises:
a) providing at least an average of widths of the resonance peaks;
b) subtracting from the variance of the spectrum, a component representing a contribution of widths of the resonance peaks to the variance of the spectrum, to find a variance of resonance frequencies due to Zeeman splitting and hyperfine splitting of $D_0$; and
c) calculating the magnitude of the ambient magnetic field from the variance of the resonance frequencies.

Alternatively, calculating the magnitude of the ambient magnetic field comprises using a previously generated calibration curve that shows a relationship between the variance of the spectrum and the magnitude of the ambient magnetic field.

Optionally, the method also comprises providing at least an estimate of a zero-field resonance frequency $D_0$ of the paramagnetic defect ensemble, at least an estimate of the magnitude B of the magnetic field, at least an estimate of a width W of the resonance frequencies of the paramagnetic defect ensemble, and at least an estimate of hyperfine coupling $A_\parallel$, wherein the selected frequencies extend over a range that includes an interval from $D_0$ to $D_0+\gamma B+W+A_\parallel$, or an interval from $D_0$ to $D_0-\gamma B-W-A_\parallel$, or both, where $\gamma$ is 2.8 MHz per gauss, where there is no sub-interval within that interval, wider than 0.5 W, that does not include any of the selected frequencies.

In an exemplary embodiment of the invention, the magnitude of the ambient magnetic field is found sequentially at a plurality of different locations, and used for magnetic navigation or magnetic mapping or both.

Optionally, the ambient magnetic field is dominated by the earth's magnetic field, with only smaller contributions, or no contributions, from man-made structures or magnetic field sources.

There is further provided, according to an exemplary embodiment of the invention, a method of determining a magnitude of an ambient magnetic field, using the method of an exemplary embodiment of the invention, during a time interval, wherein the crystal is located in a device that generates a self magnetic field in the crystal due to one or more independently changeable device currents, one or more permanent magnets, or both, the method comprising:
a) determining a direction and a ratio of magnitude of self magnetic field to device current, in the crystal, for each of the device currents, if any, and direction and magnitude of the self magnetic field in the crystal due to the permanent magnets, if any;
b) measuring each of the device currents, if any, as a function of time during the time interval;
c) during the time interval, passing field-cancelling currents through each of a set of field-cancelling coils surrounding the crystal, the coils configured and the currents selected to substantially cancel the self magnetic field in the crystal, using the measured device currents if any, the ratios of self magnetic field and device current, if any, and the self magnetic field due to the permanent magnets, if any; and
d) using the method of an exemplary embodiment of the invention to measure the magnitude of the ambient magnetic field during the time interval, while the self magnetic field in the crystal is substantially cancelled by the field-cancelling currents in the field-cancelling coils.

There is further provided, in accordance with an exemplary embodiment of the invention, a method of finding a magnitude of an ambient magnetic field, using an ensemble of paramagnetic defects in a crystal having a diamond cubic structure with four tetrahedral axes, some of the defects oriented along each of the crystal's four tetrahedral axes, the method comprising:
a) exposing the ensemble of paramagnetic defects to microwave radiation;
b) illuminating the ensemble with light from a light source, of a wavelength to cause fluorescent emission;
c) measuring a total fluorescent emission intensity from the ensemble;
d) repeating (a), (b) and (c), using different frequencies of the microwave radiation to obtain a spectrum of the ensemble over a range of the frequencies that includes Zeeman split resonance frequencies, due to the ambient magnetic field, for parametric defects oriented along all four axes;
e) using the spectrum to obtain a value of a variance property of the spectrum;
f) calculating a value of the magnitude of the ambient magnetic field from the value of the variance property of the spectrum;
g) repeating (d), (e) and (f) a plurality of times; and
h) calculating a higher precision magnitude of the ambient magnetic field by combining the values of the magnitude of the ambient magnetic field calculated each time (f) is done, using an expression for the higher precision magnitude that is independent of any information about any differences in orientation of the axes of the diamond crystal in space during each of the times (d) is done.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1A:
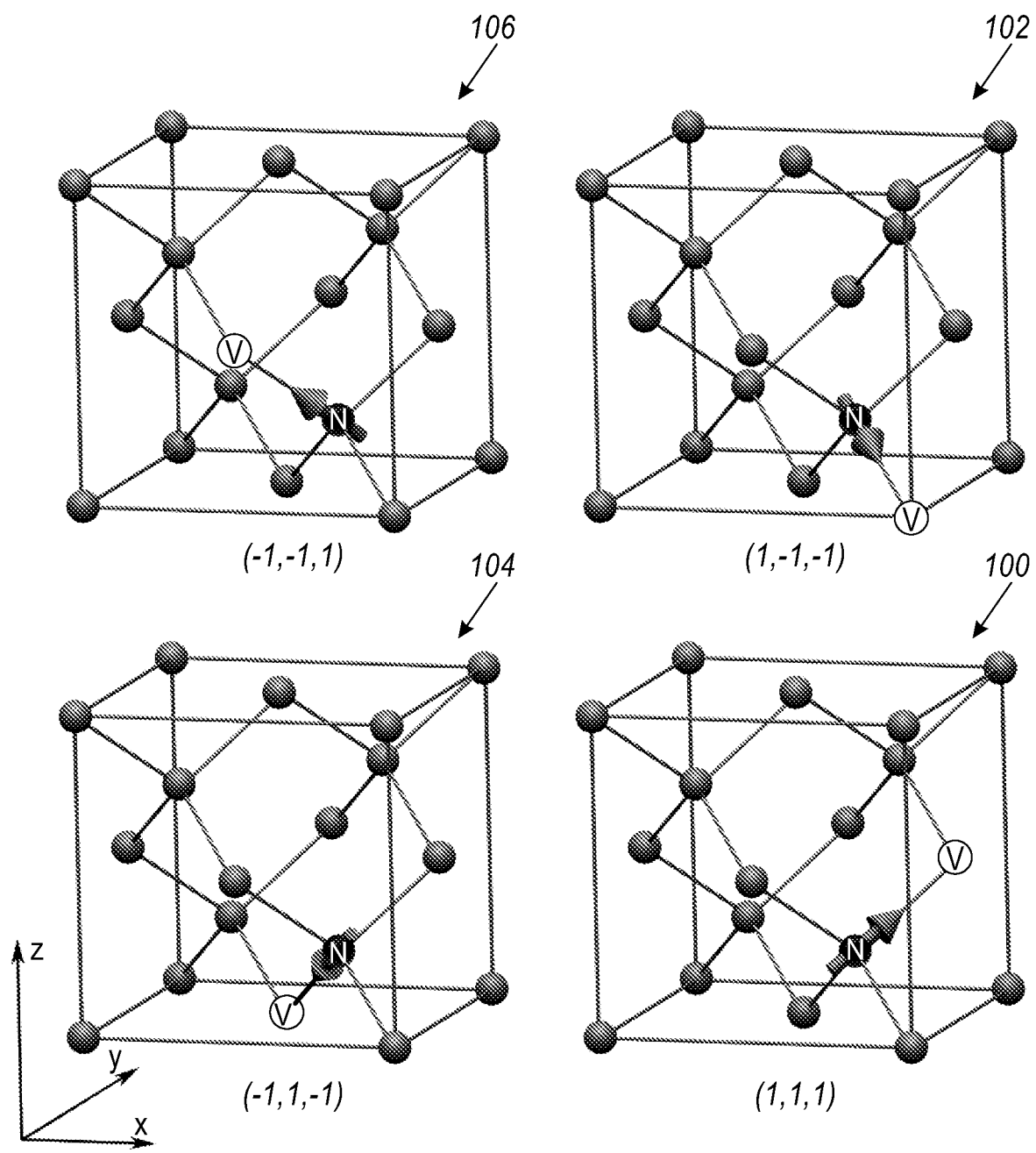
FIG. 1A is a schematic perspective view showing an NV center oriented along each of four tetrahedral axes of a diamond crystal, according to the prior art.

The present invention, in some embodiments thereof, relates to a magnetometer using an ensemble of paramagnetic defects in a solid and, more particularly, but not exclusively, to a magnetometer using nitrogen vacancy (NV) centers in diamond, suitable for magnetic navigation systems in mobile and/or portable devices.

The following terms used throughout the present disclosure may be understood according to the following explanations:

Diamond cubic crystal: this term may be used to refer to a crystal formed by a repeating pattern of a pair of intersecting face centered cubic lattices, separated by ¼ of the width of the unit cell in each dimension. Examples of diamond cubic crystals include diamond, silicon, and β-silicon carbide.

Paramagnetic defect: this term may be used to refer to a defect in a crystal with one unpaired electron or hole. This electron/hole gives rise to a paramagnetic contribution to the magnetic susceptibility of the crystal. Examples of paramagnetic defects include nitrogen vacancy centers in diamond and silicon carbide, and silicon vacancies in silicon carbide.

Tetrahedral axes: At least some types of paramagnetic defects in diamond cubic crystals, including nitrogen vacancy defects in diamond and silicon carbide, are aligned along any of the four tetrahedral axes of the crystal. If the directions of one of the two intersecting face-centered cubic (fcc) lattices are aligned with the [1, 0, 0], [0, 1, 0] and [0, 0, 1] axes of a Cartesian coordinate system, then the "four tetrahedral axes" refer respectively to the [1, 1, 1], [1, −1, −1], [−1, 1, −1] and [−1,−1, 1] directions, which are the directions pointing from the center of the cube to its corners. Typically, when an ensemble of such paramagnetic defects is present in such a crystal, their orientation is distributed randomly among the four tetrahedral axes, with about the same number of defects oriented along each tetrahedral axis.

Zeeman splitting: this term may be used to refer to the splitting of the resonance frequencies of a paramagnetic defect due to the presence of a static magnetic field.

Hyperfine splitting: this term may be used to refer to the splitting of the resonance frequencies of a paramagnetic defect due to the interaction of the spin state of the unpaired electron/hole of the paramagnetic defect with the spin state of a nucleus situated in its close vicinity.

Measurement time: this term may be used to refer to the period of time during which a fluorescent emission power of an ensemble of paramagnetic defects is measured with the ensemble exposed to a microwave field at a given frequency according to the methods described herein. The measurement time is optionally at least 100 microseconds, or at least 300 microseconds, or at least 1 millisecond, or at least 3 milliseconds.

Absorption spectrum: this term may be used to refer to the absorption of microwaves by the ensemble of paramagnetic defects as a function of the frequency of the applied microwave field. When the absorption spectrum is due to transitions between different spin states, it may be measured according to the methods described herein by measuring the fluorescent emission power as a function of the microwave frequency.

Spectrum acquisition time: this term may be used to refer to the period of time during which an absorption spectrum is acquired according to the methods described herein. The spectrum acquisition time, for measuring the fluorescent emission at all the selected microwave frequencies, is, for example, less than 10 milliseconds, or between 10 and 20 milliseconds, or between 20 and 50 milliseconds, or between 50 and 100 milliseconds, or between 100 and 200 milliseconds, or between 200 and 300 milliseconds, or between 300 and 500 milliseconds, or between 500 milliseconds and 1 second, or more than 1 second.

Variance property: this term may be used to refer to the variance of the absorption spectrum, which may include contributions due to the Zeeman splitting of energy levels for all four directions of orientation of the paramagnetic defects, the hyperfine splitting of energy levels, and the finite resonance width. Alternatively, the variance property is the part of the variance due to the Zeeman and hyperfine splitting of energy levels, or the variance property is the part of the variance due to the Zeeman splitting of energy levels for all four directions of orientation of the paramagnetic defects, which depends on the magnitude of the magnetic field. Any mathematical function of a variance property, that can be used to find the variance property, is also considered a variance property.

Mobile device: this term may be used to refer to a device that can change its location. Examples of mobile devices include a device in a car, a plane, a boat, or a satellite.

Portable device: this term may be used to refer to a mobile device intended to be carried by a human person. A portable device may be configured so that its length/width/thickness are below 5, 10, 15, 25, 30, 35, 40, 45, or 50 cm. A mass of a portable device may be below 0.5, 1, 2, 3, 5, or 10 kg. Examples of portable devices include handheld devices such as a mobile phone, a tablet, a laptop, or a bag; and wearable devices such as a bracelet, a watch, glasses, necklace, or clothing equipment.

An aspect of some embodiments of the invention concerns a device that detects the absorption spectrum of a crystal containing an ensemble of paramagnetic defects in a diamond cubic crystal. The orientations of the parametric defects are distributed, optionally randomly and uniformly, along the four different directions which correspond to the directions of the tetrahedral axes of the diamond cubic crystal. The device determines a magnitude of the ambient magnetic field by calculating a variance property of the microwave absorption spectrum. In general, the paramagnetic defects oriented along each axis may have a pair of Zeeman split resonance frequencies with a Zeeman splitting that depends at least approximately on the component of magnetic field along that axis. Depending on the orientation of the magnetic field relative to the four axes, there may be a different Zeeman splitting corresponding to each of the four axes, so the microwave absorption spectrum of the ensemble may exhibit eight different Zeeman split resonance frequencies.

A device that measures the magnitude of the magnetic field according to this method is sometimes referred to herein as a "quantum compass". Just as an ordinary compass finds the direction of the ambient magnetic field, which in conjunction with a map can be used for navigation, the quantum compass finds the magnitude of the ambient magnetic field, which in conjunction with a magnetic map can be used for navigation. Such a device may also be referred to herein as an NV center magnetometer. A number of crystal compositions and a number of types of defects may be suitable for use in such a magnetometer. The case that has primarily been investigated by the inventor is nitrogen vacancy (NV) centers in diamond, and the description herein will generally refer to the example of NV centers in diamond. But it should be understood that other defects and crystals can be used as well, and the invention is not limited to NV centers in diamond. In particular, NV centers in cubic silicon carbide have very similar properties to NV centers in diamond, and it is believed that everything described herein for NV centers in diamond could be done in almost the same way with NV centers in cubic SiC, with adjustments for the different values of the excitation and emission wavelengths of the fluorescent emission, the zero-field splitting resonance frequency, and hyperfine coupling constants.

It is potentially advantageous to use crystal compositions with the following properties: 1) composed of elements with naturally occurring isotopes with zero nuclear spin, such as carbon-12 and silicon-28, to minimize spin bath effects, optionally isotopically purified crystals with greatly reduced levels of other naturally occurring isotopes, such as carbon-13 and silicon-29, that have non-zero nuclear spin; 2) wide band gap, so that optical transitions of the defect do not interfere with the electronic states of the crystal; 3) available in high quality bulk or thin film single crystals with a few paramagnetic impurities that affect the spin state of the defect; and 4) a crystal having a diamond cubic crystal structure with four tetrahedral axes, with some of the defects oriented along each of the four axes, so that it is possible to use the Zeeman splitting of the resonance frequencies of the defects oriented along each of the four axes to obtain information on all of the spatial components of the magnetic field. These properties are found in diamond, cubic silicon carbide, and silicon. It is potentially advantageous if the defects have the following properties: 1) a long spin coherence time at room temperature, which may be achieved if the defect forms a highly localized bound state well isolated from sources of decoherence; 2) the defect can be optically initialized, and its spin state can be optically measured at room temperature, which can be done if the defect exhibits fluorescent emission that depends on the spin state of the defect, and if there is an optical pumping cycle that polarizes the defect in a well-defined spin state; 3) a transition in spin state that is in the megahertz or gigahertz range, and is subject to Zeeman splitting; and 4) the defects are distributed in orientation along four tetrahedral axes.

In the case of NV centers in diamond or silicon carbide, it is potentially advantageous to have a relative high ratio of NV centers to total nitrogen impurity atoms. Having a greater number of NV centers increases the signal for measuring the microwave absorption spectrum, potentially leading to an improved precision of the magnetic field measurement. But increasing the total number of nitrogen atoms also may increase the width of the resonance frequencies, because the non-zero nuclear spin of nitrogen atoms can decrease the coherence time of the NV centers, and a greater resonance width may make the precision of the magnetic field measurement worse. It may be feasible to produce diamonds with a density of NV centers as high as 30% of the density of nitrogen atoms, according to Barry et al, cited above; see Table V.1 on page 37. For a given ratio of NV centers to nitrogen atoms, increasing the number of nitrogen atoms may lead to improved performance if the density of nitrogen atoms is low enough so that carbon-13, which also has a non-zero nuclear spin, contributes more to the resonance width of the NV centers than nitrogen. The optimum density of nitrogen, in this case, may occur when nitrogen and carbon-13 contribute about equally to the resonance width, at least in the case where the diamond is not isotopically purified but has a natural level of carbon-13.

To find the absorption spectrum, the ensemble of NV centers is illuminated by a light source, such as a LED or a laser, at a wavelength or a range of wavelengths that produces fluorescent emission from the NV centers, for example a wavelength or range of wavelengths comprised between 520 nm and 560 nm, in the case of NV centers in diamond. Optionally, the light also puts a significant part of the NV centers initially into the spin triplet ground state, with $m_s=0$. The ensemble of NV centers is simultaneously exposed to an electromagnetic field from a tunable microwave source, at each of a plurality of different selected frequencies within an expected range for the resonance frequencies for transitions between the $m_s=0$ and $m_s=\pm 1$ spin triplet states of the NV centers, for example between 2.8 and 3.0 GHz. If the frequency of the electromagnetic field corresponds to a possible transition of the energy level structure of the ensemble, the ensemble will absorb energy from the field and a significant number of the NV centers will be excited into one of the $m_s=\pm 1$ states of the spin triplet. The fluorescence produced by the NV center ensemble is measured by a light detector, for example by a photodiode. As noted above, the internal level structure of NV centers is such that an NV center in the $m_s=\pm 1$ states will produce less fluorescent emission than in the $m_s=0$ state. Therefore the measured intensity of fluorescent emission as a function of microwave frequency provides the absorption spectrum of the ensemble of NV centers.

To produce the strongest absorption, the microwave field optionally is of a suitable amplitude and polarized with a component of magnetic field perpendicular to the axis of the NV center. A suitable polarization and a fairly uniform microwave amplitude, for all of the NV centers in the ensemble, can be achieved, for example, with a double split-ring microwave resonator surrounding the diamond, as described by Bayat et al, cited above.

In a single diamond crystal, nitrogen vacancy centers can be oriented in any of the four directions of the tetrahedral axes, shown in FIG. 1A. In a typical device there are a very large number of NV centers in a single crystal, for example about $2\times 10^{14}$ in the quantum compass described in FIGS. 2, 5A and 5B, and they are randomly and uniformly distributed in the four possible directions of orientation. For each direction, the Hamiltonian of a single NV center can be described as:

$$\frac{H_i}{k} = S.D_i.S + \gamma B.S + S.A_i.I + E(S_x^2 - S_y^2)$$

where S is a spin one operator, for the electron spin triplet of the NV center, $D_i$ is a zero-field splitting tensor, $A_i$ is an hyperfine coupling tensor which describes the hyperfine coupling between the electron and neighboring nitrogen nucleus for a given direction of orientation of the NV center, I is a spin one operator for the nitrogen nucleus, B is the ambient magnetic field, $\gamma$ is the Zeeman splitting constant, and E is a coefficient, with units of frequency, that is proportional to the strain in the diamond, and is typically on the order of a few MHz, comparable to $A_i$ and to $\gamma B$ when B is about 1 G. The index i labels the direction of orientation of the NV center, and can have the values 1, 2, 3 and 4. There are 4 different $D_i$ tensors which correspond to the 4 possible NV axes:

$$D_1 = \frac{D_0}{3}\begin{bmatrix} 1 & 1 & 1 \\ 1 & 1 & 1 \\ 1 & 1 & 1 \end{bmatrix}$$

$$D_2 = \frac{D_0}{3}\begin{bmatrix} 1 & -1 & -1 \\ -1 & 1 & 1 \\ -1 & 1 & 1 \end{bmatrix}$$

$$D_3 = \frac{D_0}{3}\begin{bmatrix} 1 & -1 & 1 \\ -1 & 1 & -1 \\ 1 & -1 & 1 \end{bmatrix}$$

$$D_4 = \frac{D_0}{3}\begin{bmatrix} 1 & 1 & -1 \\ 1 & 1 & -1 \\ -1 & -1 & 1 \end{bmatrix}$$

The value of the zero-field splitting resonance frequency $D_0$ for NV centers in diamond is about 2.87 GHz at room temperature, and decreases with increasing temperature by approximately 74 kHz per degree Celsius. It should be noted that in the above equations for the $D_i$ tensors, the i=3 and i=4 axes have been defined as pointing in the opposite direction to the way they are depicted in FIG. 1A, so that all four axes have a positive x component. This does not have any effect on the energy levels, but switches the labeling of the $m_s=+1$ and $m_s=-1$ states for the i=3 and i=4 axes. The Zeeman splitting constant $\gamma=2.8$ MHz/G splits the $m_s=\pm 1$ states. In the basis of the NV center, the hyperfine coupling tensor is diagonal since the nitrogen is supposed to possess the same symmetry as the NV center. In this basis $A_i$ can be written, for any direction i, as:

$$A = \begin{bmatrix} A_\perp & 0 & 0 \\ 0 & A_\perp & 0 \\ 0 & 0 & A_\| \end{bmatrix}$$

The values of the hyperfine coupling constants for NV centers in diamond are $A_\|=2.17$ MHz and $A_\perp=2.7$ MHz. The nitrogen nucleus with its spin one operator I causes a 3-fold splitting in each of the Zeeman levels. The allowed microwave transitions correspond to transitions where total angular momentum is conserved. As a consequence, the absorption spectrum of an NV center ensemble in the range of interest is composed of 24 resonance transitions.

The width of each resonance transition can be as low as 300 kHz, full width half maximum (FWHM), in an isotopically purified diamond with essentially no carbon-13, with a nitrogen concentration of 10 ppm, and with a low level of the microwave field and a low level of optical pumping. For realistic levels of microwave field and optical pumping, the FWHM resonance width would be somewhat higher, for example about 400 kHz. With a higher concentration of nitrogen, for example 30 ppm, the resonance width would be still higher, for example 1 MHz. Alternatively, if a diamond sample with a natural level of carbon-13, about 1.07%, is used, with 10 ppm of nitrogen, the FWHM resonance width would be about 600 kHz for low levels of microwave field and optical pumping, and somewhat higher, for example about 800 kHz, with realistic levels of microwave field and optical pumping. Using a diamond sample that is not isotopically purified has the potential advantage that it is much less expensive than an isotopically purified diamond, and it may be practical to make the diamond thick enough so that a substantial fraction of the fluorescent excitation light is absorbed, increasing the power efficiency of the quantum compass.

Optionally, the levels of nitrogen and carbon-13, and in the case of SiC the levels of silicon-29, and the levels of microwave field and optical pumping, are such that the FWHM resonance width is less than 200 kHz, or between 200 and 300 kHz, or between 300 and 500 kHz, or between 500 and 700 kHz, or between 700 kHz and 1 MHz, or between 1 and 1.2 MHz, or between 1.2 and 1.5 MHz, or between 1.5 and 2 MHz, or greater than 2 MHz. Optionally, those resonance widths pertain when the levels and microwave field and optical pumping power are low, and the resonance width is essentially due to $\Gamma_2^*$ for the crystal.

In order to resolve the resonance transitions, and to measure the resonance frequency with good precision, it is potentially advantageous for the bandwidth of the tunable microwave source to be a least a few times less than the resonance width, for example, in the case of a 800 kHz resonance width, less than 200 kHz, or less than 50 kHz, or less than 20 kHz, or less than 5 kHz. Optionally, the microwaves are coherent for the measurement time, and the bandwidth is the inverse of the measurement time. Alternatively, the microwave bandwidth is much greater than the inverse of the measurement time, and the microwaves do not remain coherent for more than a fraction of the measurement time, but the bandwidth is still much smaller than the resonance width.

The time used to measure the fluorescent emission at each selected microwave frequency is optionally large enough to resolve the resonance and to measure the resonance frequency with good precision, and is longer, for example at least 3 times longer, than the Rabi period for the microwaves. For example, the measurement time is at least 100 microseconds, or at least 300 microseconds, or at least 1 millisecond, or at least 3 milliseconds. The spectrum acquisition time, required for measuring the fluorescent emission at all the selected microwave frequencies, is, for example, less than 10 milliseconds, or between 10 and 20 milliseconds, or between 20 and 50 milliseconds, or between 50 and 100 milliseconds, or between 100 and 200 milliseconds, or between 200 and 300 milliseconds, or between 300 and 500 milliseconds, or between 500 milliseconds and 1 second, or more than 1 second.

It is potentially advantageous to measure the absorption spectrum at at least a few different frequencies within a resonance width of each resonance frequency. When the quantum compass is being used to measure a magnetic field that is comparable to the Earth's magnetic field, between 0.2 and 0.7 G, and the resonance width is about 800 kHz, then the distance between the resonances will be comparable to the resonance width, and it may not make very much difference exactly which microwave frequencies are used when obtaining the spectrum. For example, the tunable microwave source can be successively tuned to fewer than 20, or between 20 and 30, or between 30 and 50, or between 50 and 100, or between 100 and 160, or between 160 and 320, or between 320 and 480, or between 480 and 600, or more than 600 different frequencies, or a smaller, larger, or intermediate number of frequencies, optionally uniformly distributed, within a range of less than 1.5 MHz or between 1.5 and 2 MHz or between 2 and 3 MHz, or between 3 and 4 MHz, or between 4 and 5 MHz, or between 5 and 10 MHz, or between 10 and 15 MHz, or between 15 and 20 MHz, or more than 20 MHz, around the zero-field splitting resonance frequency. Using additional frequencies, or making measurements of longer duration at the same frequencies, may further improve the precision of the measured spectrum because it may reduce the noise by the square root of the spectrum acquisition time. However, it is potentially advantageous not to take such a long time to acquire the spectrum, that there are significant errors due to fluctuations over time of the ambient magnetic field, or due to changes over time in the orientation of the quantum compass.

An equation relating the variance of the resonance frequencies to the magnitude of the magnetic field may be derived analytically, using a simplified form of the Hamiltonian where the hyperfine coupling term $S.A_i.I$ is ignored, and where the Zeeman splitting term $\gamma B.S$ is small compared to the dominant term $S.D_i.S$. For the full Hamiltonian, including the hyperfine coupling term, the variance of the resonance frequencies has been calculated numerically as a function of the magnitude of the magnetic field B, for B in a range between 0.1 and 0.5 gauss typical of the Earth's magnetic field, and fitted to an approximate empirical formula, which may be used to find the magnitude of the magnetic field from the measured variance of the resonance frequencies.

The simplified Hamiltonian for each NV center is a 3×3 matrix operating on the three spin components, $m_s=+1$, $m_s=0$, and $m_s=-1$, of the wave function of the electron triplet. For an i=1 NV center, oriented along the [1, 1, 1] direction, the Hamiltonian, ignoring the hyperfine coupling, is given by $$\frac{H_1}{h} = \begin{bmatrix} \frac{2D_0}{3} + Y^{B_z} & \frac{\left(\frac{1}{3} - \frac{i}{3}\right)D_0}{\sqrt{2}} + \left(\frac{B_x}{\sqrt{2}} - \frac{iB_y}{\sqrt{2}}\right)Y & -\frac{iD_0}{3} + E \\ \frac{\left(\frac{1}{3} - \frac{i}{3}\right)D_0}{\sqrt{2}} + \left(\frac{B_x}{\sqrt{2}} - \frac{iB_y}{\sqrt{2}}\right)Y & \frac{2D_0}{3} & -\frac{\left(\frac{1}{3} - \frac{i}{3}\right)D_0}{\sqrt{2}} + \left(\frac{B_x}{\sqrt{2}} - \frac{iB_y}{\sqrt{2}}\right)Y \\ \frac{iD_0}{3} + E & -\frac{\left(\frac{1}{3} - \frac{i}{3}\right)D_0}{\sqrt{2}} + \left(\frac{B_x}{\sqrt{2}} + \frac{iB_y}{\sqrt{2}}\right)Y & \frac{2D_0}{3} - Y^{B_z} \end{bmatrix}$$

The resonance frequencies (eigenfrequencies) associated with this NV center are the eigenvalues of this matrix, which may be found by finding the zeroes of the characteristic polynomial of the matrix, $$P_1(x) = -\frac{2\gamma^2 D_0}{3}\left(B_x^2 + B_y^2 - B_y B_z + B_z^2 - B_x(B_y + B_z)\right) +$$

$$\gamma^2 E(B_x^2 - B_y^2) - \frac{2D_0 E^2}{3} + \left(-D_0^2 + E^2 + (B_x^2 + B_y^2 + B_z^2)\gamma^2\right)x + 2D_0 x^2 - x^3$$

This is a cubic polynomial which has 3 zeroes. When the Zeeman splitting term $\gamma B$ is small compared to $D_0$, two of the zeroes are close to $D_0$ and represent the Zeeman split resonance frequencies, while one of the zeroes is much closer to zero. Changing variables from x to $X=D_0-x$, the characteristic polynomial becomes $$P_1(X) = -\frac{D_0 E^2}{3} + \frac{D_0 \gamma^2}{3}(B_x + B_y - B_z)^2 +$$

$$\gamma^2 E(B_x^2 + B_y^2) + \left[(B_x^2 + B_y^2 + B_z^2)\gamma^2 + E^2\right]X - D_0 X^2 - X^3$$

Looking for solutions close to zero, the $X^3$ term can be neglected, and the characteristic polynomial becomes a quadratic polynomial, whose two zeroes $X_1^1$ and $X_2^1$, satisfy the following conditions:

$$X_1^1 + X_2^1 = \frac{(B_x^2 + B_y^2 + B_z^2)\gamma^2 + E^2}{D_0}$$

$$X_1^1 + X_2^1 = -\frac{Y^2}{3}(B_x + B_y - B_z)^2 - \frac{E^2}{3} - Y^2 \frac{E}{D_0}(B_x^2 - B_y^2)$$

We wish to calculate the variance V of all the Zeeman split resonance frequencies of the ensemble of NV centers, ignoring for now the effects of hyperfine coupling, including the two resonance frequencies for the NV centers oriented along each of the four tetrahedral axes. The variance of the resonance frequencies is defined as the sum of the squares of the differences between each resonance frequency and the mean of all the resonance frequencies, divided by the number of resonance frequencies. For i=1, the two resonance frequencies are $x_1^1 = X_1^1 + D_0$ and $x_2^1 = X_3^1 + D_0$ and the mean of all the resonance frequencies is close to $D_0$. Then the contribution to the variance for the i=1 resonance frequencies is $(x_1^1 - D_0)^2 + (x_2^1 - D_0)^2 = X_1^{1^2} + X_2^{1^2} = (X_1^1 + X_2^1)^2 - 2X_2^1 X_2^1$ Using the expressions above for $X_1^1 + X_2^1$ and $X_1^1 X_2^1$, we find $$(x_1^1 - D_0)^2 + (x_2^1 - D_0)^2 = \left[\frac{(B_x^2 + B_y^2 + B_z^2)\gamma^2 + E^2}{D_0}\right]^2 + \frac{2\gamma^2}{3}(B_x + B_y - B_z)^2 + \frac{2E^2}{3}$$

Similar expressions may be found for the contribution to the variance for the resonance frequencies for the NV centers oriented along the other tetrahedral axes. For the i=2 resonance frequencies, the contribution to the variance is $$(x_1^2 - D_0)^2 + (x_2^2 - D_0)^2 = \left[\frac{(B_x^2 + B_y^2 + B_z^2)\gamma^2 + E^2}{D_0}\right]^2 + \frac{2\gamma^2}{3}(B_x - B_y + B_z)^2 + \frac{2E^2}{3}$$

For the i=3 resonance frequencies, the contribution to the variance is $$(x_1^3 - D_0)^2 + (x_2^3 - D_0)^2 = \left[\frac{(B_x^2 + B_y^2 + B_z^2)\gamma^2 + E^2}{D_0}\right]^2 + \frac{2\gamma^2}{3}(-B_x + B_y + B_z)^2 + \frac{2E^2}{3}$$

For the i=4 resonance frequencies, the contribution to the variance is $$(x_1^4 - D_0)^2 + (x_2^4 - D_0)^2 = \left[\frac{(B_x^2 + B_y^2 + B_z^2)\gamma^2 + E^2}{D_0}\right]^2 + \frac{2\gamma^2}{3}(B_x + B_y - B_z)^2 + \frac{2E^2}{3}$$

The variance V of all eight resonance frequencies is the sum of the right hand sides of these four equations, divided by 8, the number of resonance frequencies:

$$V = \frac{1}{8}\left[\frac{2\gamma^2}{3}(B_x + B_y + B_z)^2 + \frac{2E^2}{3} + \right.$$

$$\frac{2\gamma^2}{3}(B_x - B_y + B_z)^2 + \frac{2E^2}{3} + \frac{2\gamma^2}{3}(-B_x + B_y + B_z)^2 +$$

$$\left. \frac{2E^2}{3} + \frac{2\gamma^2}{3}(B_x + B_y - B_z)^2 + \frac{2E^2}{3} + 4\left[\frac{(B_x^2 + B_y^2 + B_z^2)\gamma^2}{D_0}\right]^2\right]$$

The last term of the expression is always small and can be neglected in a first approximation. We obtain $$V \approx \frac{\gamma^2}{3}(B_x^2 + B_y^2 + B_z^2) + \frac{E^2}{3} = \frac{\gamma^2 B^2 + E^2}{3}$$

It should be noted that the variance V depends only on the magnitude of the magnetic field, not on its direction. Then, if the hyperfine splitting is ignored, the magnitude of the magnetic field B may be found from the variance V of the Zeeman split resonance frequencies by $$B = \frac{\sqrt{3V - E^2}}{\gamma}$$

For magnetic field B comparable to the Earth's magnetic field, however, $\gamma B$ is comparable to, or somewhat less than, the hyperfine splitting coefficient $A_\parallel$, and the hyperfine splitting cannot be ignored. When hyperfine splitting is included, the Hamiltonian becomes a 9×9 matrix, and each resonance frequency is split into three resonance frequencies, corresponding to the nuclear spin k along the direction of the NV center being +1, 0, or −1, so there are a total of 24 Zeeman split resonance frequencies for all four directions of the NV centers, instead of only 8 Zeeman split resonance frequencies. The inventor has found that the variance V of all 24 Zeeman split resonance frequencies, calculated numerically, is given to good approximation by $$V \approx \frac{\gamma^2}{3}(B_x^2 + B_y^2 + B_z^2) + \frac{E^2}{3} + \frac{2A_\parallel^2}{3} = \frac{\gamma^2 B^2}{3} + \frac{E^2}{3} + \frac{2A_\parallel^2}{3}$$

which again depends only on the magnitude of the magnetic field B, not on its direction. Using this approximation, the magnitude B of the magnetic field can be found from the variance V of the 24 Zeeman split resonance frequencies using $$B \approx \frac{1}{\gamma}\sqrt{3V - E^2 - 2A_\parallel^2}$$

The relative error in the field amplitude is directly related to the error in the measurement of the variance and is given by $$\delta B = \frac{3\delta V}{2\gamma^2 B}$$

This expression may imply that, if one wishes to determine the amplitude of a field close to Earth's magnetic field amplitude with a precision of about 10 nT, a precision of about $(25 \text{ kHz})^2$ in the measured variance may be desirable.

This approximate expression for the field magnitude B is believed to be accurate to within a few percent for magnetic fields similar to the Earth's magnetic field, but that may not be good enough to accurately measure the small local natural variations in the magnitude of the Earth's magnetic field that may be used for magnetic navigation. A better approximation to the magnitude of the magnetic field may be obtained by using a better fit to the numerical calculation of the variance of the resonance frequencies, for B in the range of 0.1 to 0.7 G, comparable to the Earth's magnetic field, and for $A_\parallel$ equal to 2.1 MHz, its value for NV centers in diamond. For this range of B and this value of $A_\parallel$, the inventor has found that $$B \approx \frac{1}{\gamma}\sqrt{3V - E^2 - 2A_\parallel^2} + \frac{93 nT \cdot A_\parallel}{\sqrt{3V - E^2 - 2A_\parallel^2}}$$

is accurate to within about 10 nT, and it is insensitive to the direction of the magnetic field. It is believed that the small correction term, the second term on the right, has its numerator proportional to $A_\parallel$, as shown, for $A_\parallel \ll D_0$, because it is known from the derivation above that this correction term vanishes when $A_\parallel = 0$, and it may be seen from the characteristic polynomial for the 9×9 Hamiltonian matrix, including the nuclear spin states, that this correction to B will be linear in $A_\parallel$ for small $A_\parallel$. This 10 nT precision may be good enough for magnetic navigation using the natural local variations in the Earth's magnetic field. For the exemplary design described in the Examples section, with a spectrum acquisition time of 50 milliseconds, the random error in the field measurement due to noise in the light detector is somewhat greater than this, about 18 nT, so there would be no need to use a more precise expression for B in terms of the variance V of the resonance frequencies.

As will be described below, there are two methods of determining the variance V of the resonance frequencies from the measured absorption spectrum, which each has potential advantages. In the first method, the total variance $V_{spect}$ of the spectrum is first determined directly from the shape of the spectrum. The variance $V_{spect}$ of the spectrum is expected to be, to good approximation, a sum of a contribution from the width of the resonance peaks, and the variance V of the 24 resonance frequencies. The contribution from the width of the resonance peaks can be calculated from the intrinsic resonance width of the diamond, which depends on the concentrations of nitrogen atoms and carbon-13 atoms, and from the optical pumping rate, which depends on the intensity of light illuminating the diamond, and from the Rabi frequency, which depends on the amplitude of the microwave field in the diamond. If these quantities are all known, the contribution from the width of the resonance peaks can be calculated and subtracted from the total variance $V_{spect}$ of the spectrum, leaving the variance V of the resonance frequencies. In the second method, curve fitting is used to find the 24 resonance frequencies from the measured absorption spectrum, and the values of the resonance frequencies are used to find their variance V.

Alternatively, instead of determining the variance V of the resonance frequencies from the absorption spectrum, and using the expressions above to find the magnitude B of the magnetic field from the variance V of the resonance frequencies, the magnitude of the magnetic field may be found directly from the total variance $V_{spect}$ of the absorption spectrum. To do this, the total variance of the spectrum is first measured for different known values of the magnitude of the magnetic field B, producing a calibration curve. Because of the theoretical expectation that the variance of the spectrum should depend only on the magnitude of the magnetic field, not on its direction, it is not necessary to perform this calibration for different directions of the magnetic field, but only for different values of the magnitude. The calibration curve is then used to find B from the measured variance $V_{spect}$ of the spectrum, without any need to know the resonance widths, or to determine the resonance frequencies from the spectrum, or to have a theoretical expression relating the variance V of the resonance frequencies to the magnitude B of the magnetic field.

A useful figure of merit for a quantum compass, or for any magnetometer, is the inverse of minimal resolution of the magnetic field measurement (in nT), times the inverse of the power consumed by the magnetometer in watts, times the inverse of the square root of the spectrum acquisition time in seconds (or equivalently, times the square root of the acquisition bandwidth in Hz). The larger this figure of merit, the better the performance of the quantum compass. The consumed power of the quantum compass is often dominated by the power consumed by the light source, and that is true of the exemplary design described in the Examples section. For the example, this figure of merit is optionally greater than 0.1, 0.14, 0.2, 0.3, 0.5, 0.7, 1.4, 2, 3, 5, 7 or 10. Optionally, the consumed power of the light source is less than 500, 200, 100, 50, 20 or 10 mW. For the exemplary design of the quantum compass described in the Examples section, the light source is an LED with a consumed power of 80 mW, and this figure of merit is 3. This low consumed power, which may dominate the total consumed power of the quantum compass, potentially makes the quantum compass suitable for use as a magnetic navigation device in a mobile device such as a cell phone.

To evaluate the figure of merit for a given quantum compass, the random error or resolution in measuring the magnitude of the magnetic field is optionally found by making repeated measurements of a magnetic field that is known not to be changing, optionally keeping the quantum compass at a fixed orientation in space, and evaluating the error from the standard deviation of the results. If the spectrum acquisition time is not always the same for the different repeated measurements, then optionally both the mean and the variance of the results of the measurements are calculated by weighting the measurements in proportion to the spectrum acquisition time used to obtain each measurement, with the standard deviation being found from the square root of the variance. As used herein, a standard deviation found by this procedure is referred to as a standard deviation weighted by the spectrum acquisition time. Assuming that the error is random with a Gaussian distribution, as it is expected to be if the relative error is small and it is primarily due to Johnson noise and shot noise in the light detector, then the underlying magnetic field can be found to increasing accuracy by making more and more repeated measurements, for example 10 measurements are made, or 20 measurements, or 50 measurements, or 100 measurements, and finding the standard deviation of the results. It should be understood that, in the limit that the number of measurements goes to infinity, repeatedly measuring the same field, the standard deviation of the errors will approach a constant value, which may be referred to as the true standard deviation. Although of course it is not possible to perform an infinite number of measurements, the standard deviation found for any finite number of measurements will, on average, differ from the true standard deviation by a magnitude that can be calculated according to the known rules of statistics. Similarly, assuming there is no systematic error in the measurements, the mean value of all the measurements will approach the true value of the magnetic field in the limit of an infinite number of measurements, and for any finite number of measurements the mean value will, on average, differ from the true value by a magnitude that can be calculated according to the known rules of statistics.

Alternatively, an expected random error in the measured magnitude of the magnetic field can be calculated for a given measurement, for example by simulating a set of NV center absorption spectra from the measured spectrum, using a known level of noise in the light detector, or by using an analytic expression for a random error in the calculated magnitude of the magnetic field corresponding to random errors in the spectrum due to the noise level in the light detector, as described below in the "Examples" section, and the figure of merit can be evaluated using that expected random error in the measured magnitude of the magnetic field. In this case, the figure of merit applies to a particular measurement performed by the quantum compass, and it only includes the error due to noise in the light detector, for example Johnson noise and shot noise, and not to other sources of error. But the inventor has found that noise in the light detector is often the dominant source of error in measuring the magnitude of the magnetic field.

For definiteness, the expected random error in the measured magnitude of the magnetic field, or in any component of the magnetic field, is defined as the random error that would be obtained from a simulation in which the following simplified model is used to generate absorption spectra of the ensemble of NV centers, for a given magnitude and direction of the magnetic field. The 24 resonance frequencies are found by solving the 9×9 Hamiltonian matrix numerically. Each resonance frequency is assumed to produce a Gaussian-shaped peak in the spectrum, with a width Δv and a contrast C given by the formulas in the Examples section taken from Jensen et al. But the contrast C is assumed to be multiplied by an additional factor $$\left(1 - \frac{\sin\Omega_R t_{meas}}{\Omega_R t_{meas}}\right)$$

that approximately takes into account the effect of having a measurement time $t_{meas}$ for each microwave frequency that is less than or comparable to the Rabi period $2\pi/\Omega_R$. A large number of spectra are generated, each with a different randomly chosen instance of noise in the photodiode, with a Gaussian distribution given by the Johnson and shot noise levels of the photodiode. The expected random error in the field is then the standard deviation of the different values of the field that are found from the spectra with different instances of noise. It should be understood that this model for the spectrum is not exact, but it is expected to be a good enough approximation that it can serve as a reasonable basis for defining the expected random noise level in the measured field.

Optionally, the expected random noise level in the measured field, due to noise in the light detector is less than 5 nT, or between 5 and 10 nT, or between 10 and 20 nT, or between 20 and 30 nT, or between 30 and 50 nT, or between 50 and 100 nT, or greater than 100 nT. Optionally, this expected random noise level in the measured field is achieved when the power consumed by the light source is less than 250 mW, and/or when the spectrum acquisition time is less than 200 milliseconds.

It should be understood that an NV center magnetometer which finds the magnitude of the magnetic field directly from the spectrum of resonance frequencies in this way, can potentially achieve the same field error and measurement time with lower power consumption, and in general can achieve better values for the figures of merit, than a prior art NV center magnetometer that finds the three spatial components of the magnetic field vector. An NV center magnetometer that uses the methods described by Zhang et al, to find the three spatial components of the magnetic field vector, takes more time and/or consumes more power to find the field to the same precision, because the spectrum of resonance frequencies must be measured several times, with the orientation of the magnetometer rotated by a known angle along two different rotation axes, or else with an external magnetic field of known magnitude added in a known direction. In addition to taking more time and the light source consuming more power with repeated measurements of the spectrum, additional power is consumed by the need to rotate the magnetometer, or to generate an external magnetic field, by running current through a coil, or by moving permanent magnets. The moving parts, and hysteresis in the case of changing an external magnetic field, may also add additional sources of error to the measurement of the field.

Pham (PhD thesis, cited above) also describes a magnetometer that uses an added external magnetic field. A well-calibrated static magnetic field $B_0$ (see FIG. 2.1, p. 23) is applied along an arbitrary direction to spectrally distinguish the four possible NV orientation classes from each other in a continuous wave Electron Spin Resonance (ESR) experiment. Any additional unknown static field results in ESR spectrum resonances that are slightly shifted from those of the calibrated $B_0$ spectrum. By extracting the resonance shifts which correspond to at least three of the four possible NV orientation classes, one can therefore reconstruct the vector components of the unknown field. In addition to presenting this continuous wave method, Pham shows that an ESR spectroscopy can also be performed using pulses. Yet, one of the principal limitations of all these techniques stems from the required application of an external well-calibrated magnetic field $B_0$ on the whole sample. This calibrated field should be strong enough to separate the spectral lines of the four possible NV orientation classes and uniform enough on all the surface of the sample. A typical value of $B_0$ used by Pham is 100 G while the homogeneity of a solenoid magnet is typically ~0.1% on a 1 cm diamond sample. Moreover, a current loop producing the calibrated field is a source of power consumption which will reduce the autonomy of a portable device.

Clevenson, cited above, also applies a known uniform external magnetic field in order to separate the resonances of the four NV classes, but the field is produced by an array of permanent magnets, rather than by a solenoid. But using permanent magnets for this purpose has other disadvantages. Using a small permanent magnet in a portable device can be challenging. Furthermore, the magnetic environment can modify the calibration of the applied field due to magnetic hysteresis.

Teale, cited above, uses an NV center magnetometer to measure the direction and magnitude of an external magnetic field. Three orthogonal sets of Helmholtz coils apply independently controlled additional field components in the x, y, and z directions. By comparing the spectra of the NV center ensemble with and without the added fields, a rotation matrix is found that relates the orientation of the diamond axis to the lab frame. Once the rotation matrix is found, the spectra are used to find the magnitude and direction of the magnetic field. This method has the same disadvantages as Pham's method and Clevenson's method, in that it applies a controlled additional magnetic field, to measure the existing magnetic field. In addition, Teale proposes to get an accurate value of the magnetic field vector by using a nonlinear search which uses the full Hamiltonian of the NV ensemble to find a magnetic field vector that minimizes the difference between its resonant frequencies and the measured frequencies. Yet, this process tends often to get stuck at incorrect local minima and requires important computer resources to converge rapidly.

It is also possible to determine which resonance frequencies correspond to which orientation of NV centers, by looking at the spectrum of the fluorescent emission from several well distinguishable single NV centers, the axes of which have already been determined. A magnetometer using a single NV center is described, for example, by Taylor et al, cited above. But the signal produced by fluorescent emission from a single NV center is very much less than the signal produced by a large ensemble of NV centers, so a magnetometer that looks at only a single NV center at a time will generally require optical equipment that is more expensive, larger, and less robust than a magnetometer that looks at fluorescent emission from an ensemble of NV centers oriented along four different axes, and it may still have much worse precision at a given bandwidth.

Optionally, the spectrum is measured, and the magnitude of the magnetic field is found from the spectrum, repeatedly, and the results are averaged together. Optionally, if the acquisition time is different for the different measurements, then the average is weighted in proportion to the acquisition time. Assuming that the magnitude of the magnetic field has not changed much during this time, and that the error in each measurement of the spectrum is due mostly to random noise, for example the Johnson noise and shot noise in a photodiode used for detecting the fluorescent emission, the error in the averaged field values will decrease in proportion to the square root of the number of times the measurement is repeated. This is true even if the magnetometer changes its orientation in an unknown and uncontrolled way from one measurement to the next, so that these changes in orientation cannot be taken into account in calculating the averaged magnitude of the magnetic field.

Although changes in orientation of the magnetometer from one measurement to the next do not introduce an error in the averaged measured magnitude of the magnetic field, changes in orientation of the magnetometer during a measurement of the spectrum, for example between measuring the fluorescent emission at one microwave frequency and measuring the fluorescent emission at a different microwave frequency, can, in general, cause errors in the spectrum, and consequently errors in the magnitude of the magnetic field calculated from the spectrum. For a small change in orientation, much less than one radian, while the spectrum is being measured, if the orientation is changing linearly with time, and the different microwave frequencies are measured at times that depend linearly on frequency, then the relative error introduced in the measured magnitude of the field may be on the order of the square of the angle, in radians, over which the orientation of the magnetometer changes during the measurement. Optionally, the change in orientation of the magnetometer while measuring a spectrum is less than 0.1 radian, or less than 0.07 radians, or less than 0.05 radians, or less than 0.03 radians, or less than 0.02 radians, or less than 0.01 radians, introducing relative errors in the magnitude of the magnetic field that are respectively less than about 1%, or 0.5%, or 0.25%, or 0.1%, or 0.04%, or 0.01%. Optionally, the change in orientation while the spectrum is being measured is small enough so that the resulting error in the magnitude of the magnetic field is less than errors caused by other sources of error, for example errors caused by Johnson and shot noise in a photodiode that detects the fluorescent emission. Optionally, this is true for each of a series of repeated measurements of the spectrum over time, which are averaged together, and the relative error in the averaged magnitude of the magnetic field is correspondingly small, even though the total change in orientation of the magnetometer, over the entire time that the repeated measurements are made, may be large, for example more than one radian.

Optionally, the variance of the resonance frequencies is found from the spectrum by first curve fitting the spectrum to find values of all twenty-four resonance frequencies. These twenty-four resonance frequencies represent each combination of Zeeman splitting ($m_s$=+1 and −1) and hyperfine splitting (k=−1, 0 and +1) of the zero-field splitting resonance frequency $D_0$, for NV centers oriented along each of the four tetrahedral axes of the diamond crystal (i=1, 2, 3, and 4). The resonance frequencies come in pairs. For each resonance frequency with a given magnitude combined Zeeman splitting and hyperfine splitting above $D_0$, there is a resonance frequency with very nearly the same magnitude of combined Zeeman splitting and hyperfine splitting below Do. Once the values of the twenty-four resonance frequencies are found, they are used to find their variance, for example their mean value is found, and the variance is found from the sum of the squares of the differences between the value of each resonance frequency, and the mean value. Alternatively, instead of finding all twenty-four resonance frequencies, only the eight resonance frequencies for a given value of k are found, for example only the eight resonance frequencies for k=0, and the variance only of those resonance frequencies is found, since that is the part of the variance that provides a measure of the magnitude of the magnetic field. The eight k=0 resonance frequencies can be found, for example, by taking the zero-field splitting resonance frequency $D_0$ and the four k=0 resonance frequencies that are above the zero-field splitting resonance frequency as free parameters (since the resonance frequencies come in pairs located at very nearly the same distance above and below the zero-field splitting resonance frequency), or by taking all eight k=0 resonance frequencies as free parameters, and keeping the hyperfine splitting parameter $A_\|$ fixed at its known value, and searching for the values of the five or eight free parameters that provide the best fit to the spectrum, making an assumption about the difference in resonance frequency between the different k values for a given direction i of NV centers, for example assuming that the k=+1 and the k=−1 resonance frequencies are $A_\|$ above and below the k=0 resonance frequency for the same i.

However, numerical calculations of the eigenvalues of the Hamiltonians show that the difference in resonance frequencies between different k values for a given direction i of NV centers is not exactly $A_\|$, but can differ from $A_\|$ by as much as one percent, depending on the magnitude and direction of the magnetic field, and assuming that the hyperfine splitting is exactly $A_\|$ could introduce errors in the magnitude of the magnetic field of a few tens or even a few hundreds of nT. A more precise measurement of the magnitude of the magnetic field might be obtained by using curve fitting to find all 24 Zeeman split resonance frequencies, taking $D_0$ and the 12 resonance frequencies above $D_0$ as free parameters, or taking all 24 resonance frequencies as free parameters, finding the variance V of the 24 resonance frequencies, and using the expression for B given above, with the correction term. That procedure seems to give values of B that are accurate to about 10 nT.

It should be understood that other equivalent mathematical manipulations may be used to find the variance from the values of the resonance frequencies. For example, since the resonance frequencies are located in pairs at very nearly the same distance above and below the zero-field splitting resonance frequency, the variance can also be found by sorting the twenty-four resonance frequencies into twelve pairs, or sorting the eight k=0 resonance frequencies into four pairs, and taking the sum of the square of the difference in resonance frequencies for each pair. It should also be understood that, instead of finding the variance of all the resonance frequencies, or all the k=0 resonance frequencies, a quantity proportional to the variance can be found, and the factor of proportionality can be taken into account when using that quantity to find the magnitude of the magnetic field. All of these and other mathematically equivalent methods are included in "finding a variance" and "calculating a value of the magnitude of the magnetic field from the variance."

Optionally, when $D_0$ is found because it is one of the free parameters used in the curve-fitting, or because it is very nearly equal to the mean value of all the resonance frequencies, it is used to find the temperature of the diamond crystal, since $D_0$ has a known dependence on temperature, decreasing by about 74 kHz for each increase in temperature of 1 degree Celsius. In principle, it should be possible to use this method to measure temperature to within a small fraction of 1 degree, for example to within a few hundredths of 1 degree.

Alternatively, instead of, or in addition to, using curve fitting to find the values of the resonance frequencies from the spectrum, the variance of the resonance frequencies, or the variance of the k=0 resonance frequencies, may be found directly from the spectrum, without necessarily ever finding the values of the resonance frequencies. This can be done because, for example, the spectrum can be modeled as the sum of Gaussian peaks, one for each resonance frequency. This model is of course an approximation but it happens that the actual shape of the peaks of an ensemble of NV centers is indeed very close to Gaussian. Alternatively, the spectrum is modeled as the sum of peaks of a different shape, for example using a more accurate model for the shape of the resonances. If the peaks are Gaussian, then the contribution to the variance of the spectrum from each resonance peak will be given by the square of the resonance frequency shift for that peak plus the square of the width of the peak, and this will be true to good approximation if the peaks are nearly Gaussian. The variance of the resonance frequencies can then be found by first finding the variance of the spectrum, then obtaining the variances (widths squared) of the individual peaks, and subtracting the variances of the individual peaks from the variance of the spectrum. The variances of the individual peaks can be obtained, for example, from the fact that the widths of the resonance frequencies are all close to the known width of the zero-field resonance, nearly independent of the magnetic field and the temperature. That width depends on properties of the diamond, such as the density of nitrogen atoms, and the amount of carbon-13 in the diamond, as well as on the amplitude of the microwave field and the intensity of the light which pumps the NV centers down to their $m_s=0$ state.

It should be understood that, in the description above, the variance of the spectrum, and the variance of individual peaks in the spectrum, refer to a spectrum that has been inverted, so that it has a value close to zero at frequencies that are far from any resonance, and has local maxima in value close to the resonance frequencies, possibly with some distortion if two resonances substantially overlap. Conceptually it may be easier to understand how the variance of the resonance frequencies is calculated if one thinks about this inverted spectrum. However, a mathematically equivalent calculation of the variance of the resonance frequencies may also be made by using the un-inverted spectrum, which has its maximum value far from any resonance, and has dips corresponding to the different resonances. "Calculating the variance of the resonance frequencies" from the spectrum includes all such mathematically equivalent methods.

Simulations by the inventor have suggested that, for a given spectrum with a given level of noise, similar errors in the magnitude of the field can generally be obtained if the variance of the resonance frequencies is obtained by curve fitting to find the values of the resonance frequencies, rather than using the alternative method of finding the variance of the spectrum.

Optionally, multiple measurements of the magnitude of the magnetic field are made sequentially by the magnetometer at different locations, and used for magnetic mapping and/or for magnetic navigation. The combination of high precision in the field measurement, short measurement time, and low power consumption may make the type of magnetometer described herein particularly suitable for magnetic navigation outdoors, and for creating magnetic maps used for such magnetic navigation, with the magnetometer incorporated into a mobile device such as a cell phone. Optionally, the magnetic navigation or magnetic mapping uses only the magnitude of the magnetic field, not the direction of the magnetic field, which has the potential advantage that the navigation or mapping can take full advantage of the high precision, short measurement time and low power consumption of the magnetometer described herein, with no need to measure or keep track of the orientation of the magnetometer.

Optionally, the magnitude of the magnetic field used in the navigation or mapping is dominated by the Earth's magnetic field, with only small contributions from man-made magnetic field sources, or man-made magnetic structures, such as magnetic steel buildings, that distort the Earth's magnetic field. In these circumstances, where the field is very weak, the quantum compass described herein may be especially useful for measuring the magnitude of the magnetic field, compared to prior art methods of measuring the magnitude of the magnetic field, which may work only for magnetic fields that are much stronger than the Earth's magnetic field. Alternatively, the Earth's magnetic field may be concentrated somewhat by man-made structures, for example steel-frame buildings, or artificially generated magnetic fields, much stronger than the Earth's magnetic field, may be introduced, for example, for the purpose of indoor magnetic navigation. In those cases, too, the quantum compass may provide advantages over prior art magnetometers for magnetic navigation, for example providing some combination of improved precision, increased acquisition bandwidth, and decreased power consumption. And the stronger magnetic fields may mean that the quantum compass performs better absolutely, than when the Earth's magnetic field is the dominant magnetic field.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Exemplary Design and Operation of the Quantum Compass

Figure 2:
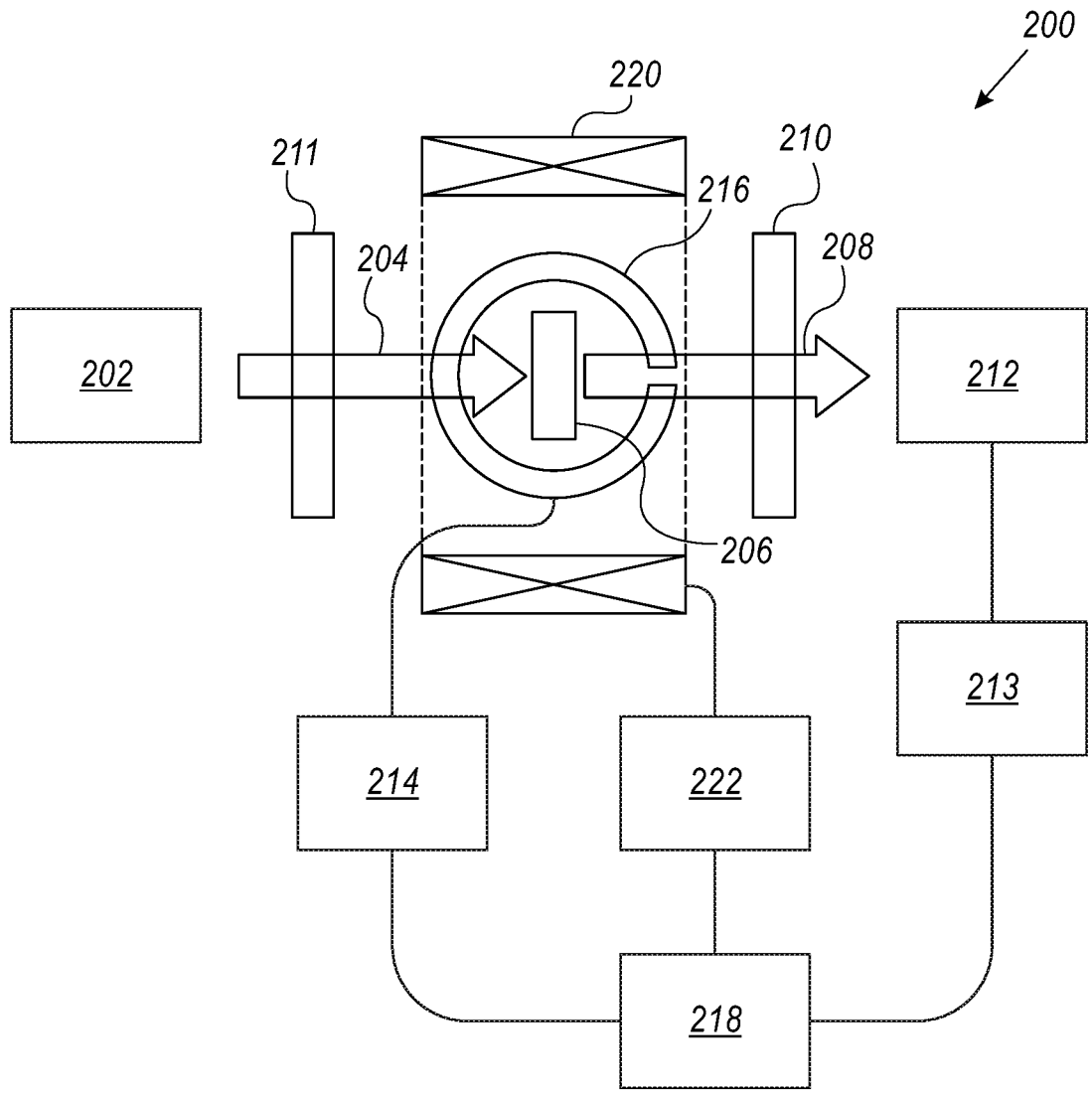
FIG. 2 is a schematic block diagram showing the parts of a quantum compass, according to an exemplary embodiment of the invention.

Referring now to the drawings, FIG. 2 illustrates a block diagram of an NV center magnetometer 200, referred to herein as quantum compass 200, according to an exemplary embodiment of the invention. Details of an exemplary layout for the components shown in FIG. 2 will be given in FIGS. 5A and 5B. A light source 202, for example a light-emitting diode (LED) or a laser diode, produces light 204 of a wavelength or a range of wavelengths that excites fluorescent emission of NV centers with reasonably good power efficiency. For example, the light source produces light with a wavelength or range of wavelengths between 520 and 560 nm. Light of wavelength greater than about 560 nm may not work as well, since it may not excite fluorescent emission of NV centers at all, or may excite a much lower power of fluorescent emission, relative to the power of the excitation light, than light at shorter wavelengths, or may excite fluorescent emission only at longer wavelengths that are more difficult to detect. On the other hand, light sources that produce light of wavelength shorter than about 520 nm may be generally less power efficient, in terms of the light they emit relative to the power they consume, and in terms of the fluorescent emission they excite relative to the excitation light power received by the NV centers. Since the power consumed by the magnetometer is often dominated by the power consumed by the light source, and since the sensitivity of the light source depends on the fluorescent emission power that is detected, the best ratio of sensitivity to consumed power may be achieved by using an excitation light source with wavelength between 520 nm and 560 nm.

Using a laser as the light source, for example a laser diode, has the potential advantage over using an LED, that a laser produces light with a narrower range of wavelengths, which can be more effectively filtered out of the fluorescent emission light that is measured. But an LED has the potential advantage that it can be more power efficient than a laser diode.

FIG. 2 shows an LED as light source 202. An example of a suitable LED light source is an SMD LED from Dialight, with viewing angle of 140 degrees and luminous intensity of 250 mcd at a wavelength of about 520 nm. It emits approximately 4 mW of light power, and consumes 60 mW of electric power, with a forward current of 20 mA at 3.2 volts. However, in the exemplary design for a quantum compass described below in the Examples section, the light source has a somewhat higher light power, 5.2 mW, and consumes 80 mW of electrical power.

Light 204 from light source 202 illuminates a sample 206 comprising a diamond crystal with an ensemble of NV centers. One or more optical components, such as lenses and mirrors, optionally concentrate the light from light source 202 on sample 206. Alternatively, the light source is located very close to the sample, and lenses and other optical components are not needed to concentrate the light on the sample.

In some embodiments of the invention the diamond crystal contains a layer made of isotopically purified carbon with a reduced fraction of carbon-13, since the carbon-13 in naturally occurring carbon significantly increases the NV center resonance width, which adversely affects the sensitivity of the magnetometer. For example, a carbon 12 enriched layer, 30 μm thick, can be grown on the top of a single crystal diamond of dimensions 1.5 mm by 1.5 mm by 0.3 mm commercially available from companies such as Element 6. A 0.3 mm thickness of the crystal may be enough to provide mechanical stability and ease of handling, without being more expensive than necessary. The carbon 12 enriched layer is deposited on the sample by chemical vapor deposition (CVD) and optionally reaches at least 99.999% pure carbon-12, which may be sufficient to make the resonance width about as low as can be achieved. During the growth process, the CVD gas mixture is modified to generate a nitrogen enriched surface layer about 30 μm thick with nitrogen density of about $5 \times 10^{18}$ atoms/cm$^3$ corresponding to 30 ppm. Subsequently, electron irradiation is performed with an energy of about 180 keV, with a total time-integrated flux of about $3 \times 10^{18}$ electrons/cm$^2$, for example a flux of about $1.5 \times 10^{14}$ electrons/cm$^2$·s for 5 hours. Finally, the sample is annealed at 800 degrees Celsius for several hours in vacuum, for example between 2 hours and 16 hours, yielding a dense layer of NV centers with a density of about $3 \times 10^{17}$ cm$^{-3}$. Further details of a process for creating NV centers in a diamond sample are given in Barry et al, cited above, especially on pages 36 to 38, and in the references cited therein. In such a sample, the resonance width of the NV center resonances may be only about 600 kHz.

A potential disadvantage of using a layer of isotopically purified diamond is that it may be prohibitively expensive to make the layer comparable in thickness to the full 0.3 mm thickness of the diamond, while if the layer is much thinner than 0.3 mm, only a small fraction of the light illuminating the diamond may be absorbed and fluorescently emitted by the NV centers, for example only 3% in the case of a layer 30 μm thick with a density of NV centers of $3 \times 10^{17}$ cm$^{-3}$, and much of the power consumed by the light source, and by the quantum compass, will be wasted, while the weak signal produced by the fluorescent emission may have a low signal to noise ratio, and produce a large random error in the magnetic field measurement. Instead, the exemplary design described in the Examples section does not have a layer of isotopically purified diamond, but has an even higher density of NV centers, $5 \times 10^{17}$ cm$^{-3}$, distributed throughout the 0.3 mm thickness of the diamond. As a result, a substantial fraction of the light from the light source, for example 36%, is absorbed by the NV centers and fluorescently emitted, and the fluorescent emission signal, which is used to find the absorption spectrum of the ensemble of NV centers, has a relatively high signal to noise ratio, resulting in a smaller random error in the field measurement, in spite of the resonance width being slightly larger, about 800 kHz, due to the carbon-13 in the diamond. The resonance width is only slightly larger, 800 kHz as opposed to 600 kHz, because the concentration of nitrogen atoms is lower, $1.7 \times 10^{18}$ cm$^{-3}$, corresponding to 10 ppm.

Synthetic diamond crystals with a controlled concentration of nitrogen atoms can be produced by high pressure and high temperature synthesis (HPHT) or by chemical vapor deposition (CVD), and are available commercially from companies such as Element Six, as described in the *Element Six CVD Diamond Handbook*, which may be downloaded from <https://e6cvd(dot)com/media/wysiwyg/pdf/E6_CVD_Diamond_Handbook(dot)pdf>. Once the nitrogen-doped diamond crystal has been grown, to produce the NV centers in the diamond, it is irradiated with electrons with a total time-integrated flux of about $1 \times 10^{18}$ electrons/cm$^2$, over several hours. The electron energy is optionally greater than 180 keV, for example 300 to 500 keV, or 500 keV to 1 MeV, or 1 to 3 MeV, to allow the electrons to penetrate to the full 0.3 mm depth of the sample. As noted previously, further details on the irradiation are given in Barry et al, cited above. Finally, the sample is annealed for several hours, for example between 2 and 16 hours, at 800 degrees Celsius in vacuum, yielding a dense layer of NV centers with a density of about $5 \times 10^{17}$ cm$^{-3}$.

Alternatively, instead of the diamond being 1.5 mm by 1.5 mm by 0.3 mm thick, it is 1 mm or 2 mm or 3 mm wide, with a square or rectangular shape, and alternatively it is 0.1 or 0.2 or 0.5 mm thick, but a 1.5 mm by 1.5 mm square surface is just big enough to fit into the microwave resonator design described in the Examples section, and provides a strong enough fluorescent emission signal for good performance of the quantum compass, as described in the Examples section.

The absorption cross-section of an NV center for light at 532 nm is $K=3 \times 10^{-17}$ cm$^2$, so for the above mentioned density of NV centers [NV]=$5 \times 10^{17}$ cm$^{-3}$, and a layer of thickness w=0.3 mm, illuminated face on, the fraction of incident light absorbed is $1-\exp(-K[NV]w) = 1-\exp(-0.45) = 36\%$, and most of this absorbed light power goes into fluorescent emission.

The NV centers in sample 206 generate fluorescent emission light 208, of wavelength in a range about 600-800 nm in the case of NV centers in diamond, which passes through a filter 210 which filters out almost all of the excitation light 204, leaving less than 0.3%, and filters out relatively little of the fluorescent emission light 208. The filtered fluorescent emission light is detected by a light detector 212, for example a photodiode. In addition to the filter, other optical components, such as lenses and mirrors, optionally collect the emission light and convey it to light detector 212. Alternatively, the light detector is nearly adjacent to the sample, for example with most of the space between them taken up by the filter, and a substantial fraction of the emission light reaches the light detector even without any lenses, or other optical components. For example, the inventor has estimated that about 20% of the fluorescent emission light emitted by NV centers in sample 206 will reach light detector 212. This fraction is so low in part because of the high index of refraction of diamond, about 2.41.

Optionally, sample 206 has a filter 211 on the side facing light source 202, that filters out or reflects any light at the fluorescent emission range of wavelengths, about 630 to 645 nm, that might be produced by the light source, since such light, if it entered sample 206, would add to the fluorescent emission light 208 detected by light detector 212, and reduce the contrast between the fluorescent emission power detected when the microwaves are near one of the resonance frequencies and when they are not. Optionally, instead of or in addition to a separate filter between sample 206 and light source 202, the face of sample 206 facing light source 202 is coated with a Bragg reflector, designed to substantially transmit all the excitation light in the range of 520 to 560 nm produced by the light source, and to substantially reflect all of the light in the wavelength range, about 600 to 800 nm, of the fluorescent emission light of the NV centers. Bragg reflectors are described, for example, in the Wikipedia article at <https://en(dot)wikipedia(dot)org/wiki/Distributed_Bragg_reflector>. Such a Bragg reflector will not only prevent any light around 600 to 800 nm, that might be produced by light source 202, from entering sample 206, but it will also reflect the portion of the fluorescent emission light that is emitted by the NV centers toward the light source, and reflect it back through sample 206 toward light detector 212, increasing the fraction of fluorescent emission light from the NV centers that reaches light detector 212, for example by about a factor of 2, from 20% up to 40%, thereby doubling the signal to noise ratio of the light detector.

Optionally, instead of or in addition to the Bragg reflector coated on the surface of sample 206 facing light source 202, there is another Bragg reflector coated on the surface of sample 206 facing light detector 212. This other Bragg detector is designed to substantially reflect all light in the wavelength range of the excitation light produced by the light source, for example 520 to 560 nm, and to substantially transmit all light in the wavelength range 600 to 800 nm of the fluorescent emission light of the NV centers. As a result, the light from the light source that hasn't been absorbed in its first pass through sample 206 is reflected back through sample 206 for a second pass, allowing more light to be absorbed by the NV centers and to produce fluorescent emission. If both Bragg reflectors are present, then the detected fluorescent emission power, and the signal to noise ratio, may increase by about a factor of 3.

An example of a suitable photodiode is a photodiode produced by Hamamatsu, model S12915-16R. This is a silicon photodiode with a rise time of 2 μs, a peak sensitivity, at 640 nm, of 0.45 amps per watt, and a dark current of 5 pA. The output from the photodiode is amplified by an amplifier 213. The amplifier is optionally a simple op-amp circuit with a resistance of 50 ohms, which fixes the ratio of the output current of the photodiode to the output voltage of the detection circuit. This resistance produces a Johnson noise of $(4k_B TR)^{1/2} = (4 \times 4 \times 10^{-21} \times 50)^{1/2} = 9 \times 10^{-10}$ volts/(Hz)$^{1/2}$, where T is the temperature, assumed to be 300° K, and $k_B$ is Boltzmann's constant. The Johnson noise of the photodiode may be the main source of error in measuring the magnetic field. The photodiode will also have shot noise, of amplitude $R(2eI)^{1/2}$, where $e=1.6 \times 10^{-19}$ coulombs is the charge of an electron, and I is the current in the photodiode corresponding to the full emission power of the NV centers. For the exemplary design presented in the Examples section, the photodiode current is 200 μA corresponding to a full received fluorescent emission power of 400 μW. Then the shot noise is $4 \times 10^{-10}$ volts/(Hz)$^{1/2}$, and the total noise, Johnson noise plus shot noise, is $[(9 \times 10^{-10})^2 + (4 \times 10^{-10})^2]^{1/2} = 9.8 \times 10^{-10}$ volts/(Hz)$^{1/2}$.

Figure 1B:
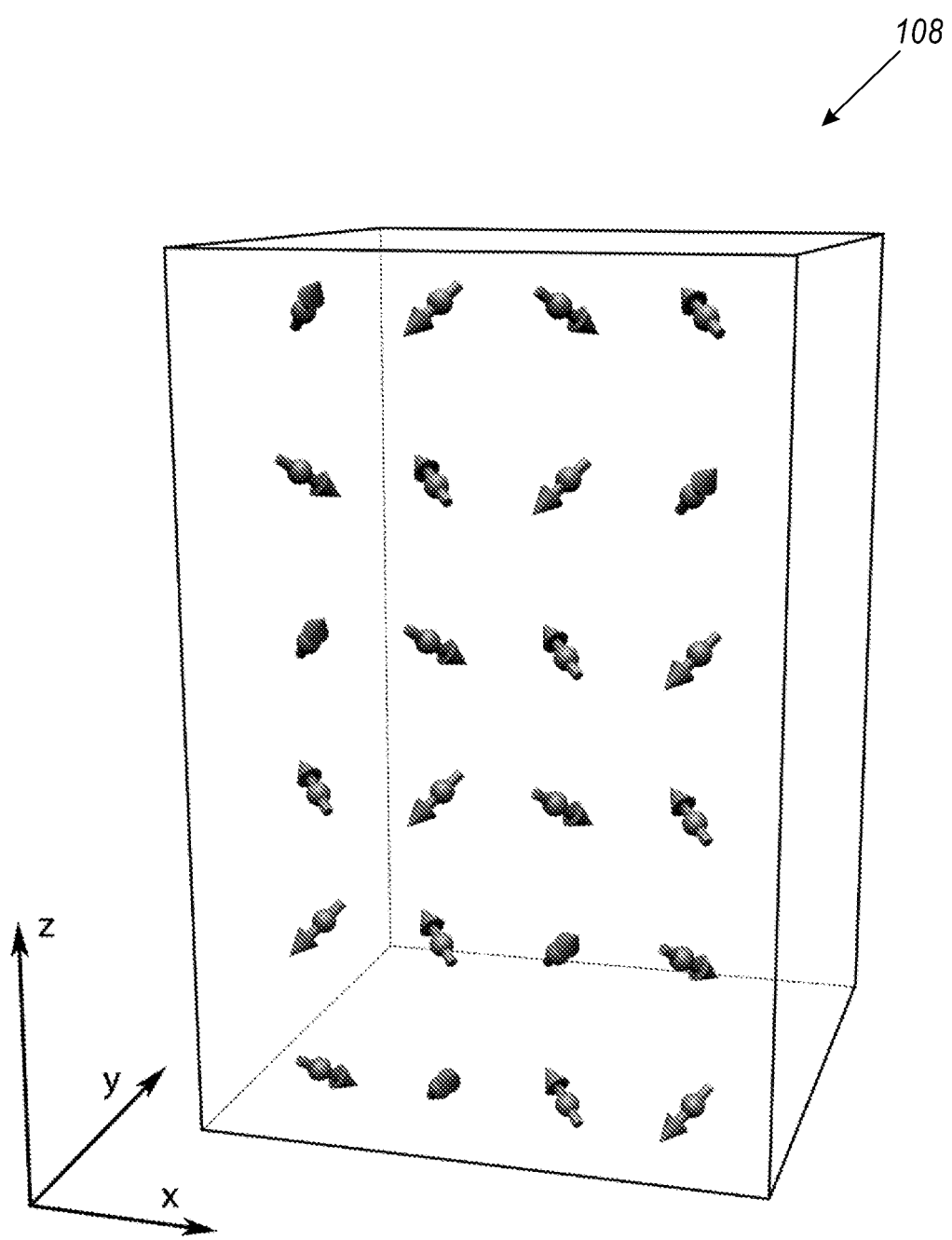
FIG. 1B is a schematic perspective view showing an ensemble of NV centers with different orientations in a diamond crystal, according to the prior art.

A voltage-controlled tunable oscillator 214 generates electric power at microwave frequencies, with a frequency range that includes an expected frequency range of the absorption spectrum of the NV centers, for example between 2.7 GHz and 3 GHz in the case of NV centers in diamond. An example of a suitable oscillator is the Microtronics ZX95-3150, which generates power at frequencies between 2.6 and 3.15 GHz, and has an output power of 4 mW, or +6 dBm. Alternatively, if the quantum compass is incorporated into a mobile device such as a cellular phone, an oscillator already found in the mobile device is optionally used as voltage-controlled oscillator 214. The generated electromagnetic field is transmitted to sample 206 using a double split-ring resonator that surrounds the sample. Bayat et al, referenced above, for example, describes a suitable design, and illustrates how the sample is placed inside the ring of the resonator. This design has the potential advantage that the magnetic component of the microwave field is nearly uniform in amplitude and direction throughout the sample. If the square slab-shaped sample has the z crystal axis, shown as vertical in FIG. 1A, aligned with the narrow direction across the slab, and the slab is oriented in the plane of the split-ring as shown in FIG. 1b of Bayat et al., then the magnetic component of the microwave field will be oriented nearly along the z axis of the crystal, throughout the sample. This means that the component of the microwave magnetic field perpendicular to the axis of the NV center will have nearly the same magnitude for all NV centers in the sample, regardless of their location and regardless of which tetrahedral axis they are directed along. Such a microwave field will be nearly equally effective for boosting the $m_s=0$ state of an NV center to the $m_s=\pm1$ state, when it is in resonance with that NV center, regardless of the location and orientation of the NV center.

The voltage output from the amplified photodiode is sent to a controller 218, for example the computing hardware of a mobile device such as a cellular phone that the quantum compass is installed in, and the controller records the amplitude of the fluorescent emission at that value of the microwave frequency. Controller 218 is also connected to oscillator 214, and can control and change the oscillation frequency of oscillator 214, as will be described in FIG. 3.

Optionally, sample 206 is surrounded by a set of coils 220, for example three sets of Helmholtz coils oriented orthogonal to each other, that can be used to cancel out any self-field from the quantum compass, or from a device, such as a cell phone, that it is incorporated into. Such a self-field could be produced by currents flowing in circuits in the device, or by permanent magnets associated with the device, for example in order to mount it on a dashboard of a car. When the self-field is canceled out by coils 220, the remaining field in sample 206, which is being measured by the quantum compass, is the ambient field. Coils 220 are powered by a power supply 222, which is controlled by controller 218. FIG. 5C, below, gives an exemplary design for coils 220, and FIG. 6 describes a method for adjusting the currents in coils 220 so that the self-field is canceled.

It should be noted that, for NV centers in cubic SiC, the fluorescent emission wavelength is about 1500 nm instead of about 640 nm, according to Zargaleh et al, cited above, so the light detector should be sensitive to this longer wavelength, in the near infrared, and the light source optionally emits light at a longer wavelength, for example between 900 and 1300 nm, rather than at 520 to 560 nm. The zero-field splitting resonance frequency $D_0$ for NV centers in cubic SiC is 1.30 GHz, according to Zargaleh et al, instead of 2.87 GHz, so the microwave oscillator operates accordingly over a range around this lower frequency, and the resonator is designed to operate at these lower frequencies. The hyperfine coupling coefficient to the spin of the nitrogen nucleus is about 1.08 MHz for NV centers in cubic SiC.

Figure 3:
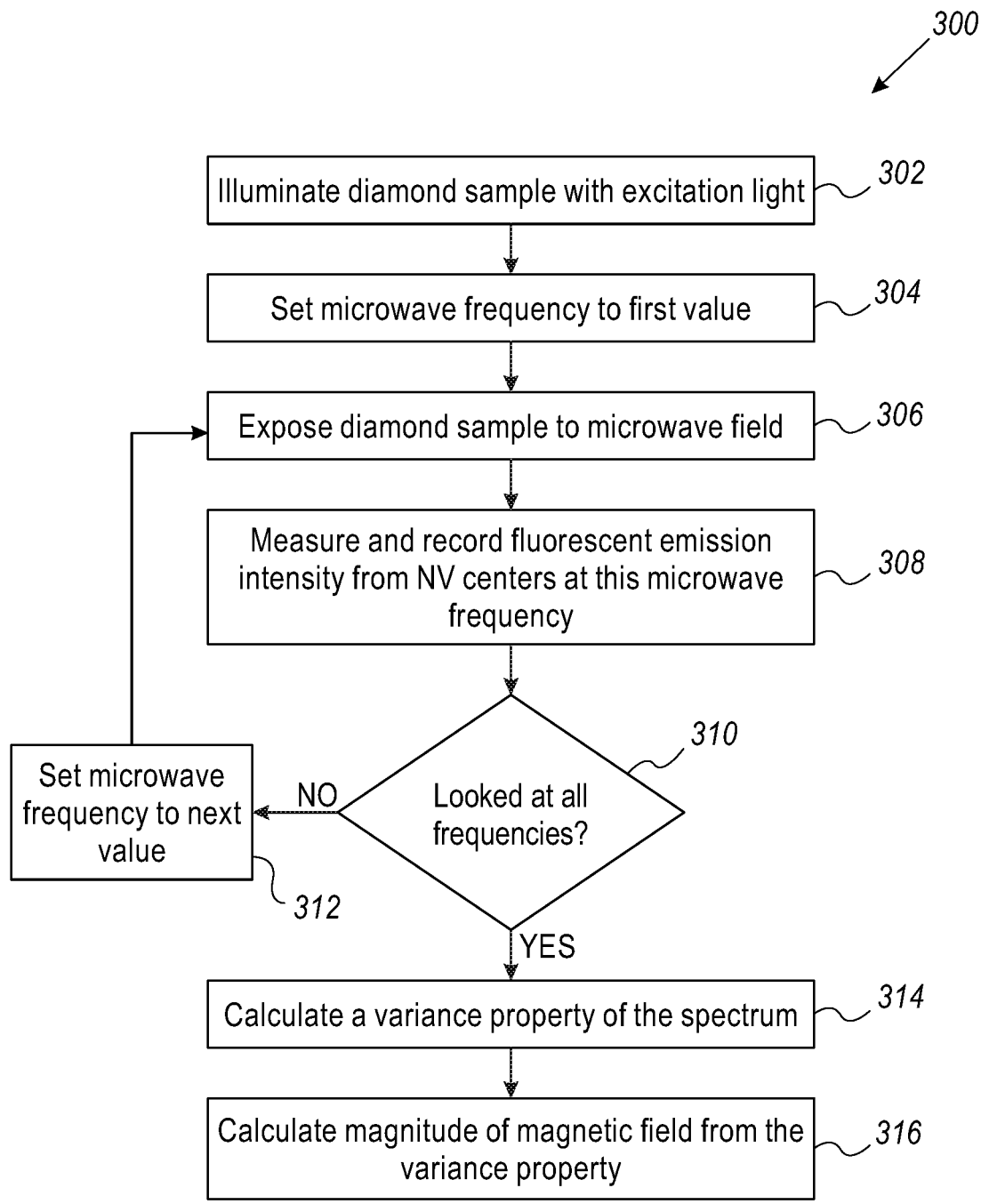
FIG. 3 is a flowchart showing how the quantum compass of FIG. 2 can be used to find the magnitude of the magnetic field.

FIG. 3 shows a flowchart 300 describing the method of operation of quantum compass 200 of FIG. 2. At 302, diamond sample 206 is illuminated with light from light source 202, which excites fluorescent emission of NV centers in sample 206. The magnetometer works by finding a spectrum of the Zeeman split resonance frequencies of the ensemble of NV centers in sample 206. In order to do this, the sample is exposed to microwaves at each of a number of different selected frequencies, within a range where the resonance frequencies are expected to fall. At each selected frequency, the fluorescent emission is measured and recorded. Fluorescent emission from a given NV center is reduced, when the microwave frequency is within about a resonance width of a resonance frequency for that NV center, because NV centers in the $m_s=\pm1$ states produce less fluorescent emission than NV centers in the $m_s=0$ state, and because exposure of the sample to excitation light initially may put significantly more of the NV centers in the $m_s=0$ state than would be found in thermal equilibrium.

The absorption spectrum for the ensemble of NV centers in the diamond is found by measuring the fluorescent emission from the ensemble of NV centers, some of them oriented along each of the tetrahedral axes, over a range of different selected microwave frequencies that is expected to cover all of the resonance frequencies and their peaks. For a magnetic field of magnitude B oriented along the direction of an NV center, the Zeeman split resonance frequencies are displaced from the zero-field splitting resonance frequency, about 2.87 GHz, by about $\pm\gamma B$ where $\gamma=g\mu_B/h$, where $g\approx2$ is the spin g-factor of an electron, $\mu_B$ is a Bohr magneton, and h is Planck's constant. This is equal to 2.8 MHz for a field B of $10^{-4}$ tesla (1 gauss). For a magnetic field of magnitude B oriented in a different direction than the NV center, the Zeeman split resonance frequencies are expected to have a smaller shift from the zero-field splitting resonance frequency. For some of the resonance frequencies, the $k=\pm1$ resonance frequencies, there is an additional shift of about $\pm A_\parallel$.

For measuring magnetic fields of magnitude B, it is potentially advantageous for the range of selected microwave frequencies to extend from at least $\gamma B$ below the zero-field splitting resonance frequency to at least $\gamma B$ above the zero-field splitting resonance frequency, or to include the $k=\pm1$ resonance frequencies, from at least $\gamma B+A_\parallel$ below the zero-field resonance frequency to at least $\gamma B+A_\parallel$ above the zero-field splitting resonance frequency. Optionally, the range of microwave frequencies is a little broader than this, to cover not only the resonance frequencies, but the full widths of the resonances. For the exemplary design described in the Examples section, the FWHM resonance width W is about 800 kHz, and the range of microwave frequencies may extend at least $\gamma B+W$, or at least $\gamma B+A_\parallel+W$, above and below the zero-field splitting resonance frequency. If the magnetometer is being used to measure magnetic fields that are dominated by the Earth's magnetic field, which is between 0.2 and 0.7 gauss, then the range of microwave frequencies may extend about 2 to 5 MHz above and below the zero-field splitting resonance frequency.

In principle, one could look at the resonance spectrum only above the zero-field splitting resonance frequency, or only below the zero-field splitting resonance frequency, since the spectrum above the zero-field splitting resonance frequency will be nearly a mirror reflection of the spectrum below the zero-field splitting resonance frequency. However, the zero-field splitting resonance frequency is itself sensitive to temperature, which may not be known very accurately, and more accurate results for the spectrum may be obtained by measuring it over the full range above and below the expected zero-field splitting resonance frequency, optionally with a somewhat greater range to reflect uncertainties in the temperature. For example, for measuring the Earth's magnetic field, the range of selected microwave frequencies optionally extends at least 2 MHz above and below the nominal zero-field splitting resonant frequency. Alternatively, the range of selected microwave frequencies extends far enough on one side of the zero-field splitting resonance frequency to include all of the Zeeman split resonance frequencies and resonance widths on that side, but on the other side extends only far enough to accurately determine the zero-field splitting resonance frequency around which the spectrum is symmetric. It is potentially advantageous if the range of selected microwave frequencies does not extend too much beyond the expected range of the Zeeman split resonance frequencies and resonance widths, since little if any information about the magnetic field will be obtained by using microwave frequencies well outside the range of the Zeeman split resonance frequencies and their peaks.

For purposes of deciding the range of selected microwave frequencies to use, optionally an initial estimate is provided for the value of the zero-field resonance frequency $D_0$, based for example on assuming that the temperature is room temperature, or on obtaining at least a rough estimate of the temperature, good to within 1 or 2 degrees Celsius for example, from a thermometer. Optionally, an initial estimate is provided for the magnitude of the magnetic field B, for example based on a known approximate value for the Earth's magnetic field at that longitude, if the measurement is being made far from any man-made magnetic structure or magnetic field source. Optionally, an initial estimate is also provided for the resonance width W, based on characteristics of the NV ensemble and the diamond, and on the amplitude of the microwave field. If the quantum compass is measuring the magnitude of the magnetic field repeatedly, for example for purposes of magnetic navigation or magnetic mapping, at relatively frequent time intervals, such that the temperature and magnetic field are not expected to change very much from one measurement to the next, then optionally the zero-field splitting resonance frequency and/or the magnitude of the magnetic field obtained in one measurement is used as an initial estimate for the next measurement.

Optionally, within the range of selected microwave frequencies, for example at least within an interval between $D_0$ and $D_0+\gamma B+W$ (or $D_0+\gamma B+W+A_\parallel$), or between $D_0$ and $D_0-\gamma B-W$ (or $D_0-\gamma B-W-A_\parallel$), the selected microwave frequencies are spaced closely enough so that no resonance peak will be missed completely. For example, there is no gap wider than 0.5 W, or there is no gap wider than W, within that interval, where there are no selected microwave frequencies.

At 304, the microwave frequency is set at its first value, within the range of microwave frequencies. Optionally, the set of different microwave frequencies that will be used is decided in advance, for example the frequencies are evenly distributed over the range. Or, if the locations of the resonance frequencies are approximately known already, because the magnetometer is tracking a magnetic field that is slowly changing over time in magnitude and direction, then microwave frequencies are optionally chosen that are clustered within a resonance width of the expected values of the resonance frequencies. Alternatively, the choice of which frequencies to use is changed adaptively, during the course of acquiring the spectrum. For example, initially a set of frequencies is used that are coarsely distributed over the range, and when it is known approximately where the resonance frequencies are, further frequencies are used that are within about a resonance width of the approximate resonant frequencies, to zero in more precisely on the resonance frequencies. Such a procedure may be more efficient than using frequencies that are evenly distributed over the range, in a case where the Zeeman splitting is expected to be much greater than the resonance width, since little information is to be gained by using microwave frequencies that are far outside the resonance width of any resonance frequency. But in the case where the magnetic field is expected to have a magnitude approximately equal to the magnitude of the Earth's magnetic field, and the resonance width is 800 kHz, then the expected Zeeman splitting is comparable to the resonance width, and in that case the microwave frequencies are optionally chosen in advance, for example uniformly distributed within the range. If the microwave frequencies are chosen in advance, then they are optionally used in order, for example going from the lowest frequency in the range to the highest frequency, or vice versa. Alternatively, the frequencies are used out of order, jumping around within the range, according to some pattern, or randomly. Such a procedure has the potential advantage that it may cause fewer errors in the field measurement, resulting from changes in orientation of the magnetometer over the course of measuring the spectrum, than using the different frequencies in order.

At 306, the diamond sample is exposed to the microwave field of resonator 216, at the oscillator frequency set at 304, while continuing to illuminate the sample with excitation light from light source 202. At 308, the fluorescent emission generated by the sample is detected by light detector 212, and the value of its intensity is measured and recorded by controller 218. At 310, a decision is made as to whether all microwave frequencies that are going to be used have been used already, either because all of the frequencies have been used on a list of frequencies that has been set in advance, or, if the set of frequencies is being adjusted adaptively, then because the results of the measurements show that there is now enough information about the spectrum to make a good determination of the magnetic field. If the decision is made that more microwave frequencies should be used, then at 312 the next microwave frequency is chosen, and control returns to 306, where the sample is exposed to a microwave field at the new frequency. The loop continues until it is decided, at 310, that all the frequencies have been used, that are going to be used.

At 314, the recorded spectrum, which is the intensity of the fluorescent emission as a function of microwave frequency, is used by controller 218 to calculate a variance property of the spectrum. At 316, the variance property of the spectrum is used by controller 218 to calculate the magnitude of the magnetic field. It should be understood that this calculating function of controller 218 is optionally implemented by one or more physically separate hardware elements from the recording function of controller 218 at 308, and from any other functions performed by controller 218, such as controlling the currents in coils 220, but "controller 218" refers collectively to whatever hardware is implementing all functions, whether or not they are physically separate. Three different exemplary methods of finding a variance property of the spectrum, and using the variance property to find the magnitude of the magnetic field, are described below: 1) Finding the variance of the measured spectrum, and using a model spectrum to find the variance of the resonance frequencies from the variance of the measured spectrum, and then finding the magnitude of the magnetic field from the variance of the resonance frequencies; 2) Using curve fitting to find the resonance frequencies from the spectrum, calculating the variance of the resonance frequencies, and using the variance of the resonance frequencies to find the magnitude of the magnetic field; and 3) Finding the variance of the measured spectrum, and using a calibration curve to find the magnitude of the magnetic field directly from the variance of the measured spectrum.

Calculation of the Magnitude of the Magnetic Field from the Spectrum

As derived above, the variance of all 24 resonance frequencies is approximately given by $$V \approx \frac{\gamma^2 B^2}{3} + \frac{E^2}{3} + \frac{2A_\|^2}{3}$$

Alternatively, only the part of the variance due to the magnetic field B and the diamond strain E is found, for example by only finding the variance of the 8 resonance frequencies with k=0, and in this case the variance is given approximately by the equation above but without the $A_\|$ term. At 316, the magnitude of the magnetic field B, which is equal to $(B_x^2+B_y^2+B_z^2)^{1/2}$, is optionally found from the variance V of the resonance frequencies, either the variance of all 24 resonance frequencies, or only the variance of the 8 resonance frequencies at a given value of k, for example k=0. The magnetic field magnitude B is optionally found from $$B = \frac{1}{\gamma}\sqrt{3V - E^2 - 2A_\|^2}$$

if V is the variance of all 24 resonance frequencies, and by $$B = \frac{1}{\gamma}\sqrt{3V - E^2}$$

if V is only the variance of the 8 resonance frequencies at a given k, for example k=0. The strain coefficient E, with units of frequency, is expected to be different for different diamond samples, but to remain the same for a given diamond sample once it has been manufactured. It is typically of order 1 MHz. Optionally, E is found for a given quantum compass by calibrating it with a uniform magnetic field of known magnitude B before it is used for the first time, and once it has been calibrated, and E has been found, the quantum compass optionally is not calibrated again.

Alternatively, instead of using one of the above equations to find the magnitude B of the magnetic field, a different potentially more accurate equation is used, for example $$B = \frac{1}{\gamma}\sqrt{3V - E^2 - 2A_\|^2} + \frac{93nT \cdot A_\|}{\sqrt{3V - E^2 - 2A_\|^2}}$$

where V is the variance of all 24 resonance frequencies. This equation, as noted above, provides a good fit to B as a function of V, when V is calculated numerically by finding the eigenvalues of the full 9×9 Hamiltonian matrix for the four directions i of the NV centers, for B in the range between 0.1 and 0.7 gauss expected for the Earth's magnetic field, and for $A_\|$=2.1 MHz, the hyperfine splitting coefficient for NV centers in diamond. This expression for B as a function of V is expected to be accurate to within about 10 nT, which is believed to be adequate precision for magnetic navigation using the small local variations in the magnitude of the Earth's magnetic field.

Method 1: Using a Model Spectrum to Find the Variance of the Resonance Frequencies from the Variance of the Measured Spectrum Optionally, the total variance of the spectrum $V_{spect}$ is first found from the measured spectrum, and the variance V of the Zeeman split resonance frequencies is then found from $V_{spect}$. The spectrum F(f) may be modeled as having the form $$F(f) = \sum_{i=1}^{4} \sum_{k=-1}^{+1} A_i \{\exp[-(f - D_0 - \Delta f_{i,k})^2/\sigma_i^2] + \exp[-(f - D_0 + \Delta f_{i,k})^2/\sigma_i^2]\}$$

For convenience in describing the spectrum, F(f) is the inverted spectrum, which has a value close to zero far from the resonance frequencies, where the fluorescent emission is hardly reduced by the microwave field from its maximum value, and has higher values close to the resonance frequencies, where the microwave field causes transitions in the spin state from $m_s$=0 to $m_s$=+1 or −1, and the fluorescent emission is lower. Here, $D_0$ is the temperature dependent zero-field splitting frequency, 2.87 GHz at room temperature. The half-width at which a peak falls to 1/e of its maximum value is $\sigma_i$, which is related to the full width at half maximum, $W_i$, by $\sigma_i = W_i/2\sqrt{\ln 2}$.

The sum is over the four tetrahedral axes of the diamond sample, i=1, 2, 3, and 4, and the three possible values of the nitrogen nuclear spin, k=−1, 0, and +1. For each i and k, it is assumed that there is a Zeeman split resonance frequency at $D_0+\Delta f_{i,k}$ and at $D_0-\Delta f_{i,k}$. This symmetry of the Zeeman split resonance frequencies about $D_0$ is true to very good approximation if $\gamma B$, E, and $A_\|$ are much smaller than $D_0$, which they are, by a factor of at least $10^3$, for NV centers in diamond and for magnetic fields B of a few tenths of a gauss.

The height of each resonance peak is $A_i$, where all of the $A_i$ values are expected to have the same value A if the magnetic field of the microwave field is aligned along the x, y, or z axis, at the same angle to each of the tetrahedral axes. The full width at half maximum of each resonance is $W_i$, which is expected to have the same value W for all of the resonances, if the magnetic field of the microwave field is aligned along the x, y, or z axis, at the same angle to each of the tetrahedral axes. $A_i$ and $W_i$ are not labeled with the nuclear spin index k, because they are not expected to depend on k. In the above equation for F(f), the resonances are assumed to be Gaussian in shape. The shape of the resonances depends on the causes that dominate the resonance width, and may sometimes be partially Lorentzian, or a Voigt function, or another shape. For example, if the measurement time for a given frequency is not more than a few times greater than the inverse of the Rabi frequency, this may affect the shape of the resonance. The effect of the illuminating light pumping the NV center down towards the $m_s$=0 state while the microwave field is acting on the NV center may also affect the shape of the resonance. It should be understood that if the resonances are expected to be a different shape, then a different appropriate form may be used for F(f). The resonance width W and the amplitude A are expected to have values, given below in the Examples section, that depend on the intrinsic resonance width $\Gamma_2$ of the diamond sample, as modified by the optical pumping rate $\Gamma_p$ due to the illuminating light, and by the Rabi frequency $\Omega_R$ of the microwave field.

Still assuming that $\gamma B$, E, and $A_\parallel$ are much smaller than $D_0$, so that F(f) is very small except in a relatively narrow region around $D_0$, the variance $V_{model}$ of the model spectrum F(f) may be defined as:

$$V_{model} = \frac{\int_0^\infty df(f-\bar{f})^2 F(f)}{\int_0^\infty df F(f)} \text{ where } \bar{f} = \frac{\int_0^\infty df f F(f)}{\int_0^\infty df F(f)}$$

is the mean value off for F(f). When F(f) has the form given above, the mean value is $D_0$ and, if all the $A_i$ coefficients have the same value A, and all the $\sigma_i$, terms have the same value $\sigma$, then the variance $V_{model}$ would be $$V_{model} = \sigma^2 + \frac{1}{12} \sum_{i=1}^{4} \sum_{k=-1}^{+1} (\Delta f_{i,k})^2$$

It should be noted that the second term on the right hand side is the variance V of all twenty-four resonance frequencies, which, as noted above, can be used to find the magnitude of the magnetic field B. In order to find V, the spectrum is measured at many discrete frequencies $f_n$, where n=1, 2, ... N. Optionally the frequencies $f_n$ are chosen so that they cover the range of frequencies around $D_0$, where the spectrum is expected not to be negligibly small based the model spectrum F(f), for example between $D_0-\gamma B-E-W-A_\parallel$ and $D_0+\gamma B+E+W+A_\parallel$ and not too much beyond that range. Optionally, the frequencies $f_n$ are also spaced closely enough together within that range, that the spectrum is not expected to change too much from one $f_n$ to the next, based on the model spectrum F(f), for example they are spaced apart at a distance of W/10 or W/20 or W/50 or W/100. The height of the spectrum measured at each $f_n$ is called $F_n$. Then the values $F_n$ are fitted to a function or distribution G(f) defined at all frequencies f using any known interpolation method. For example, in order of increasing accuracy, we may use $$G(f) = \frac{1}{2} \sum_{n=2}^{n=N-1} \delta(f-f_n)(f_{n+1}-f_{n-1})F_n +$$

$$\frac{1}{2}\delta(f-f_1)(f_2-f_1)F_1 + \frac{1}{2}\delta(f-f_N)(f_N-f_{N-1})F_N \text{ Or}$$

$$G(f) = F_n \text{ for } \frac{1}{2}(f_n + f_{n-1}) < f \leq \frac{1}{2}(f_n + f_{n+1})$$

$$G(f) = 0 \text{ for } f \leq f_1 \text{ or } f > f_N$$

Or $G(f_n)=F_n$ with $F_1=F_N=0$, and G(f)=0 for f≤$f_1$ or f>$f_N$, and using linear interpolation for intermediate values of f between $f_1$ and $f_N$, or using quadratic interpolation for intermediate values of f, or using cubic spline interpolation for intermediate values of f Then the variance $V_{spect}$ of the measured spectrum is defined as $$V_{spect} = \frac{\int_0^\infty df(f-\bar{f})^2 G(f)}{\int_0^\infty df G(f)} \text{ where } \bar{f} = \frac{\int_0^\infty df f G(f)}{\int_0^\infty df G(f)}$$

It may be noted that, in the special case where the first expression for G(f) is used, and $f_2, f_3, \ldots f_{N-1}$ are spaced at equal intervals between $f_1$ and $f_N$, and $F_1$ and $F_N$ are negligibly small, then the variance $V_{spect}$ of the measured spectrum has the particularly simple form $$V_{spect} = \frac{\sum_1^N F_n(f_n-\bar{f})^2}{\sum_1^N F_n} \text{ where } \bar{f} = \frac{\sum_1^N F_n f_n}{\sum_1^N F_n}$$

If the sampled frequencies $f_n$ adequately cover the range where the model spectrum F(f) is not negligible, and if the model spectrum is a good approximation to the actual spectrum, then the measured variance $V_{spect}$ of the spectrum should be well approximated by the variance $V_{model}$ of the model spectrum. Then we expect $$V_{spect} \approx \sigma^2 + \frac{1}{12} \sum_{i=1}^{4} \sum_{k=-1}^{+1} (\Delta f_{i,k})^2 = \sigma^2 + V$$

Then the variance V of all twenty-four resonance frequencies may be found from $$V = V_{spect} - \sigma^2$$

And this V may be used to find the magnitude of the magnetic field B, using any of the equations for B in terms of V given above, for example $$B = \frac{1}{\gamma}\sqrt{3V - B^2 - 2A_\parallel^2} \text{ or}$$

$$B = \frac{1}{\gamma}\sqrt{3V - E^2 - 2A_\parallel^2} + \frac{93 nT \cdot A_\parallel}{\sqrt{3V - E^2 - 2A_\parallel^2}}$$

This result for V in terms of $V_{spect}$ may not be exactly true if the resonance peaks are a shape other than Gaussian, but the inventor has found that in practice it is an extremely good approximation.

It should be noted that in the course of finding $V_{spect}$, the mean frequency of the spectrum is found, and this is very nearly equal to the zero-field splitting resonance frequency $D_0$ if $\gamma B$ and $A_\parallel$ are much less than $D_0$. Since $D_0$ has a known dependence on temperature, decreasing by about 74 kHz for each increase in temperature of 1 degree Celsius, the temperature of the diamond crystal can be found from the mean frequency $\bar{f}$, in principle to high precision, for example to within a few hundredths of a degree.

Method 2: Using Curve Fitting to Find the Resonance Frequencies

Alternatively, instead of finding the variance V of the Zeeman split resonance frequencies from the variance of the measured spectrum $V_{spect}$, the variance of the Zeeman split resonance frequencies is found from the spectrum by using a curve fitting algorithm to fit the spectrum to an expected form with the resonance frequencies as free parameters. FIG. 1.4b of Pham (PhD thesis, cited above) shows a plot of an absorption spectrum of an ensemble of NV centers oriented along all four tetrahedral axes, with a relatively large magnetic field, 70 gauss, for which the resonance frequencies for the different axes are well separated compared to the resonance width. For such large fields, the absorption spectrum shows 8 distinct dips, each dip corresponding to a different Zeeman split resonance frequency.

For each of the four tetrahedral axes, there is a pair of Zeeman split resonance frequencies arranged symmetrically around the zero-field splitting resonance frequency, making a total of 8 resonances frequencies. The hyperfine splitting is not resolved on this plot.

When an NV center magnetometer is used to measure a much weaker field, for example the Earth's magnetic field which is a few tenths of a gauss, then the dips in the absorption spectrum corresponding to different resonance frequencies may overlap considerably, and there may not be twenty-four separate dips immediately apparent in a plot of the spectrum. Nevertheless, a curvefitting algorithm can still be used to find the twenty-four resonance frequencies from the spectrum, or to find the eight resonance frequencies at a given value of k.

Figure 4:
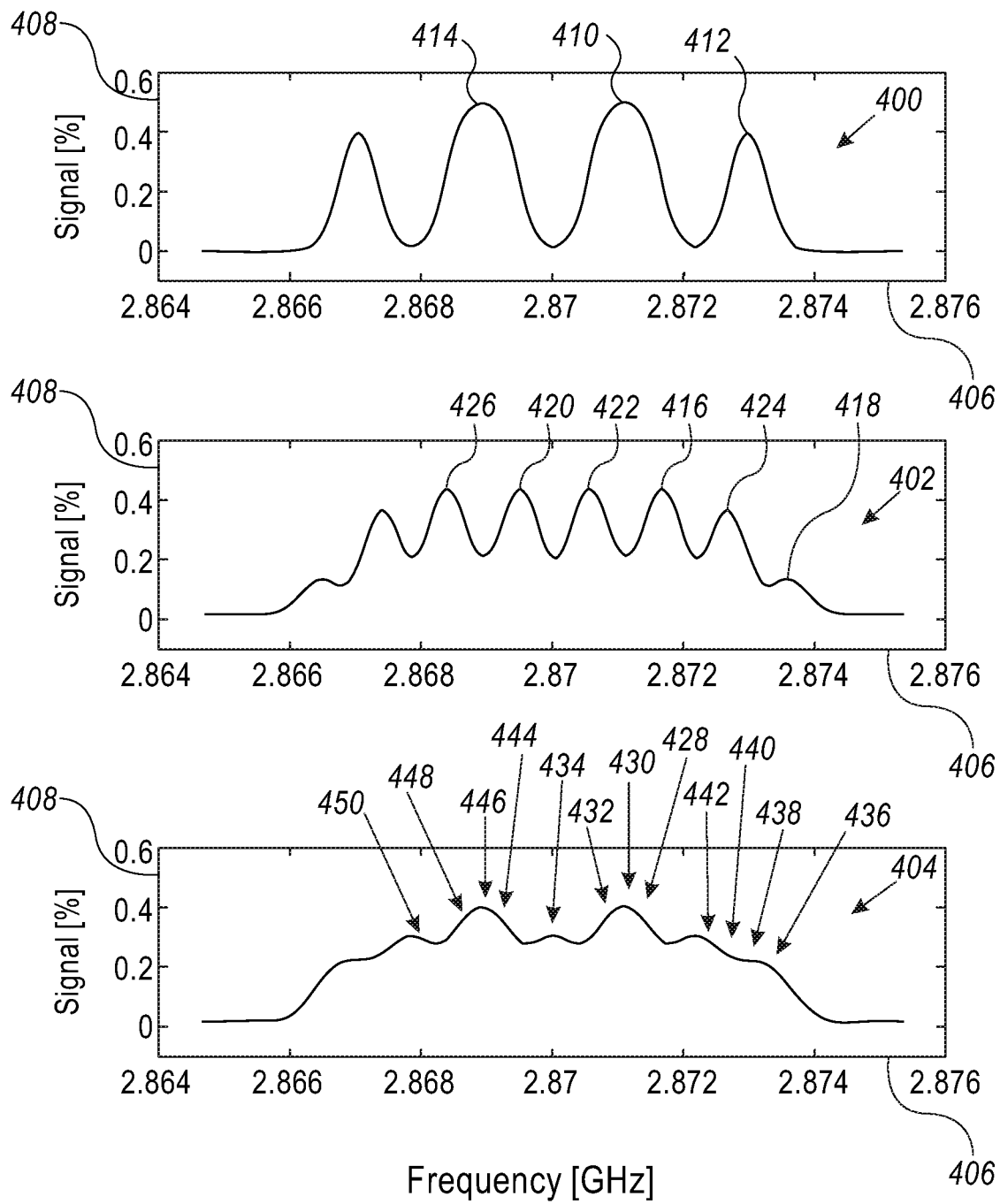
FIG. 4 is a plot of an inverted exemplary absorption spectrum of the NV center ensemble seen in a simulation of a magnetometer similar to the quantum compass of FIG. 2, for a magnetic field similar in magnitude to the Earth's magnetic field, where the different Zeeman split resonance peaks have considerable overlap.

FIG. 4 schematically illustrates plots 400, 402, and 404 of three such cases, each with a vertical axis 406 representing the fluorescent emission of the ensemble of NV centers, and a horizontal axis 408 representing the microwave frequency. The three plots are based on calculations of what the absorption spectrum is expected to look like, for magnetic fields oriented in different directions with respect to the diamond crystal axes, all with the same magnetic field magnitude, 0.5 gauss, and assuming a resonance width of W=800 kHz for all resonance frequencies. In FIG. 4, for convenience in describing the spectrum, the spectrum has been inverted, with a value of zero at frequencies far from the resonance frequencies, where the microwaves are not raising the state of the NV centers from $m_s=0$ to $m_s=\pm 1$, so the fluorescent emission is at its maximum value. Within the resonance widths of the resonance frequencies, where the fluorescent emission is reduced, the inverted spectrum is shown at a higher value.

Plot 400 is for the case where the magnetic field is oriented in the [1, 0, 0] direction, along the x-axis. In this case, the magnetic field is oriented at the same angle to all four directions of the NV centers, so the resonance frequencies are the same for all four directions i. There are two k=0 modes at frequency shifts (from the zero-field splitting resonance frequency $D_0$) of approximately $\pm \gamma B/\sqrt{3} \approx \pm 0.58\gamma B$, corresponding to the two solutions $X_{1,k=0}$ and $X_{2,k=0}$ of the characteristic polynomial for the 9×9 Hamiltonian matrix. For each of these resonance frequencies, there is a k=+1 resonance frequency at a frequency shift of approximately $\pm 0.58\gamma B+A_\parallel$, and a k=−1 resonance frequency at a frequency shift of approximately $\pm 0.58\gamma B-A_\parallel$. The spectrum is to a very good approximation symmetric around the zero-field splitting resonance frequency at 2.870 GHz. The k=0 resonance frequency at a frequency shift of $\pm 0.58\gamma B$ is associated with peak 410 in plot 400, and there is a peak the same distance on the other side of the zero-field splitting resonance frequency, not labeled in plot 400, associated with the k=0 resonance frequency at a frequency shift of $-0.58\gamma B$. The k=+1 resonance frequency corresponding to the k=0 resonance frequency at a frequency shift of $+0.58\gamma B$ is associated with peak 412 in plot 400, and the k=−1 resonance frequency corresponding to that k=0 resonance frequency is associated with peak 414 in plot 400. There are two peaks the same distance on the other side of the zero-field splitting resonance frequency, not labeled in plot 400, associated with the k=±1 resonance frequencies corresponding to the other k=0 resonance frequency, at a frequency shift of $-0.58\gamma B$. So for this case, there are 6 different resonance frequencies. However, because peak 414 largely overlaps with the unlabeled peak that is the on the other side of the zero-field resonance frequency from peak 410, these two peaks are not visible as distinct peaks in plot 400, but resemble a single peak with a broader width than peak 412, and with a flattened top. The same is true of peak 410, and the unlabeled peak that is on the opposite side of the zero-field resonance frequency from peak 414.

Plot 402 is for the case where the magnetic field is oriented in the [1, 1, 1] direction, along one of the directions of the NV centers, the i=1 direction. For this case, the resonance frequencies of the i=1 NV centers are different than the resonance frequencies for the i=2, 3 and 4 NV centers, but the resonance frequencies of the i=2, 3, and 4 NV centers are all the same, because they are all oriented at the same angle to the magnetic field. The k=0 modes for the i=1 NV centers have a frequency shift from the zero-field splitting resonance frequency of approximately $\pm \gamma B$, and the resonance frequency with a frequency shift of $+\gamma B$ is associated with peak 416 in plot 402. The corresponding k=+1 and k=−1 resonance frequencies are associated respectively with peaks 418 and 420 in plot 402. The k=0 resonance frequencies for the i=2, 3 and 4 NV centers have a frequency shift of approximately $\pm \gamma B/3$, and the resonance frequency with a frequency shift of $+\gamma B/3$ is associated with peak 422 in plot 402, while the corresponding k=+1 and k=−1 resonance frequencies are associated respectively with peaks 424 and 426 in plot 402. It should be noted that the resonance frequency at frequency shift of $+\gamma B$ is very close to the resonance frequency with a frequency shift of approximately $-\gamma B/3+A_\parallel$, and the associated peaks appear to overlap completely, as peak 416, in plot 402. Similarly, the resonance frequency with a frequency shift of $+\gamma B/3$ is very close to the resonance frequency with a frequency shift of approximately $-\gamma B+A_\parallel$, and the associated peaks appear to overlap completely as peak 422, and similarly peaks 420 and 426 are each associated with two very close resonance frequencies. So, although there are 12 resonance frequencies in the spectrum shown in plot 402, only 8 peaks are visible, and the height of each peak depends on how many overlapping resonance frequencies it represents. For example, peaks 426, 420, 422 and 416 are each associated with resonance frequencies for all four values of i, so they are the highest, while peak 424 is associated with a resonance frequency for i=2, 3 and 4, so it is somewhat lower, and peak 418 is associated only with a resonance frequency for i=1, and it is even lower.

In plot 404, the magnetic field is oriented in the [1,0.3, −0.6] direction. In this case, all four directions i of the NV centers are at different angles to the magnetic field, so they all have different resonance frequencies, although in some cases the resonance frequencies are close enough together that the resonance peaks overlap and distinct peaks are not visible. The i=4 direction, [1, 1,−1], is closest to the direction of the magnetic field, and for i=4 the k=0 resonance frequency has the largest magnitude of frequency shift, approximately $0.90\gamma B$, location 428 in plot 404. For the i=2 direction, [1, −1, −1], the k=0 resonance frequency has a frequency shift of approximately $0.62\gamma B$, location 430 in plot 404. For the i=1 direction, [1, 1, 1], the k=0 resonance frequency has a frequency shift of approximately $0.33\gamma B$, location 432 in plot 404. For the i=3 direction, [1, −1, 1], the k=0 resonance frequency has a frequency shift of approximately $0.05\gamma B$, location 434 in plot 404. The corresponding k=+1 resonance frequencies are at locations 436, 438, 440 and 442 respectively, and the corresponding k=−1 resonance frequencies are at locations 444, 446, 448 and 450 respectively. For each of these resonance frequencies, there is another resonance frequency, not labeled in plot 404, located at the same distance to the other side of the zero-field resonance frequency, corresponding to k=0 resonance frequencies with negative frequency shifts. The inverted spectrum F(f) is expected to have the form given above:

$$F(f) = \sum_{i=1}^{4} \sum_{k=-1}^{+1} A_i \{\exp[-(f - D_0 - \Delta f_{i,k})^2 / \sigma_i^2] + \exp[-(f - D_0 + \Delta f_{i,k})^2 / \sigma_i^2]\}$$

The zero-field splitting frequency $D_0$, which is 2.87 GHz in FIG. 4, is optionally treated as a free parameter because it depends on temperature. The zero-field splitting frequency changes with temperature at 74 kHz per degree K.

If both the $A_i$ values and the $W_i$ values are assumed to be known well enough, then optionally the measured spectrum is fitted to the above expression for F(f) using thirteen free parameters, $D_0$, and the twelve frequency shifts $\Delta f_{i,k}$ for the Zeeman split resonance frequencies, for i=1, 2, 3 and 4, and k=−1, 0, and +1. Alternatively, the $A_i$ values and/or the $W_i$ values, or a single value for $A_i$ and/or for $W_i$ that applies to all the tetrahedral crystal axes, are also used as free parameters in the curve fitting, which is potentially advantageous if they are not accurately known. When the best fit values of $D_0$, and the twelve frequency shifts $\Delta f_{i,k}$ are found, then the variance V of the 24 resonance frequencies is optionally found from:

$$V = \frac{1}{12} \sum_{i=1}^{4} \sum_{k=-1}^{+1} (\Delta f_{i,k})^2$$

Alternatively, instead of using all twelve frequency shifts $\Delta f_{i,k}$ as free parameters, only the four frequency shifts with k=0 are used as free parameters, optionally together with $D_0$, $A_i$ and/or $W_i$, and the frequency shifts with k=±1 are expressed in terms of the k=0 frequency shifts by $$\Delta f_{i,k} = \Delta f_{i,0} + kA_\parallel$$

Optionally in this case, if $A_\parallel$ is not known very precisely, it is also used as a free parameter in the curve fitting. Using only the four k=0 frequency shifts as free parameters in the curve fitting, instead of all 12 frequency shifts, has the potential advantage that the curve fitting may be more accurate, for example less affected by noise in the data, if fewer free parameters are used. But using all twelve frequency shifts as free parameters has the potential advantage that it may be more accurate because $\Delta f_{i,k} \approx \Delta f_{i,0} + kA_\parallel$ may not be a very good approximation to the true frequency shifts for k=±1, which are the solutions to the characteristic polynomial for the 9×9 Hamiltonian matrix $H_i$. Numerical solutions suggest that $\Delta f_{i,k} \approx \Delta f_{i,0} + kA_\parallel$ is only accurate to within about one percent, and using this approximation when doing the curve fitting may result in errors of about one percent in the variance V of the frequency shifts, and consequently in errors of about one percent in the magnitude B of the magnetic field. A precision of only one percent in B may not be adequate for magnetic navigation using the natural variations in the Earth's magnetic field, which are typically about one part in $10^3$, a few tens of nT, and to obtain a precision of about 10 nT it may be necessary to use all twelve frequency shifts as free parameters in the curve-fitting.

Optionally, particularly if only the k=0 frequency shifts are used as free parameters, then the variance is defined as the variance of only the eight k=0 resonance frequencies, which may be found from $$V = \frac{1}{4} \sum_{i=1}^{4} (\Delta f_{i,0})^2$$

and the magnitude of the magnetic field is found from $$B = \frac{1}{\gamma} \sqrt{3V - E^2}$$

as noted above. But this may not give adequate precision for magnetic navigation using natural variations in the Earth's magnetic field.

The curve fitting of the measured inverted spectrum to the above expression for F(f) is done, for example, using a nonlinear least squares fit, for example using a Levenberg-Marquardt algorithm, or any other known algorithm for nonlinear curve fitting. The nonlinear least squares fit is done, for example, using a Least Absolute Residual method. It is assumed that the number of frequencies at which the spectrum is measured is greater, optionally at least several times greater, than the number of free parameters used. Alternatively, the number of frequencies at which the spectrum is measured is equal to the number of free parameters used, and the values of the free parameters are found directly by simultaneously solving a number of equations equal to the number of free parameters. This may work better if the frequencies used are all within the resonance peaks, and are broadly enough distributed over the different resonance peaks, and are not distributed nearly symmetrically around the zero-field splitting resonance frequency. Using a number of frequencies that is much greater than the number of free parameters has the potential advantage of giving more accurate results than using a number of frequencies that is equal to the number of free parameters, because the curve fitting algorithm may effectively average out noise in the spectrum.

It should be noted that if the curve fitting uses only $D_0$, and the four k=0 frequency shifts as free parameters, rather than all 12 frequency shifts, and treats $A_\parallel$ as a known and fixed quantity, then it may be sufficient to include only a frequency range around the zero-field splitting resonance frequency that includes the k=0 resonance frequencies and their resonance widths, even without including the outer parts of the frequency range that include only k=±1 resonances. That outer part of the spectrum may be largely determined by the inner part of the spectrum that includes the k=0 resonances, and may not provide much additional information.

But if V and B are found from the variance $V_{spect}$ of the spectrum, then it is potentially advantageous if $V_{spect}$ is found using the entire range of frequencies for which the spectrum is significantly above zero, including the k=±1 resonances, for example extending from $D_0 - \gamma B_0 - W - A_\parallel$ to $D_0 + \gamma B_0 + W + A_\parallel$ (where $W = 2\sqrt{\ln 2}\sigma$ is the FWHM width of all the peaks), and not limited to the inner part of the spectrum between $D_0 - \gamma B_0 - W$ and $D_0 + \gamma B_0 + W$ where the k=0 resonances are located, which may be sufficient if curve fitting is used, depending on what precision is required for measuring B. It is also potentially advantageous not to spend much time measuring the spectrum at frequencies well outside this range, where the spectrum is expected to be close to zero. Such measurements are not expected to contribute much information on the value of $V_{spect}$. It is also potentially advantageous, if V and B are found from the variance $V_{spect}$ of the spectrum, to measure the spectrum using a set of selected frequencies over this range that are spaced not too far apart, relative to a previously known estimate of the resonance width W. For example the frequencies are spaced no further apart than 0.1 W, or 0.2 W, or 0.3 W, or 0.5 W, or 0.7 W, or W. Using a set of selected frequencies that are spaced sufficiently close together may provide a good approximation to the true shape of the spectrum, and the relevant spacing may be W, or a given fraction of W, because the spectrum is not expected to include any features that are much narrower than W. Using selected frequencies that are much closer together may increase the time required to acquire the spectrum, without greatly improving the accuracy of the spectrum and its variance.

Simulations by the inventor, described below in the "Examples" section, indicate that, for the same noise level and the same number of frequencies used to measure the spectrum, using curve fitting to find the variance of the Zeeman split resonance frequencies tends to give results that are similar in accuracy to finding the variance of the spectrum.

However, using the variance of the spectrum has the potential advantage that it may require much less computation than curve fitting, and may be especially useful if the quantum compass has limited computational capacity. Furthermore, in some embodiments of the invention, as described below, the diamond sample is surrounded by coils which have currents in them that cancel out the self-field produced by currents used to power the device, and the requisite currents in the coils are found in a calibration procedure by using feedback to produce zero field in the diamond sample when the device is well shielded from external magnetic fields. In this case, the feedback loop may be particularly simple to implement by finding a set of currents in the coils that minimizes the variance in the spectrum.

Method 3: Using a Calibration Curve to Find the Magnitude of the Magnetic Field Directly from the Variance of the Measured Spectrum Alternatively, instead of using the variance V of the resonance frequencies to find the magnitude of the magnetic field B, the magnitude of the magnitude of the magnetic field is found directly from the variance of the spectrum $V_{spect}$, by means of a calibration curve. The calibration curve need only be found once, for a given design and set of operating parameters of the quantum compass, including the dimensions and intrinsic resonance width of the diamond sample, the intensity of the illuminating light, the amplitude of the microwave field, and the range of microwave frequencies used to find the spectrum. To find the calibration curve, the quantum compass is shielded from external fields, and exposed to a uniform magnetic field of controllable magnitude, for example produced by Helmholtz coils. For each of a large number of different magnetic field magnitudes, over a range of interest, the absorption spectrum F(f) is measured, and its variance $V_{spect}$ is calculated. If the quantum compass is to be used for outdoor magnetic navigation, for example, the range of interest may be the range of magnitude for the Earth's magnetic field, for example 0.1 to 0.7 G. This procedure gives a calibration curve $V_{spect}$(B). Optionally, the values of magnetic field magnitude that are used are close enough together so that the value of $V_{spect}$ for intermediate values of B can be determined by interpolation, to a desired level of accuracy, for example to the expected level of precision of the quantum compass. For example, 20 or 50 or 100 or 200 or 500 different values of magnitude of magnetic field are used, equally spaced over the range. It is also potentially advantageous for the magnitude of the magnetic field to be controlled to that precision, when finding the calibration curve. Because the variance $V_{spect}$ of the spectrum is expected, on theoretical grounds, to depend only on the magnitude of the magnetic field and not on its direction, it is enough to perform the calibration for different magnitudes of the magnetic field, and the resulting calibration curve is expected to be valid for any direction of the magnetic field.

Once the calibration curve $V_{spect}$(B) has been found, it can be inverted to find the magnitude B as a function of the variance of the spectrum $V_{spect}$. When the quantum compass is used, the absorption spectrum F(f) is measured, and is used to find $V_{spect}$. The inverted calibration curve B($V_{spect}$) is then used to find the magnitude B of the magnetic field from $V_{spect}$.

Using the calibration curve to find B directly from $V_{spect}$, rather than finding B from the variance V of the resonance frequencies, has the potential advantage that it is not necessary to accurately model the absorption spectrum as a function of the magnitude of magnetic field. For example, it is not necessary to know the resonance widths and shapes, either the intrinsic resonance widths of the diamond, or the effect of light intensity and microwave field amplitude on the resonance width and shape, as long as the calibration curve was found with the same light intensity and microwave field amplitude. It is also not necessary to precisely calculate the resonance frequencies for a given magnetic field, from the Hamiltonian, in order to find a expression relating the variance V of the resonance frequencies to the magnitude of the magnetic field. On the other hand, finding V by curve fitting the resonance frequencies, and finding B from V, has the potential advantage that in some circumstances it may give more precise values of B for a given noise level in the light detector.

Optionally, whatever method is used to find the field magnitude B from the spectrum, the error in B due to noise in the spectrum resulting from noise in the light detector, or the error in B due to all causes, is less than 5 nT, or between 5 and 10 nT, or between 10 and 20 nT, or between 20 and 30 nT, or between 30 and 50 nT, or between 50 and 100 nT, or greater than 100 nT. Optionally these values of error in the measured field magnitude are achieved when the light source consumes less than 250 mW of power, and/or when the spectrum acquisition time is less than 200 milliseconds.

Layout of NV Center Magnetometer

Figure 5A:
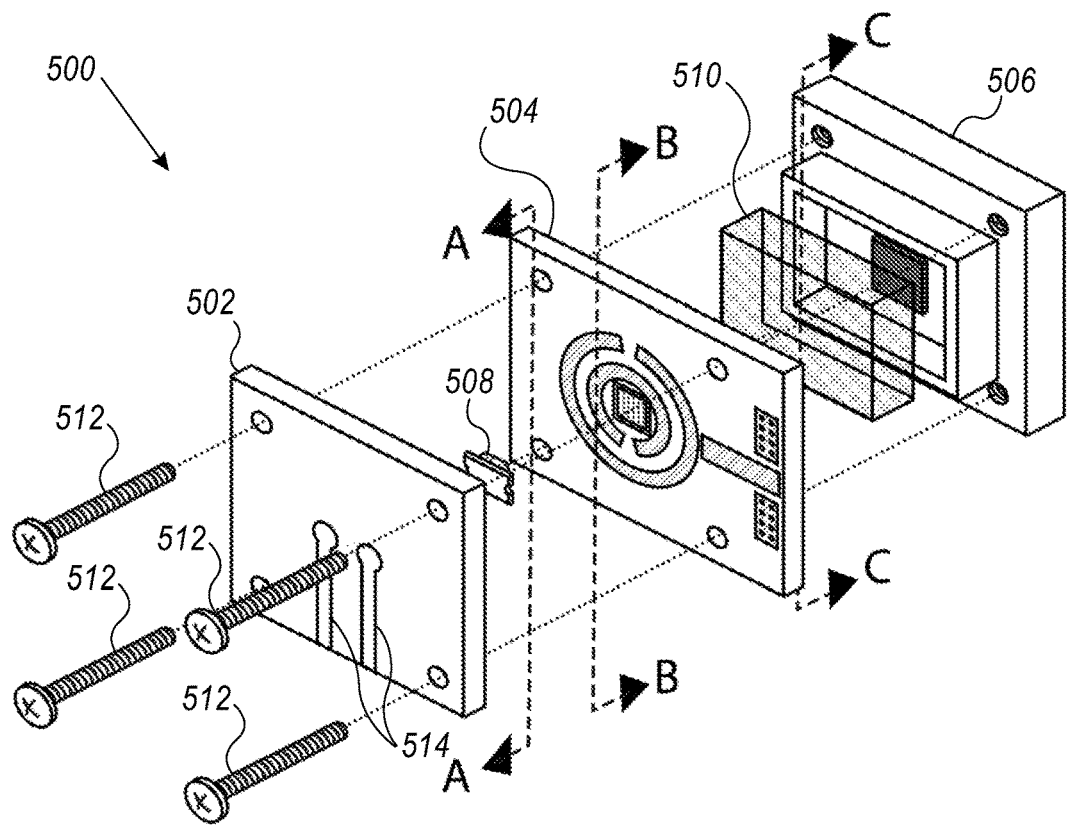
FIG. 5A is a schematic exploded perspective view of an exemplary layout for the parts of the quantum compass of FIG. 2.

FIG. 5A shows a perspective exploded view 500 of an exemplary compact layout for components of the magnetometer shown in FIG. 2. The magnetometer has three boards 502, 504, and 506, on which the components are arranged. An LED 508 is mounted on board 502, facing board 504, which includes a microwave resonator and a diamond sample. A filter 510 is located between board 504 and board 506, and filters out the excitation light of LED 508 from the fluorescent emission light received by a photodiode mounted on board 506. Four bolts 512 hold the three boards and their components together, with board 506 having threaded holes that the bolts screw into. Two electrical leads 514 on the side of board 502 opposite to the LED provide power to the LED.

The layout shown in FIG. 5A, when assembled, has dimensions of 10 mm in the vertical direction, 13 mm in the horizontal direction, and 6 mm along the axis perpendicular to boards 502, 504 and 506. This is small enough to be accommodated in a cell phone, for example.

Figure 5B:
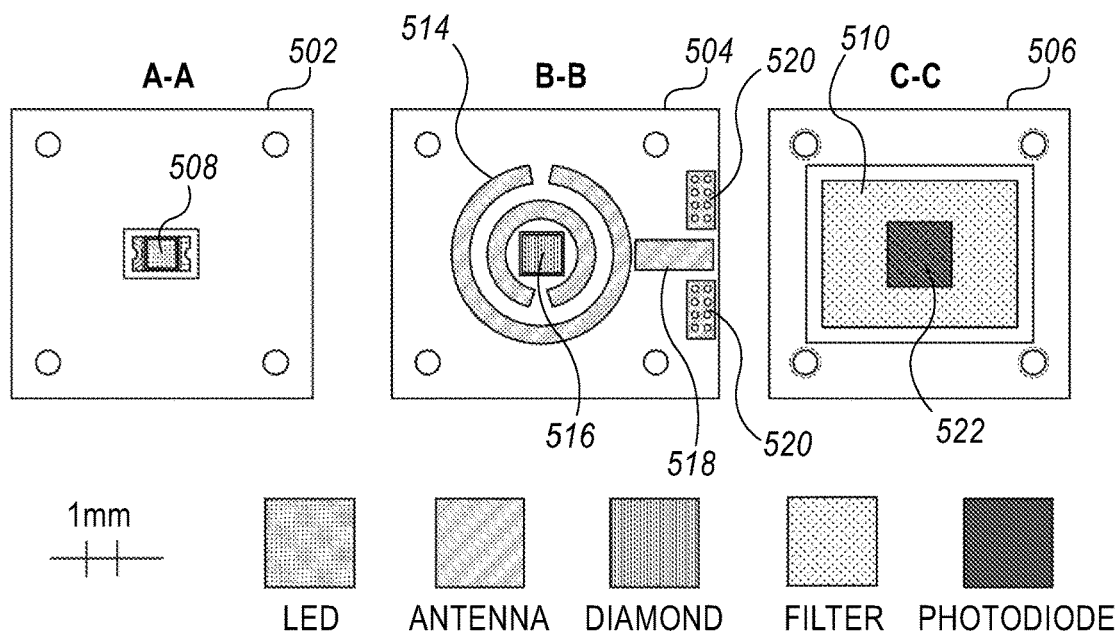
FIG. 5B schematically shows axial views of three boards of the quantum compass shown in FIG. 5A.
Figure 5C:
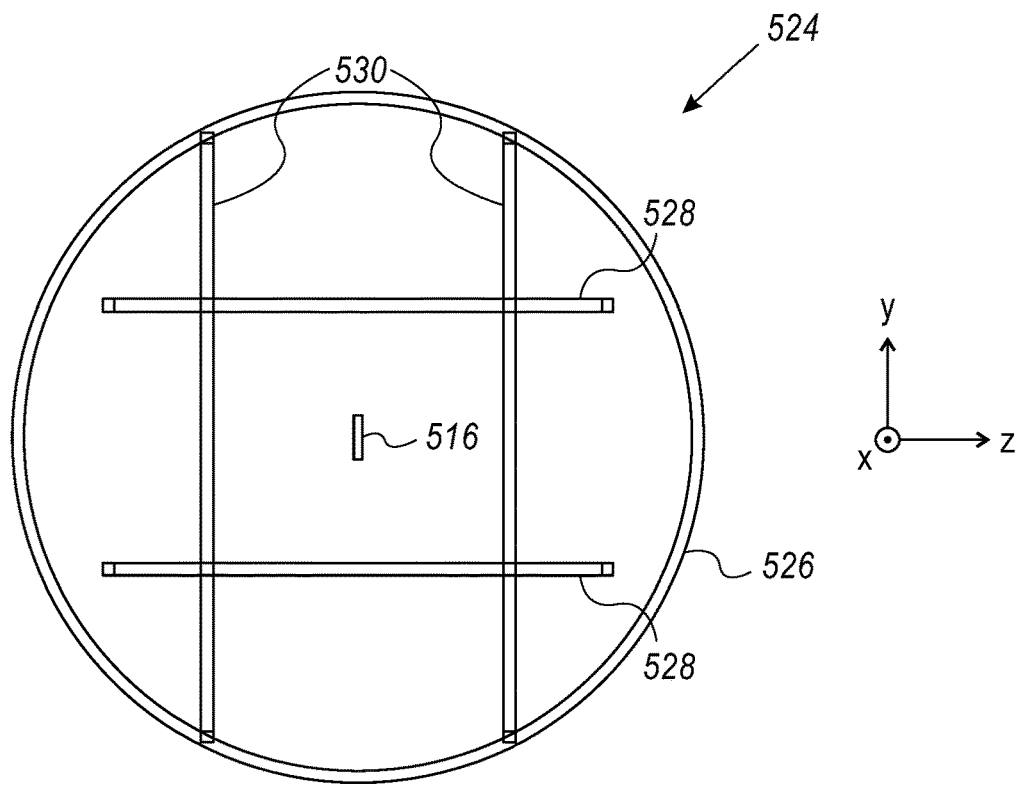
FIG. 5C schematically shows an exemplary set of coils surrounding the diamond sample, optionally included in the quantum compass shown in FIGS. 5A and 5B, that can be used to cancel out self-fields in the diamond sample due to any currents and permanent magnets associated with the quantum compass.

FIG. 5B shows separate views of the three boards shown in FIG. 5A, seen face on. View A-A shows the face of board 502 that faces board 504, with LED 508 mounted in the center, with leads on its left and right sides, connected through the board to electric leads 514 on the other side of the board.

View B-B shows the face of board 504 that faces board 502. A double split ring resonator 514 surrounds a diamond sample 516, which is a square 1.5 mm on a side, and 0.3 mm thick. Optionally, diamond sample 516 is not isotopically purified, and the NV centers are found throughout the volume of diamond sample 516. Alternatively, in some other embodiments, the NV centers are only found in a top layer of the sample that is 30 µm thick, comprising isotopically purified diamond that is grown epitaxially on the surface of a diamond crystal that is not isotopically purified. The double split ring resonator is of a design similar to that described by Bayat et al, cited above. A lead 518 provides a connection to an oscillator that generates electromagnetic power at microwave frequencies, including the range of microwave frequencies over which the spectrum of the NV centers is determined. Leads 520 connect the ground to the back side of board 504 through holes in the board. The oscillator need not be located adjacent to the split ring resonator, but is optionally located elsewhere, for example on the electronics board of a mobile device such as a cell phone, that the magnetometer is included in. A coaxial cable connects center lead 518 to the oscillator.

View C-C shows the face of board 506 that faces board 504. Filter 510 is shown covering a photodiode 522. The output from the photodiode is amplified by an amplifier which can be located on board 506. It is, for example, a simple op-amp circuit with a resistance of 50 ohms, which fixes the ratio of the output current of the photodiode to the output voltage of the detection circuit.

It should be noted that the compact design for the magnetometer shown in FIGS. 5A and 5B places LED 508 directly adjacent to sample 516, and the other side of sample 516 directly adjacent to filter 510, the other side of which is directly adjacent to photodiode 522. A significant fraction of the excitation light emitted by LED 508 reaches sample 516 and is available for exciting fluorescence in NV centers in the sample, without any need for lenses, mirrors, or other optical components. A significant fraction of the fluorescent emission generated in sample 516 reaches photodiode 522, where it is detected, also without any need for lenses, mirrors, or other optical components. Although photodiode 522 is also directly in the line of the excitation light emitted by LED 508, filter 510 is able to effectively filter out almost all of the green excitation light, over 99.7% of it, while transmitting almost all of the much lower power fluorescent emission light from sample 516, so that almost all of the light detected by photodiode 522 is fluorescent emission light.

Optionally, the front surface of LED 508, which emits light, is close to the entire volume of sample 516, for example separated by a distance less than the largest transverse dimension of the light emitting surface of LED 508, and sample 516 extends transversely over all or most of the cross-section of the light emitting surface, so that most of the light emitted by LED 508 reaches sample 516. Optionally, the light detecting surface of photodiode 522, facing sample 516 on the opposite side from LED 508, is close to the entire volume of sample 516, for example separated by a distance less than the largest transverse dimension of photodiode 522, and the light detecting surface of photodiode 522 extends transversely beyond sample 516, so that a large fraction of the fluorescent emission light from sample 516, for example more than 10% or more than 20%, reaches photodiode 522. The relatively low fraction of light from sample 516 that reaches photodiode 522 is due in part to the high index of refraction of diamond. If sample 516 has a coating such as a Bragg reflector on the surface facing LED 508, so that the fluorescent emission light emitted toward LED 208 is reflected back toward photodiode 522, then a larger fraction of the emitted fluorescent light will reach photodiode 522, for example more than 30%.

Cancelation of Self-Fields

If the quantum compass, or a device such as a cell phone that it is incorporated into, produces its own magnetic field in the diamond sample, for example due to currents that flow as part of its functioning, or due to a permanent magnet that is associated with it, for example for mounting on the dashboard of a car, then the magnitude of the field measured by the method described above will be the magnitude of the ambient magnetic field combined with the self-field. As used herein, "ambient field" means the magnetic field that exists independently of the device, for example due to the Earth's magnetic field and any man-made magnetic field sources and magnetic materials external to the device and not moving with the device, while "self-field" means the magnetic field generated in the device itself, and keeping the same magnitude and orientation relative to the device, when the device is moved or rotated. The magnitude of the combined ambient field and self-field may in general differ from the magnitude of the ambient magnetic field by an amount comparable to the magnitude of the self-field. The difference will depend on the relative directions of the ambient field and the self-field, which in turn will depend on the orientation of the quantum compass with respect to the ambient field, and hence on the spatial orientation of the quantum compass, which may not be known. In order to achieve a desired precision in the measurement of the magnitude of the ambient field, for example an error less than 10 nT which may be useful for magnetic navigation, it may be useful to keep the magnitude of the self-field in the diamond sample less than the desired precision in the measurement.

Optionally, the wiring of the circuitry of the quantum compass, and of any device that it is incorporated in, as well as any associated permanent magnets, are carefully designed to keep the self-field in the diamond sample less than a desired precision for measuring the magnitude of the ambient magnetic field, for example, less than 50 nT, or less than 20 nT, or less than 10 nT, or less than 5 nT. For example, wiring is kept relatively far away from the diamond sample, and for each of the current paths, there is a return current path very close to it, or surrounding it. Alternatively or additionally, high permeability magnetic shielding around the current paths reduces the self-field in the diamond sample. Optionally, any high permeability material in the device is sufficiently small, sufficiently far from the diamond sample, sufficiently saturated in normal operation, and of such a shape and orientation, that the high permeability material does not modify the magnitude of the ambient magnetic field in the diamond sample by more than the desired precision for measuring the magnitude of the ambient magnetic field. For a given design of the device and the quantum compass, and a given desired precision, magnetic design software can be used to verify that this condition is satisfied.

Furthermore, any permanent magnets associated with the device are optionally designed to be relatively small, relatively low in field, and located relatively far from the diamond sample. In this case, there may be no need to cancel the self-field in the diamond sample.

Additionally or alternatively, the diamond sample is surrounded by a set of coils carrying controllable currents, which can be used to cancel or very nearly cancel any self-field in the diamond sample, bringing any remaining self-field down below the desired precision for measuring the magnitude of the ambient magnetic field. For example there are three sets of Helmholtz coils, or three sets of Maxwell coils, each set producing a very uniform field oriented along one of the principle axes of the diamond sample, i.e. along the x, y, and z axes. Then a current can be selected in each of the three sets of coils that will, on average over the volume of the diamond sample, cancel out the self-field. Even if the self-field is not completely uniform in the diamond sample, if it is sufficiently uniform then it is expected that any residual self field in the diamond sample, that is not canceled by the coils, will not adversely affect the precision of the measurement of the ambient field by the quantum compass. Optionally, the circuitry and any permanent magnets associated with the device are designed to produce a self-field that is sufficiently uniform that the desired precision can be achieved in this way. Alternatively, if the self-field is too non-uniform, then additional coils are optionally used, to cancel out gradients and possibly higher order derivatives of the self-field, so that the desired precision can be achieved.

An exemplary set of coils that may be suitable for cancelling the self-field in the diamond sample is shown in FIG. 5C. FIG. 5C shows a view 524 of diamond sample 516, located at the center of three orthogonal pairs of Helmholtz coils 526, 528, and 530, which produce a very uniform field respectively in the x, y, and z directions in the diamond sample, where the x, y and z axes are the principle axes of the diamond sample. For clarity, the other elements of the quantum compass, shown in FIGS. 5A and 5B, are not shown in FIG. 5C. Here the z-axis is the axis along the direction from plate 502 to plate 504 to plate 506 in FIG. 5A, the x-axis is the horizontal axis of diamond sample 516 in FIG. 5B, and the y-axis is the vertical axis of diamond sample 516 in FIG. 5B, and it is assumed that these correspond to the x, y and z principle axes of the diamond crystal. View 524 is from the direction of the x-axis, with the y-axis vertical and the z-axis horizontal. From this perspective, the two coils of pair 526 completely overlap, so only one coil of pair 526 is visible in FIG. 5C. The current in each pair of coils can be controlled independently by controller 218 in FIG. 2.

Optionally, the Helmholtz coils are large enough in inner diameter so that they can fit around the structural parts of the quantum compass shown in FIG. 5A, and small enough in outer diameter that they can fit within a convenient housing for the whole quantum compass, for example within the confines of a cell phone. Optionally, as an additional constraint, the Helmholtz coils produce a sufficiently uniform magnetic field throughout the diamond sample so that the desired precision of measuring the magnitude of the ambient magnetic field can be achieved. Depending on the dimensions of the diamond sample and on the desired dimensions of the quantum compass, these constraints might be better satisfied with sets of Maxwell coils than with pairs of Helmholtz coils. Optionally, the three pairs of coils are not all the same size, but are slightly different in size so that they can nest one set within the other. Optionally the coils have great enough cross-section so that, at the currents required in order to cancel the self-field, the ohmic power consumed by the coils is relatively small compared to the total power consumed by the quantum compass.

In an exemplary embodiment of the invention, each pair of coils comprises two identical circular Helmholtz coils, and with all three pairs of coils centered at the center of the diamond sample. To allow the different pairs of coils to nest together, the pairs are not all the same size. Coils 528 have average radius a=10 mm, coils 530 have average radius a=12 mm, and coils 526 have average radius a=13.5 mm. The separation D of the centers of the two coils in each pair is equal to the average radius a of that pair. Each coil consists of 20 turns of copper wire of diameter 0.08 mm, 0.1 mm including the insulation, arranged for example in four layers of 5 turns each, so that the cross-section of each coil is 0.4 mm by 0.5 mm. The configuration shown in FIG. 5A, when assembled, will fit within all of Helmholtz coils 526, 528 and 530, when they have these dimensions. To produce a field of 0.5 gauss at the diamond sample, in the y direction, a current of 27 mA is needed in coils 528. To produce a field of 0.5 gauss at the diamond sample, in the z direction, a current of 32 mA is needed in coils 530. To produce a field of 0.5 gauss in the x direction, a current of 36 mA is needed in coils 526. The resistance of coils 528, with the two coils in series, is 9 ohms. For coils 530, the resistance of the two coils in series is 10.5 ohms, and for coils 526, the resistance of the two coils in series is 12 ohms. The ohmic power consumed is 7.5 mW to produce a field of 0.5 gauss in the y direction, 10.5 mW to produce a field of 0.5 gauss in the z direction, and 15 mW to produce a field of 0.5 gauss in the x direction, with intermediate values of power to produce fields of 0.5 gauss in directions oblique to the x, y and z axes. So the power consumed by the Helmholtz coils is at most 15 mW to produce a field of 0.5 gauss, and at most 60 mW to produce a field of 1 gauss.

Figure 6:
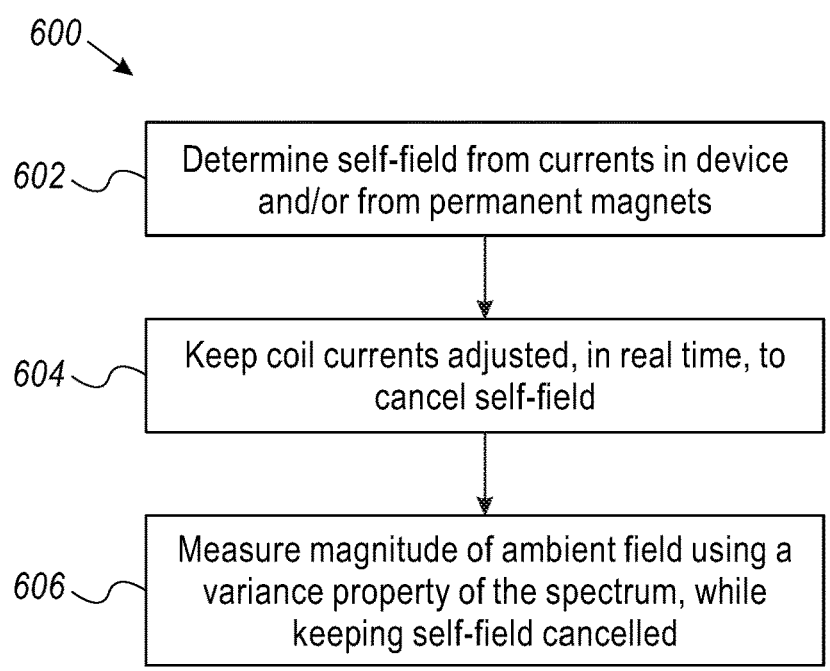
FIG. 6 is a flowchart showing an exemplary method of using a set of coils such as those shown in FIG. 5C to cancel out the self-fields in the diamond sample.

FIG. 6 shows a flowchart 600, for a method of determining what currents are needed in the coils, in order to cancel the self-field in the diamond sample, and for operating the quantum compass with the self-field canceled. At 602, before using the quantum compass to measure the magnitude of ambient magnetic fields, as part of an initial calibration procedure the value of the self-field is determined, including the part of the self-field due to currents in the device, which might change over time, and the part of the self-field due to permanent magnets associated with the device, which are assumed not to change over time. At 604, the currents in the coils are kept adjusted, in real time, to cancel the self-field in the diamond sample, even if the currents in the device are changing in time, so that the self-field is changing in time. At 606, the quantum compass is used, according to the method of FIG. 3, to measure the magnitude of the ambient magnetic field, using a variance property of spectrum, while keeping the self-field canceled.

One of the following exemplary methods is optionally used at 602 to determine the magnitude and direction of the self-field, relative to the axes of the diamond sample.

1) If the distribution of currents in the device is known, then the direction of the self-field in the diamond sample, due to the currents, and the ratio of its magnitude to the magnitude of the current, may be calculated numerically from the Biot-Savart law. The magnitude of the self-field in the diamond sample can then be found at any given time if the current is measured at that time. If there are two or more circuits which have currents that can vary independently of each other, then this can be done separately for each circuit, and the total self-field in the diamond sample, due to these currents, can be found as the vector sum of the self-field due to each circuit. If the location, size, shape, orientation, and magnetization of any permanent magnets are known, then the self-field in the diamond sample due to the permanent magnets may also be calculated using magnetic design software, and this part of the self-field should be constant, not dependent on the currents in the device. For all these calculations, it may also be necessary to include the effects of any high permeability materials in the device, which could depend on the location, size, shape, orientation, skin effects (in the case of time-varying fields) and saturation properties of any high permeability material. However, as noted above, it is potentially advantageous not to have any high permeability material large enough and close enough to the diamond sample to significantly change the direction and magnitude of the ambient field in the diamond sample, since in general such high permeability material may distort the ambient field in a way that depends on the spatial orientation of the device, which may not be known.

2) The magnitude and direction of the ambient field, during the calibration procedure, is determined, for example by measuring it with another magnetometer, or by reading it from a magnetic atlas. The quantum compass is then used to find the variance of the spectrum, for different sets of values of the three coil currents, until a set of values of the coil currents is found for which the variance is at a minimum. Alternatively, the value of current in each pair of Helmholtz coils is found which minimizes the variance of the spectrum, while the currents in the other two pairs of Helmholtz coils are held constant, and it is assumed that the global minimum in variance would occur when the three currents have those values. That procedure has the potential advantage that it may give more accurate results for the values of the currents that minimize the variance. Optionally, more than three independent coil currents may be used, if the self-field varies significantly across the diamond sample, and these spatial variations in self-field are also to be canceled out. To find the set of coil currents at which the variance of the spectrum is at a minimum, any known optimization algorithm may be used. It is assumed that, at the coil currents for which the variance is minimized, the total magnetic field in the diamond sample is zero, which means that the magnetic field generated in the diamond sample by the coils is equal in magnitude and opposite in direction to the total ambient field plus self-field. Since the magnetic field generated in the diamond sample by any given set of coil currents is known, the total self-field plus ambient field can be found. By subtracting the known ambient field from the total field, the self-field in the diamond sample can be found. Optionally, this procedure is done is a field-free chamber, for which the ambient magnetic field is known to be zero, and in that case there is no need to subtract the ambient field from the total field in order to find the self-field.

To distinguish the self-field due to currents in the device circuitry from the self-field due to any permanent magnets associated with the device, the procedure can be repeated using different currents in the device circuitry. If there is more than one circuit with currents that can vary independently, then the contributions of the different circuits to the self-field can be distinguished by repeating the procedure while using different ratios of currents in the different circuits.

The following exemplary procedure is optionally used at 604 to keep the self-field in the diamond sample canceled in real time. At periodic intervals, controller 218 receives information from the device about the magnitude of current in the device circuitry, or about the magnitude of current in each of the circuits for which the current can vary independently. Using the information obtained in 602, the controller calculates the coil currents needed to cancel the part of the self-field due to the permanent magnets, and the part of the self-field due to the device circuits, at those values of circuit currents. The controller then sets the coil currents to those values, and controls power supply 222 to produce those currents in the coils. Each time the information about the magnitude of the currents in the device circuitry is updated, the controller calculates and applies the updated coil currents needed to cancel the self-field. Optionally, the controller adjusts the coil currents at intervals frequently enough so that the self-field is canceled out up to the highest frequencies at which the self-field would significantly affect the measurement of the ambient field by the method of FIG. 3. For example, the intervals are a few times shorter than the spectrum acquisition time, or a few times shorter than the time needed to measure the spectrum at one value of the microwave frequency, or a few times shorter than the inverse of the Rabi frequency. For example, for the exemplary embodiment described below in the Examples section, the spectrum acquisition time is 50 msec, and the time to measure the spectrum at one value of the microwave frequency is about 0.3 msec, and the inverse of the Rabi frequency is about 0.1 msec. However, if the device circuitry does not have any currents at such high frequency, of a great enough magnitude to create a significant self-field in the diamond sample, then longer intervals can be used.

Magnetic Mapping

Figure 7:
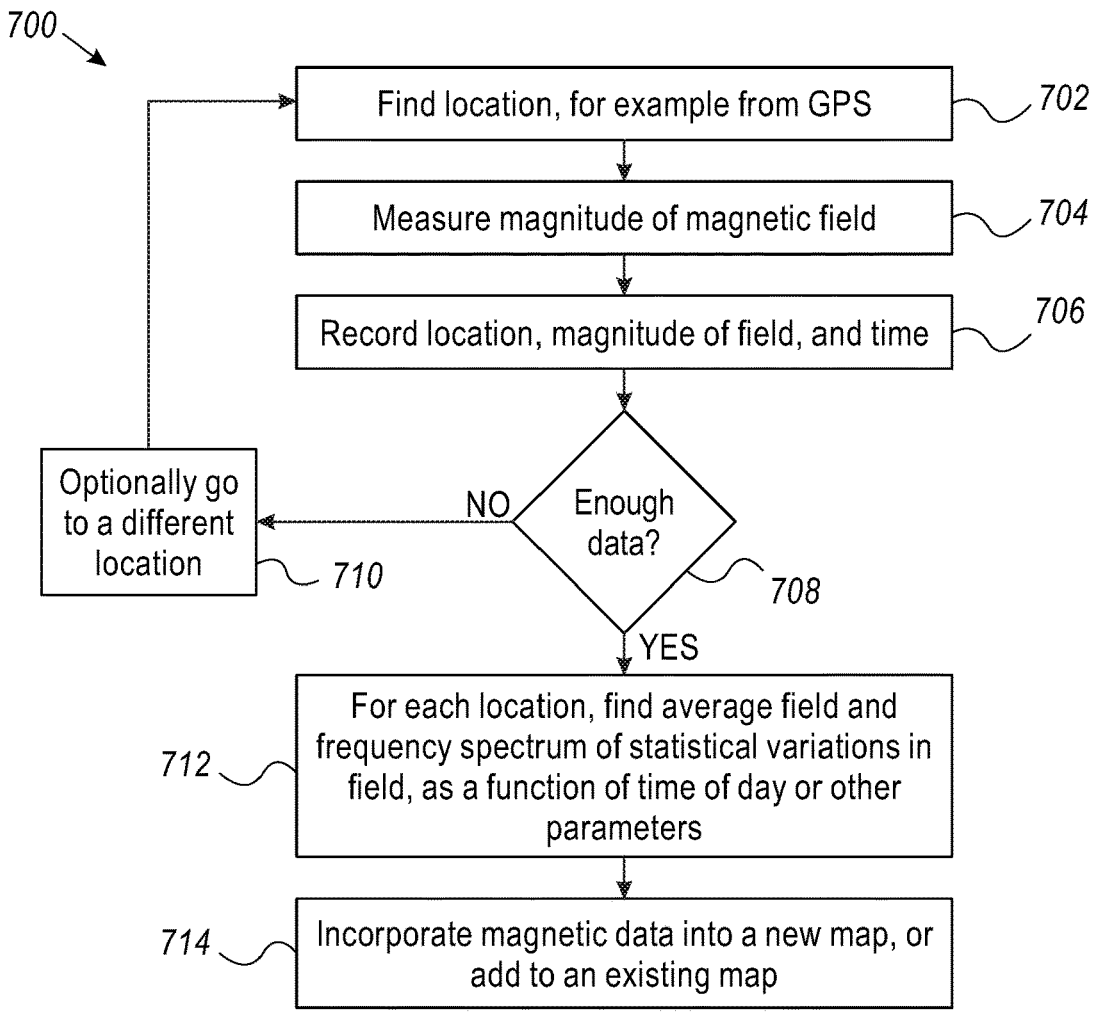
FIG. 7 is a flowchart showing a method of creating a magnetic map, suitable for magnetic navigation, for example using a magnetometer such as the quantum compass of FIG. 2, according to an exemplary embodiment of the invention.

FIG. 7 shows a flowchart 700 for a method of magnetic mapping, using a quantum compass such as that shown in FIGS. 2 and 5A, 5B, and 5C. Such a magnetic map can be used, together with a quantum compass, for magnetic navigation, as will be described below in FIG. 8. If this magnetometer only measures the magnitude of the magnetic field, as described above, and not its direction, a magnetic map prepared in this way is most suitable for use in magnetic navigation that only uses the magnitude of the magnetic field. But optionally the magnetic mapping and magnetic navigation also uses other means to measure the direction of the magnetic field, and it may be possible for an NV center magnetometer, similar to that described, to operate using other methods, not described herein, that provide information on the direction of the magnetic field as well as its magnitude.

Although a magnetic map can be made for indoor magnetic navigation using artificially created magnetic fields, as described by the Indoor Atlas patents cited above, the quantum compass described in FIGS. 2, 5A, 5B, and 5C, and the method of operation described in FIG. 3, may be especially suited for outdoor magnetic navigation, using magnetic fields that are dominated by the Earth's natural magnetic field, with magnetic field magnitudes between 0.2 and 0.7 G, and spatial variations of the order of 0.1 mG. The magnetometer and method of operation described herein is, to the knowledge of the inventor, unique in being capable of measuring such small magnetic fields to adequate precision, with such low power consumption, and with such a low weight and compact device, with orientation that may change over time in a way that is not known.

At 702, the location of the quantum compass is recorded, for example based on GPS, or even entered manually. If the magnetic map is to be three-dimensional, for example a map for the interior of a multi-story building, or for use by aircraft or satellite, then the altitude is also recorded, for example using an altimeter, or manually, for example entering the story number in a building.

At 704 the magnitude of the magnetic field is measured by the quantum compass, for example using the method described in FIG. 3.

At 706, the location and the magnitude of the magnetic field, and optionally also the time, are recorded.

At 708, a decision is made as to whether enough magnetic field and location data has been recorded, to create a magnetic map, or to add to an existing magnetic map, for example a magnetic map that has been loaded into the memory of the device, for example from a memory card, or using a network such as a cellular network, or a wired or wireless computer network. If not, then at 710 the magnetometer is optionally moved to a new location, and the location is recorded again at 702. Optionally, data continues to be taken until magnetic field measurements have been made at each location of interest, and optionally until multiple measurements have been made at each location of interest at different times, in order to obtain data, for example statistical data, on changes in the magnetic field over time.

If enough data has been taken, then at 712, the magnitude of the magnetic field is characterized at each location for which enough measurements were taken. For example, a time average of the magnitude of the magnetic field is found, and/or a range of values over time is found, and/or an average value is found for different times of day and/or different days of the week, and/or a frequency spectrum, optionally a statistical frequency spectrum, is found for the variations in the magnitude of the magnetic field over time. For example, if the location is near a road, then vehicles made of magnetic steel, travelling along the road, may cause measurable fluctuations in the magnitude of the magnetic field, which will have a characteristic frequency spectrum, at frequencies on the order of 1 Hz, that may depend on time of day and/or day of the week. Diurnal changes in the magnitude of the magnetic field due to diurnal changes in the Earth's magnetosphere may also be recorded. Optionally, especially in the case of magnetic field variations due to travelling vehicles, the expected frequency spectrum is recorded, or calculated, as a function of travelling speed of the magnetometer. For example, if the magnetometer is travelling in a car moving together with other traffic on the road, then the rate at which it passes cars will be different than if the magnetometer is stationary by the side of the road.

At 714, the magnetic field characterizations found at 712 are used to create a magnetic map, or to add data to an existing magnetic map, for example a magnetic map that is located in the memory of the device, or a magnetic map that is stored remotely on a server, and is updated by uploading the data to be added to it, for example via a cellular network, or a wired or wireless computer network.

Magnetic Navigation

Figure 8:
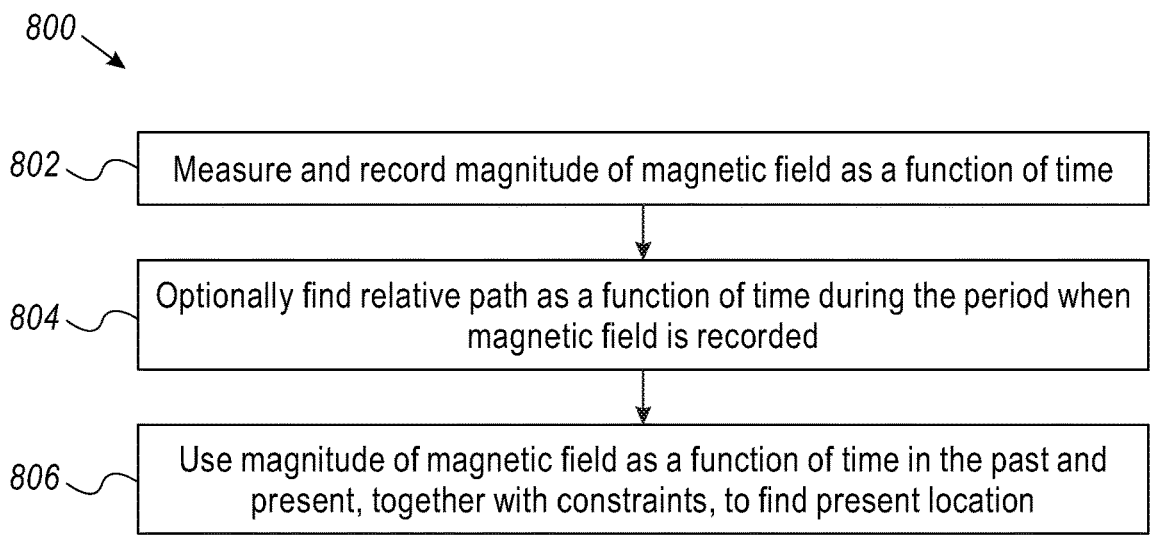
FIG. 8 is a flowchart showing a method of magnetic navigation, using a magnetometer, for example using the quantum compass of FIG. 2, and a magnetic map, for example a magnetic map created according to the method of FIG. 6.

FIG. 8 shows a flow chart 800 for a method of magnetic navigation, using a magnetic map, for example a magnetic map prepared by the method of FIG. 6, and a magnetometer that measures the magnitude of the magnetic field, optionally only the magnitude and not the direction, such as the quantum compass shown in FIGS. 2, 5A, 5B, and 5C, using the method of operation shown in FIG. 3. Optionally the magnetic map also only includes information on the magnitude of the magnetic field, and not on its direction, or only the information on magnitude of the magnetic field is used for the magnetic navigation.

At 802, the magnitude of the magnetic field is measured and recorded as a function of time, for example using the method of FIG. 3 in each of a plurality of time intervals. Optionally, each time interval is short enough so that an expected error in the measured magnetic field due to an expected rate of change in orientation of the quantum compass during the time interval, is smaller, or at least not much greater, than an expected error in the measured magnetic field due to the finite measurement time, for example due to Johnson noise and shot noise in the photodiode that measures the fluorescent emission intensity. Expressions for those two expected sources of error, and exemplary measurement times, are given below in the Examples section. For example, as derived in the Examples section, it is expected that an acquisition time of 50 milliseconds can be used, to achieve a precision in the field magnitude of 18 nT, with a magnetometer that consumes only 80 mW of power.

At 804, a relative path is optionally found for the position of the quantum compass as a function of time, during the period when the magnetic field amplitude was measured and recorded as a function of time. Here, a "relative path" means the shape and size and time dependence of a path, for example a two-dimensional path on or near the surface of the Earth, without knowing its absolute starting point, and optionally without knowing its orientation on the surface of the Earth. Such a relative path may be found, for example, by integrating accelerometer data over the period when the magnetic field amplitude was measured and recorded. If the quantum compass is incorporated into a mobile device such as a cell phone, the mobile device's own accelerometer is optionally used for this purpose. In integrating the accelerometer data to find the relative path, it optionally assumed that the quantum compass is stationary at the beginning of the path, and/or at the end of the path. Optionally, it is assumed that the quantum compass did not change its vertical position very much during the period when the magnitude of the magnetic field was measured and recorded, so the accelerometer measurement is dominated by a vertical component of 1 g due to gravity, and differences from that are due to lateral accelerations. Optionally, an ordinary compass, not necessarily sensitive to small variations in the magnetic field, is used to keep track of the approximate orientation of the accelerometer as a function of time, so the accelerometer data can be integrated to find the relative path. Optionally, the vertical component, if any, of the Earth's magnetic field is also measured by the ordinary compass, to further constrain the orientation of the accelerometer as a function of time. Additionally or alternatively, a gyroscope, or a similar inertial sensor, is used to measure changes in orientation of the accelerometer over time, so that the accelerometer data can be integrated to find the relative path.

In general, if only the magnitude of the magnetic field is measured, that may not provide enough information to find the location of the quantum compass in two dimensions, on the surface of the Earth. A magnetic map of the magnitude of the magnetic field as a function of position in two dimensions will generally show a series of contours where the magnetic field has a given value, and measuring that value will not in itself provide information as to where along that contour the quantum compass is located. To locate the quantum compass, an additional constraint is generally needed. The relative path found at 804 provides one possible constraint that can be used to locate the quantum compass along a contour of constant magnitude of the magnetic field. This can be done, for example, by finding an end point for the path, for which the measured magnitude of the magnetic field as a function of time, over the path, matches an expected magnitude of the magnetic field as a function of position on the path, based on the magnetic map. Another example of a constraint on the position of the quantum compass would be if it is known that the quantum compass is located somewhere along a particular road, optionally somewhere on a particular stretch of the road. If there is only one location where the contour of the magnitude of the magnetic field intersects that road, or that stretch of road, then it may be concluded that the quantum compass is at that location.

At 806, the measured magnitude of the magnetic field, together with one or more constraints, is used to find the location of the quantum compass, using the magnetic map. If the magnetic map includes frequency spectrum data on time variations in the magnitude of the time varying magnetic field, for example on a time scale shorter than a time scale over which the magnitude of the magnetic field is changing due to motion of the quantum compass, for example on a time scale of 1 second due to passing vehicles, then the frequency spectrum data is optionally used in addition to a stationary component of the magnitude of the magnetic field, to find the location of the quantum compass. For example, the fluctuations in magnitude of the magnetic field due to passing vehicles could be used to determine that the quantum compass is located near a road with traffic on it, and to estimate how far it is from the road, and how much traffic there is, any of which may help in finding the location of the magnetometer.

It is expected that during the life of a patent maturing from this application many relevant light sources, LEDs, microwave resonators, light detectors, and photodiodes will be developed and the scope of these terms is intended to include all such new technologies a priori.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find calculated support in the following examples.

EXAMPLES

Reference is now made to the following examples, which together with the above descriptions illustrate some embodiments of the invention in a non limiting fashion.

A simulation was made of the spectrum of NV center resonance frequencies that would be measured by a quantum compass of a particular design, according to an exemplary embodiment of the invention, including the effects of Johnson noise and shot noise of the photodiode, and the resulting error in the measurement of the magnitude of the magnetic field was found. It was found that this exemplary design could produce an rms error in the field measurement of only 18 nT, with a spectrum acquisition time of 50 milliseconds, corresponding to a bandwidth of 20 Hz, and with a power consumption of the LED of only 80 mW. The light power emitted by the LED, which has an energy efficiency of 6.5%, is 5.2 mW, in a range of wavelengths that is between 520 nm and 560 nm, and the total light power illuminating the NV centers is 4 mW, due to the light being attenuated by absorption as it goes through the diamond, as will be shown below. It was also calculated that the power consumption of the microwave oscillator and resonator are much lower than the power consumption of the LED, and that the error in field measurement due to changing orientation of the magnetometer while the spectrum is being measured would be less than 30 nT, assuming that the magnetometer is not changing its orientation at a rate of more than 1 radian per second. This combination of parameters suggests that such a quantum compass will be practical to use for magnetic navigation, incorporated into a mobile device such as a cell phone, and carried by a person walking, or riding in a motor vehicle. The precision of measuring the magnitude of the magnetic field could be further improved by using a longer spectrum acquisition time, or repeating the measurement several times, or using a higher power LED.

Exemplary Design of Quantum Compass

In this exemplary design, the diamond sample is a square 1.5 mm by 1.5 mm, and 0.3 mm thick. It is not isotopically purified, but has the natural concentration $[C_{13}]$ of carbon-13 atoms, 1.07%, and the concentration $[N]$ of nitrogen atoms is 10 ppm. The concentration of NV centers is 30% of the nitrogen concentration, 3 ppm, which corresponds to a density of NV centers $[NV]=5\times10^{17}$ cm$^{-3}$. The transverse dephasing rate $\Gamma_2^*$ for the electronic triplet ground state of the NV centers is dominated by interactions with the non-zero nuclear spins of nearby carbon-13 and nitrogen atoms, and is given by $A_{C13}[C_{13}]+A_N[N]$, where $A_{C13}=10^2$ s$^{-1}$/ppm, and $A_N=1\times10^5$s$^{-1}$/ppm (as stated on page 15 of Barry et al, cited above), so $\Gamma_2^*=2\times10^6$s$^{-1}$. The longitudinal relaxation rate $\Gamma_1$ for the electron spin triplet of an NV center is about $1\times10^3$s$^{-1}$. The full width half-maximum (FWHM) resonance width $\Delta\nu$ would be equal to the intrinsic resonance width $\Delta\nu_{intr}=\Gamma_2^*/\pi=600$ kHz in the limit of low optical pumping rate and low Rabi frequency. At finite optical pumping rate $\Gamma_p$, optical pumping decoherence rate $\Gamma_c$, and Rabi frequency $f_R$, the FWHM resonance width is given by $$\Delta\nu = \Delta\nu_{intr}\sqrt{1+\frac{\Omega_R^2}{\Gamma_2^*(\Gamma_p+\Gamma_1)}}$$

where $\Omega_R=2\pi f_R$ is the Rabi frequency in radians per second. See, for example, Eq. (A3) of Jensen et al, cited above. The optical pumping rate, according to Jensen et al, as well as Dreau et al, also cited above, is given by $\Gamma_p=\Gamma_p^\infty(P/P_{sat})$ where $\Gamma_p^\infty=5\times10^6$s$^{-1}$ is the saturation optical pumping rate for NV centers in diamond, P is the optical power illuminating the NV centers, and $P_{sat}$ is the saturation power, with P assumed to be much less than $P_{sat}$. The saturation power depends on the number of NV centers. In Jensen et al, the saturation power is 5 watts, but for the exemplary design described here, there are about 4 times as many NV centers being illuminated, so the saturation power is expected to be about 20 watts. With an illumination power P=4 mW, the optical pumping rate $\Gamma_p=1\times10^3$ s$^{-1}$. The optical pumping decoherence rate $\Gamma_c$ is given by $\Gamma_c^\infty(P/P_{sat})$ where $\Gamma_c^\infty=8\times10^7$s$^{-1}$ is the saturation optical pumping decoherence rate for NV centers in diamond. For an illumination power of 4 mW, $\Gamma_c=1.6\times10^4$s$^{-1}$. Since this is much less than the transverse dephasing rate $\Gamma_2^*$, $\Gamma_c$ can be ignored, and has not been included in the equation above for the resonance width $\Delta\nu$, or in the equation below for the contrast C.

To show that the total illumination power of the NV centers in the diamond is 4 mW, note that the absorption cross-section of an NV center, for light between 520 nm and 560 nm, is $K=3\times10^{-17}$ cm$^2$. The light from the LED is assumed to uniformly illuminate the square face of the diamond sample, in a direction normal to the surface, and travels across the diamond in the direction of its thickness w=0.3 mm. At a distance z below the surface, the light power is attenuated by a factor of $\exp(-[NV]\cdot K\cdot z)$, which ranges from 1 at z=0 to 0.64 at z=0.3 mm. Although a more precise analysis might find $\Gamma_p$ and hence $\Delta\nu$ as a function of z, the value of $\Delta\nu$ does not change very much across the diamond, and to good approximation we can treat each NV center as if it were illuminated by light with the average attenuation factor, given by 1/w times the integral of $\exp(-[NV]\cdot K\cdot z)$ between z=0 and z=w, which is $[1-\exp(-[NV]\cdot K\cdot w)]/[NV]\cdot K\cdot w$. Since $[NV]\cdot K\cdot w=0.45$, the average attenuation factor over the volume of the diamond is 0.8, and the total illumination power is $0.8\times5.2$ mW=4 mW. The total absorbed power is $[1-\exp(-0.45)]\times5.2$ mW=1.9 mW, which is 36% of the power emitted by the LED. All of this absorbed power is assumed to be converted into fluorescent emission power at a wavelength of about 637 nm.

With these values of $\Gamma_p$, $\Gamma_1$, and $\Gamma_2^*$, and using a Rabi frequency $f_R=10$ kHz, so $\Omega_R=2\pi\times10$ kHz=$6\times10^4$s$^{-1}$, the FWHM resonance width is only moderately increased, from 600 kHz to 800 kHz.

When an NV center is exposed to light of a power that corresponds to an optical pumping rate of $\Gamma_p$, and to a microwave field at its resonant frequency, with an amplitude that corresponds to a Rabi frequency $f_R$, then its fluorescent emission is reduced by a relative fraction C, due to coupling between the $m_s=0$ state and the $m_s=\pm1$ states caused by the microwave field, compared to what its fluorescent emission would be in the absence of a microwave field, or with a microwave field far from its resonant frequency. The contrast C depends on $\Gamma_1$, $\Gamma_2^*$, $\Gamma_p$, $\Gamma_c$, (though $\Gamma_c$ can be ignored if it is much less than $\Gamma_2^*$), and $f_R$. According to Eq. (A4) of Jensen et al, C is given by $$C=\frac{\theta\Gamma_p\Omega_R^2}{(\Gamma_p+\Gamma_1)[\Omega_R^2+\Gamma_2^*(\Gamma_p+\Gamma_1)]}$$

Here $\theta$ is a coefficient whose value is determined, together with $\Gamma_1$, $\Gamma_2^*$, and other free parameters of Jensen's model, by fitting the expressions for C and $\Delta\nu$ to experimental data on the fluorescent emission power as a function of microwave frequency for a particular diamond sample, for different values of $\Gamma_p$, which depends on light intensity, and $\Omega_R$, which depends on microwave field amplitude. Jensen et al find that $\theta=0.023$ provides the best overall fit to their data, but the data for cases that most closely resemble the exemplary design described here, with relatively low values of $\Omega_R$ and $\Gamma_p$, are a better fit to $\theta=0.04$, and that value will be assumed herein.

C is the relative reduction in fluorescent emission for a given NV center when it is at one of its two Zeeman split resonance frequencies. For an ensemble of NV centers, there are 12 different groups of NV centers, each with nearly the same number of NV centers, and each with different Zeeman split resonance frequencies. There are 4 different orientations of NV centers, along each of the 4 tetrahedral axes of the diamond crystal. For each orientation, there are 3 different groups of NV centers, with the nuclear spin of the nitrogen atom oriented either parallel to the orientation of the NV center (k=+1), anti-parallel to the orientation of the NV center (k=−1), or perpendicular to the orientation of the NV center (k=0), nearly equally populated since their energies differ by much less than the thermal energy. The NV centers with different orientation of the nuclear spin will have different resonance frequencies due to hyperfine coupling, and the NV centers oriented along different tetrahedral axes of the diamond will in general have different resonance frequencies, in the presence of a magnetic field, because the Zeeman splitting will depend on the angle of the magnetic field to the axis of the NV center. So the fluorescent emission spectrum of an ensemble of NV centers, as a function of microwave frequency, is expected to consist of 24 superimposed dips, each centered at its own resonance frequency, with a width (FWHM) of $\Delta v$, and an amplitude of $C/12$, using the above expressions for $\Delta v$ and $C$.

For the exemplary design described herein, with $\Gamma_p = 1 \times 10^3 \text{ s}^{-1}$, $\Gamma_1 = 1 \times 10^3 \text{ s}^{-1}$, $\Gamma_2^* = 1.7 \times 10^6 \text{ s}^{-1}$, $\Omega_R = 2\pi \times 10 \text{ kHz} = 6 \times 10^4 \text{ s}^{-1}$, and assuming $\theta = 0.04$, we find $C = 1.1\%$, so $C/12 \approx 0.1\%$. So the reduction in fluorescent emission, as a function of microwave frequency, is expected to consist of a superposition of the 24 resonances, each with a FWHM width of 800 kHz, and each with an amplitude equal to 0.1% of the full emission power. This spectrum, inverted so that it is highest at the center of each resonance, is shown in FIG. 4, for a magnetic field of 0.5 gauss oriented in each of three different directions. Note that peak 418 in plot 402 of FIG. 4, which represents only a single one of the 24 resonances and does not have much overlap with other resonances, has a height of close to 0.1%, as expected, and this also true of the unlabeled peak in plot 402 that is the same distance on the other side of the zero-field splitting resonance frequency. The other peaks seen in FIG. 4 are higher than 0.1%, because they each represent the partial or complete overlap of more than one of the 24 resonances. For example, peak 412 in plot 400 represents four resonances for $i=1, 2, 3$, and $4$ respectively, and $k=+1$, that exactly coincide, so it has a height of about 0.4%, four times greater than 0.1%.

Estimate of Signal to Noise Ratio

As noted above, the fluorescent emission power of the NV centers is expected to be about 1.9 mW, and this is reduced by only a small amount, less than 1%, by the resonances with the microwave frequency. Given the geometry of the diamond sample and the photodiode, including the effect of the high index of refraction of the diamond, about 2.41, it is estimated that about 20% of the fluorescent emission power, about 380 $\mu$W, reaches the photodiode and is detected. The amplitude of the signal, as noted above, is nominally 0.1% of this, if the signal amplitude is defined as the height of each of the 24 resonances, so the signal power is 0.4 $\mu$W. The photodiode is assumed to have a sensitivity of 0.5 amp per watt, so the signal is 0.2 $\mu$A, which results in $1 \times 10^{-5}$ volts across the 50 ohm resistance of the photodiode.

The noise level is assumed to be dominated by Johnson noise and/or shot noise in the photodiode, which is assumed to be connected in series to a resistance of 50 ohms. The bandwidth for measuring the fluorescent emission at each microwave frequency is assumed to be 3 kHz, which is a little less than one third of the Rabi frequency. This allows the NV center to go through three full Rabi cycles during the time, 0.33 milliseconds, that the fluorescent emission is measured at each microwave frequency, which means that the expressions given above, for resonance width $\Delta v$ and amplitude $C$, are approximately correct. If the bandwidth were much greater than this, and the measurement time were much shorter, then the NV center would go through less than one Rabi cycle during the measurement time, and the amplitude $C$ of the dip in fluorescent emission might be much less. Optionally, the microwaves also have a bandwidth of 3 kHz or less. Alternatively, the microwaves have a bandwidth greater than 3 kHz, but still many times less than the 800 kHz resonance width, so that the shape of the spectrum, the emission power as a function of microwave frequency, which has features that are 800 kHz wide, can be measured accurately.

The Johnson noise level in volts is then $(4kTRb)^{1/2}$ where $k = 1.3 \times 10^{-23}$ joules/K is Boltzmann's constant, $T = 300$ K is the temperature, $R = 50$ ohms is the resistance of the photodiode amplifier, and $b = 3$ kHz is the bandwidth. The Johnson noise level is then $5 \times 10^{-8}$ volts.

The shot noise in the photodiode is given by $R(2eIb)^{1/2}$, where $e = 1.6 \times 10^{-19}$ coulombs is the charge of an electron, and $I = 200$ $\mu$A is the current in the photodiode corresponding to the full received fluorescent emission power 400 $\mu$W. Then the shot noise is $2.2 \times 10^{-8}$ volts, and the total noise, Johnson noise plus shot noise, is $[(5 \times 10^{-8})^2 + (2.2 \times 10^{-8})^2]^{1/2} = 5.5 \times 10^{-8}$ volts.

Since the signal, defined as the height of each resonance peak, is $1 \times 10^{-5}$ volts, the signal to noise ratio is $(1 \times 10^{-5})/(5.5 \times 10^{-8}) = 180$, or 23 dB.

Magnetic Field Error with Signal to Noise Ratio of 23 dB

A simulation was done to find the NV resonance spectrum with a signal to noise ratio of 23 dB, and a resonance width, FWHM, of 800 kHz, with a magnetic field of 0.5 G, oriented at different angles to the axes of the crystal. For each spectrum, 141 microwave frequencies were used, spaced at 76.5 kHz intervals between 5.35 MHz below the zero-field splitting resonance frequency (which was 2.87 GHz) and 5.35 MHz above the zero-field splitting resonance frequency. The resonance shapes were assumed to be Gaussian, ignoring effects that might result in a different resonance shape. FIG. 4 shows some typical examples of spectra found in this simulation, for three different orientations of the magnetic field. The measurement time for each microwave frequency was $3.3 \times 10^{-4}$ seconds, so the spectrum acquisition time for all 141 points is about 50 milliseconds. This corresponds to a bandwidth for the field measurement of 20 Hz. For each spectrum, the curve fitting method described above was used to find the magnitude of the magnetic field. The rms error in the magnitude of the field was found to be 0.036%, or 18 nT.

As noted above, a greater precision of the field measurement may be obtained if a longer measurement time is used for measuring the fluorescent emission power at each microwave frequency, or if more microwave frequencies are used, or if the measurement is repeated. All that matters is the total spectrum acquisition time, including the time for any repeated measurements, and the error in the field measurement will scale like the square root of the bandwidth for the field measurement.

The precision of the field measurement can also be increased by increasing the power of the LED, thereby increasing $\Gamma_p$. If the microwave field amplitude is also increased, such that $\Omega_R^2$ increases in proportion to $\Gamma_p + \Gamma_1$, then $\Delta v$ will be independent of the LED power, and $C$ will increase in proportion to $\Gamma_p/(\Gamma_p + \Gamma_1)$. In the limit that $\Gamma_p$ is much greater than $\Gamma_1$, $C$ will be twice as great as it is for the exemplary design where $\Gamma_p = \Gamma_1$. In this limit, $C$ will be nearly independent of the LED power, and the signal amplitude will be nearly proportional to the LED power. If the noise is dominated by Johnson noise, which does not depend on the LED power, then the signal to noise ratio may increase approximately linearly with the LED power. However, for LED power a few times greater than that used in the exemplary design, shot noise will become greater than Johnson noise, and for LED power much greater than that, the noise level will increase like the square root of the LED power, and the signal to noise ratio may increase only like the square root of the LED power.

Another potential advantage of using higher LED power and higher Rabi frequency, is that the measurement time of the fluorescent emission power at each microwave frequency can be decreased, and the spectrum acquisition time can be decreased. This may make the field magnitude measurement less subject to errors introduced by the quantum compass changing its orientation to the magnetic field in the middle of acquiring the spectrum, as discussed below. If desired, the spectrum acquisition can be repeated one or more times, for example enough times so that the field measurement bandwidth stays the same, keeping the noise level low, without increasing the error due to changing orientation of the quantum compass, since it does not matter if the quantum compass changes orientation between one spectrum acquisition and another.

Simulations were also done of finding the field magnitude B from the spectrum, using the variance $V_{spect}$ of the spectrum, rather than using curve-fitting. These simulations showed that, for the same signal to noise ratio and the same spectrum, the error $\Delta B$ is comparable when the variance $V_{spect}$ is used to find B, as when curve-fitting is used to find B. A potential advantage of using the variance of the spectrum to find the field magnitude, rather than curve fitting, is that less computation may be needed, so the method may be more suitable for small devices with limited computational power.

Although in these simulations the spectrum was simulated from the known characteristics of the quantum compass and the magnetic field, a simulation can also be used to find an expected error in the measured magnitude of the field, using the spectrum found by a real quantum compass measuring a real magnetic field. For example, a noise level of the NV center absorption spectrum can be determined, for each frequency at which the spectrum was measured, by using a known level of noise in the photodiode and amplifier, for example Johnson noise plus shot noise, using the output resistance and the measurement time for each frequency. Then, a set of simulated spectra can be created, by randomly varying the measured spectrum at each frequency, using the noise level that was determined. For each simulated spectrum, the magnitude of the magnetic field is calculated, using whatever algorithm the quantum compass is using, for example any of the curve-fitting methods described above. The standard deviation in the resulting values for the magnitude of the magnetic field will then give the expected error in the measured magnitude of the magnetic field, due to the Johnson noise and shot noise. The error found from such a simulation will not include other sources of error, such as changes in orientation of the quantum compass, or changes in the magnetic field, during the acquisition of the spectrum. As used herein, "random error in the measured magnitude of the magnetic field, corresponding to random errors in the spectrum due to the noise in the light detector" and similar expressions, for a given measurement of the magnitude of the magnetic field using a given quantum compass, means a random error in the magnitude of the magnetic field that would be obtained by such a simulation.

Alternatively, instead of using such a simulation to find the error in the magnitude of the magnetic field that would be produced by that level of Johnson noise and shot noise in the photodiode, it may be possible to derive an analytic expression for the random error in magnitude of the magnetic field, in terms of the Johnson noise and shot noise and the spectrum, for the specific algorithm that the quantum compass uses to calculate the magnitude of the magnetic field from the spectrum, and the analytic expression is optionally used to find the random error in the magnitude of the magnetic field. For example, such an analytic expression for the random error in the magnetic field can be derived if the magnitude of the magnetic field is found from the variance $V_{spect}$ of the spectrum, and subtracting from $V_{spect}$ terms due to the resonance width W, the strain coefficient E, and the hyperfine coupling $A_\parallel$, as described above. If the noise level is assumed to be small enough so that $V_{spect}$ is a linear function of errors in the spectrum due to noise, and if it is assumed that the W, E, and $A_\parallel$ terms are known and fixed, then $\Delta V$, the random error in the variance V of the twenty-four resonance frequencies, will be equal to the random error in $V_{spect}$. For a set of frequencies $f_n$, where n=1, 2, 3, . . . , the measured spectrum at frequency $f_n$ is designated $F(f_n)$ and the noise level at frequency $f_n$, normalized to $\Sigma F(f_n)$, where the sum is over n, is designated $N(f_n)$. Then the random error in V may be given by $$\Delta V = \left[\sum_n (N(f_n)[(f_n - \bar{f})^2 - V_{spect}])^2\right]^{1/2}$$

where $\bar{f}$ is the mean frequency of the spectrum. The inventor believes that this expression for the random error in V may also be valid, to a good approximation, if a different method is used to find V, for example curve-fitting, since the value of V found for a given spectrum should be approximately the same regardless of what method is used to find it. From the random error in V, the random error $\Delta B$ in the magnitude B of the magnetic field may be found from $\Delta B = \Delta V(dB/dV)$, for example using $B = (3V - E^2 - 2A_\parallel^2)^{1/2}\gamma$ to find dB/dV.

Error in Field Measurement Due to Change in Orientation

If the spectrum for all of the microwave frequencies below the zero-field splitting resonance frequency were measured with the magnetometer in a given orientation, and the magnetometer were then rotated by a small angle $\theta$ around the z axis, and the spectrum were then measured for all the microwave frequencies above the zero-field splitting resonance frequency, then one can calculate the error in the magnitude of the magnetic field that would be produced by ignoring this rotation of the magnetometer. For example, a calculation by the inventor indicates that the magnitude of the magnetic field calculated from the spectrum may have an error of $(B_x^2 + B_y^2)^{1/2}\theta^2/4$ as a result of the change in orientation of the magnetometer during the measurement of the spectrum. This may be an upper limit on the error in the magnitude of the field due to changes in orientation during the measurement of the spectrum, with smaller errors if the magnetometer rotates uniformly during the measurement, instead of suddenly changing position in the middle of the measurement, and the error in the magnitude of the field may also be smaller if the microwave frequency jumps around over time while the spectrum is being measured, rather than measuring the spectrum at the different microwave frequencies in order.

A person holding the magnetometer in their pocket, while walking at a brisk but comfortable rate of 4.5 kilometers per hour, and taking steps 0.75 meters in length, would be taking 6000 steps per hour, or 1.67 steps per second. If the length of the person's leg, from hip joint to heel, were 1.1 meters, then each leg would swing over an angle of 2 arctan(0.375/1.1)=0.68 radians during each step and if the orientation of the leg, and the magnetometer, were changing at a constant rate during each step, the magnetometer would be changing orientation at a maximum rate of about 1 radian per second. If the magnetometer is in a motor vehicle, travelling at about 100 km per hour over a winding road with frequent rises and dips, then the maximum angular rotation rate might also be about 1 radians per second. If a measurement of the magnitude of the magnetic field takes 50 milliseconds, as it would for the exemplary design described above, then the maximum change in orientation θ during that time would be about $5 \times 10^{-2}$ radians. This would result in a maximum relative error in the magnitude of the magnetic field of $6 \times 10^{-4}$, according to the above expression for the error, or an absolute error of no greater than 30 nT when measuring the Earth's magnetic field if it is no greater than $5 \times 10^{-5}$ tesla. Probably the error would be a few times less than this, no more than the 18 nT error in the magnitude of the magnetic field due to Johnson noise and shot noise in the photodiode, for this exemplary design.

Microwave Power

The microwave power that is needed to reach a Rabi frequency of 10 kHz depends strongly on the geometry of the antenna. In the above cited article of Bayat et al., the double split resonator was fed by a microwave power of 0.5 W, which gave rise to a Rabi frequency of 16.69 MHz. Using the same kind of geometry, we expect to reach a Rabi frequency of 10 kHz with a microwave power of −37 dBm (or equivalently 0.2 microwatts), since the power scales like the square of the Rabi frequency. The DC power consumed by the oscillator would be typically about 100 times larger, or about 20 μW, much less than the power consumed by the light source.

Figures of Merit

The figure of merit defined above is the inverse of the magnetic field error ΔB in nT, times the inverse of the power consumed by the quantum compass in watts, times the inverse of the square root of the acquisition time in seconds. In the exemplary design, ΔB=18 nT, the consumed power is dominated by the consumed power of the LED which is 0.08 watts, and the acquisition time is 0.05 seconds, so the figure of merit is equal to 3.1.

There are several other quantities, characteristic of a given design of the quantum compass, that are of interest because they contribute to the high value of the figure of merit, and it is potentially advantageous to make these quantities relatively high. One of these quantities is the ratio of light power detected in the photodiode, to light power emitted by the light source. For the exemplary design, the detected light power is 380 μW and the emission power of the LED is 5.2 mW, so this ratio is 7.2%. If Bragg reflectors are used on the diamond sample, as described above in the description of FIG. 2 and FIG. 5B, this ratio could be even higher, for example 11% or 15% or 20%. Characteristics of the design that contribute to the relatively high value of this ratio include the small distance between the LED and the diamond sample, the small distance between the diamond sample and the photodiode, the relatively high optical depth of the diamond sample, and the similarity in width and cross-sectional shape of the LED, the diamond sample, and the photodiode, all of which may result in less light being wasted. Alternatively, the ratio of light power detected by the light detector to the light power emitted by the light source is less than 2%, or between 2% and 3%, or between 3% and 5%, or between 5% and 7%, or between 7% and 10%, or between 10% and 15%, or more than 15%.

Other such quantities include the power efficiency of the light source, which is 6.5% for the LED in the exemplary design, and the contrast C, which depends on the light power, the Rabi frequency of the microwave field, and characteristics of the diamond, such as $\Gamma_p$, $\Gamma_1$, and $\Gamma_2^*$, and is 1.1% for the exemplary design.

Another such quantity depends on the ratio of the inverse of the relative field error (B/ΔB) to the SNR of the detected signal at each microwave frequency for which the signal is measured. This ratio, which was calculated in the simulations described above, is generally expected to scale like the square root of the number N of microwave frequencies at which the spectrum is measured, at least when a large number of frequencies is used, so a useful derived quantity may be $(B/\Delta B)/(SNR \cdot N^{1/2})$, which is expected to be independent of N for large N. This dimensionless quantity is 1.3 for the exemplary design, for the case where the magnetic field magnitude B was calculated using curve-fitting, and is 0.13 for the case where the magnetic field amplitude B is calculated from the spectrum variance $V_{spect}$. This quantity may be a measure of how effective the algorithm is for finding the magnetic field magnitude B from the spectrum, and of how well the microwave frequencies, used in measuring the spectrum, are distributed over the range where the resonance peaks are located, and not much beyond that range. Using a good distribution of microwave frequencies, within this relevant range, may ensure that LED power and acquisition time used to measure the spectrum are not wasted at frequencies for which the spectrum is negligibly small, and are not wasted at frequencies that are very close to frequencies where the spectrum has already been measured, but are well enough distributed to effectively measure all the relevant features of the spectrum. Optionally, $(B/\Delta B)/(SNR \cdot N^{1/2})$ is at least 0.1, or at least 0.14, or at least 0.2, or at least 0.3, or at least 0.5, or at least 0.7, or at least 1, or at least 1.4, or at least 2, or at least 3, or at least 5.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A magnetometer that finds a magnitude of an ambient magnetic field, comprising:
   a) a crystal having a diamond cubic structure, with four tetrahedral axes, with an ensemble of paramagnetic defects, some of the defects oriented along each of the crystal's four tetrahedral axes;
   b) a microwave source that produces a microwave field at the crystal, of controllable frequency over a range that includes microwave resonance frequencies, in the presence of the ambient magnetic field, for paramagnetic defects oriented along all four axes;
   c) a light source that illuminates the paramagnetic defects with light of a wavelength to cause fluorescent emission;

d) a light detector that measures a total detected fluorescent emission power of the paramagnetic defects; and
e) a controller configured to:
1) measure the detected fluorescent emission power at each of a plurality of different selected microwave frequencies within the range, over a spectrum acquisition time, to obtain a spectrum of the paramagnetic defect ensemble;
2) calculate a variance property of the spectrum; and
3) calculate the magnitude of the ambient magnetic field from the variance property.

2. A magnetometer according to claim 1, wherein the light source comprises a light emitting diode.

3. A magnetic navigation device comprising:
a) a magnetometer according to claim 1;
b) a data storage medium containing magnetic map data about the magnitude of the ambient magnetic field as a function of position; and
c) a navigation controller, the same as or different from the controller of the magnetometer, configured to use the magnitude of the ambient magnetic field found by the magnetometer at one or more locations, together at least with the magnetic map data, to find a location of the navigation device.

4. A magnetic navigation device according to claim 3 also comprising an accelerometer, wherein the navigation controller is configured to obtain the magnitude of the ambient magnetic field at more than one location, and to use the accelerometer to obtain information about a relative spatial configuration of the locations, and finding the location of the navigation device comprises using the magnitude of the ambient magnetic field at the locations and information about the relative spatial configuration of the locations.

5. A magnetometer according to claim 1, wherein the crystal comprises a diamond crystal, and the paramagnetic defects comprise NV centers.

6. A magnetometer according to claim 5, wherein the light detector has a noise level, a level of consumed power of the light source less than 250 milliwatts, the spectrum acquisition time is less than 200 milliseconds, and in a uniform constant magnetic field of 0.5 gauss oriented in any direction, has an expected random error of the magnitude of the magnetic field due to the noise level of the light detector that is less than 50 nanotesla.

7. A magnetometer that finds a magnitude of an ambient magnetic field or of one or more components of the magnetic field or both, comprising:
a) a crystal having a diamond cubic structure with four tetrahedral axes, with an ensemble of paramagnetic defects, some of the defects oriented along each of the crystal's four tetrahedral axes;
b) a microwave source that produces a microwave field at the crystal of controllable frequency over a range that includes microwave resonance frequencies, in the presence of the ambient magnetic field, for paramagnetic defects oriented along all four axes;
c) a light source with a light emitting surface that illuminates the paramagnetic defects with light of a wavelength to cause fluorescent emission;
d) a light detector with a light detecting surface, that measures a total detected power of fluorescent emission light of the paramagnetic defects; and
e) a controller configured to:
1) measure the detected fluorescent emission power at each of a plurality of different selected microwave frequencies within the range, over a spectrum acquisition time, to obtain a spectrum of the paramagnetic defect ensemble; and
2) calculate the magnitude of the magnetic field or the one or more components of the magnetic field or both, from the spectrum;
wherein all of the crystal is closer to the light emitting surface than a largest transverse dimension of the light emitting surface, and closer to the light detecting surface than a largest transverse dimension of the light detecting surface.

8. A magnetometer according to claim 7, wherein the light source comprises a light emitting diode.

9. A magnetometer according to claim 7, wherein the controller is configured to calculate the magnitude of the magnetic field by obtaining a variance property of the spectrum, and calculating the magnitude of the magnetic field from the variance property.

10. A magnetometer according to claim 7, wherein the light emitting surface and the light detecting surface are substantially planar and substantially parallel to each other, and are situated on opposite sides of the crystal.

11. A magnetometer according to claim 10, also comprising a filter situated between the crystal and the light detecting surface that substantially filters out the illuminating light from the light emitting surface and substantially passes the fluorescent emission light to the light detecting surface.

12. A magnetometer according to claim 10, also comprising a filter situated between the light emitting surface and the crystal that substantially filters out any light emitted from the light emitting surface in a range of wavelengths corresponding to predominant wavelengths of the fluorescent emission light, and substantially passes light emitted from the light emitting surface at wavelengths that excite the fluorescent emission.

13. A magnetometer according to claim 7, wherein the crystal comprises diamond, and the paramagnetic defects comprise NV centers.

14. A magnetometer according to claim 13, wherein the light detector has a noise level, and wherein the light source consumes less than 250 milliwatts of power, the spectrum acquisition time that the controller is configured to use is less than 200 milliseconds, and for a magnetic field of 0.5 gauss, for any orientation of the magnetic field relative to the crystal's four tetrahedral axes, for all of the components or magnitude of the magnetic field that the controller is configured to calculate, using the selected microwave frequencies that the controller is configured to use, there is an expected random error in the calculated value of the magnitude or component of the magnetic field of less than 50 nanotesla, due to random errors in the spectrum at each selected frequency due to the noise level of the light detector.

15. A magnetometer according to claim 7, wherein the total detected power of the fluorescent emission light is at least 3 percent of a power of light emitted by the light source.

16. A method of determining a magnitude of an ambient magnetic field, using an ensemble of paramagnetic defects in a crystal having a diamond cubic structure with four tetrahedral axes, some of the defects oriented along each of the crystal's four tetrahedral axes, the defects having a zero-field splitting resonant frequency Do, the method comprising:
a) exposing the paramagnetic defect ensemble to microwave radiation at a selected frequency;

b) illuminating the paramagnetic defects with light, from a light source, of a wavelength to cause fluorescent emission;

c) measuring a total detected fluorescent emission power from the paramagnetic defect ensemble with a light detector;

d) repeating (a), (b) and (c), using different selected frequencies of the microwave radiation to obtain a microwave absorption spectrum of the paramagnetic defect ensemble over frequencies that include Zeeman splitting of the zero-field splitting resonant frequency Do, due to the ambient magnetic field, for paramagnetic defects oriented along all four tetrahedral axes;

e) calculating a variance property of the microwave absorption spectrum; and f) calculating a magnitude of the ambient magnetic field from the variance property.

17. A method according to claim 16, wherein the crystal comprises a diamond crystal, and the paramagnetic defects comprise nitrogen vacancy (NV) centers.

18. A method according to claim 17, wherein the light detector has an output voltage that includes a noise level, wherein illuminating with light from a light source comprises illuminating with light from a light source that consumes less than 250 milliwatts of power, and wherein measuring the total fluorescent emission power at each selected frequency comprises measuring an emission power, for a measurement time, so that a total of all the measurement times is less than 200 milliseconds, and there is an expected random error in the calculated value of the magnitude of the magnetic field of less than 50 nanotesla (nT), that corresponds to random errors in the spectrum at each selected frequency due to the noise level of the output voltage of the light detector, when the variance property is calculated from the spectrum, and the variance property is used to calculate the magnitude of the magnetic field.

19. A method according to claim 16, wherein the ambient magnetic field is dominated by the earth's magnetic field, with only smaller contributions, or no contributions, from man-made structures or magnetic field sources.

20. A method of determining a magnitude of an ambient magnetic field, using the method of claim 16, during a time interval, wherein the crystal is located in a device that generates a self magnetic field in the crystal due to one or more independently changeable device currents, one or more permanent magnets, or both, the method comprising:

a) determining a direction and a ratio of magnitude of self magnetic field to device current, in the crystal, for each of the device currents, if any, and direction and magnitude of the self magnetic field in the crystal due to the permanent magnets, if any;

b) measuring each of the device currents, if any, as a function of time during the time interval;

c) during the time interval, passing field-cancelling currents through each of a set of field-cancelling coils surrounding the crystal, the coils configured and the currents selected to substantially cancel the self magnetic field in the crystal, using the measured device currents if any, the ratios of self magnetic field and device current, if any, and the self magnetic field due to the permanent magnets, if any; and d) using the method of claim 16 to measure the magnitude of the ambient magnetic field during the time interval, while the self magnetic field in the crystal is substantially cancelled by the field-cancelling currents in the field-cancelling coils.

* * * * *